United States Patent
Jang et al.

(10) Patent No.: US 9,293,222 B2
(45) Date of Patent: Mar. 22, 2016

(54) SHIFT REGISTER

(71) Applicant: LG Display Co., Ltd., Seoul (KR)

(72) Inventors: Yong-Ho Jang, Goyang-si (KR); Cheol-Se Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 92 days.

(21) Appl. No.: 14/308,577

(22) Filed: Jun. 18, 2014

(65) Prior Publication Data

US 2014/0376682 A1   Dec. 25, 2014

(30) Foreign Application Priority Data

Jun. 21, 2013   (KR) .................. 10-2013-0071354

(51) Int. Cl.
*G11C 19/00* (2006.01)
*G11C 19/28* (2006.01)

(52) U.S. Cl.
CPC ........ *G11C 19/28* (2013.01); *G09G 2310/0286* (2013.01)

(58) Field of Classification Search
None
See application file for complete search history.

(56) References Cited

U.S. PATENT DOCUMENTS

| 8,842,803 | B2 * | 9/2014 | Jang | ............ | G11C 19/00 377/64 |
|---|---|---|---|---|---|
| 2012/0269316 | A1 * | 10/2012 | Jang | ............ | G09G 3/3677 377/75 |
| 2014/0093027 | A1 * | 4/2014 | Jang | ............ | G11C 5/005 377/64 |
| 2014/0241488 | A1 * | 8/2014 | Jang | ............ | G11C 19/28 377/64 |

\* cited by examiner

*Primary Examiner* — Tuan T Lam
(74) *Attorney, Agent, or Firm* — Fenwick & West LLP

(57) ABSTRACT

Disclosed is a shift register capable of stably generating an output even when the threadhold voltage of a pull-down switching element is raised due to degradation of the pull-down switching element. The shift register includes a plurality of stages each comprising a node controller comprising an inverter to control a voltage at a reset node in accordance with a voltage at a set node, and an output unit to output a scan pulse based on at least one of the voltage at the set node and the voltage at the reset node. The shift register further includes an inverter voltage controller for controlling a high-level inverter voltage supplied to each inverter of the stages based on the voltage at at least one reset node in at least one of the stages.

19 Claims, 37 Drawing Sheets

SHIFT REGISTER

CROSS-REFERENCE TO RELATED APPLICATIONS

This application claims the benefit of the Korean Patent Application No. 10-2013-0071354, filed on Jun. 21, 2013, which is hereby incorporated by reference as if fully set forth herein.

BACKGROUND OF THE INVENTION

1. Field of the Invention

The present disclosure relates to a shift register, and, more particularly, to a shift register capable of stably generating an output even when the threshold voltage of a pull-down switching element is raised due to degradation of the pull-down switching element.

2. Discussion of the Related Art

In general, a liquid crystal display (LCD) device is adapted to display an image by adjusting light transmittance of a liquid crystal using an electric field. To this end, the LCD device includes a liquid crystal panel having pixel areas arranged in matrix form, and a driving circuit for driving the liquid crystal panel.

In the liquid crystal panel, a plurality of gate lines and a plurality of data lines are arranged to cross each other, and the pixel areas are defined respectively at intersections of the gate lines and the data lines. Also formed in the liquid crystal panel are pixel electrodes and a common electrode for applying the electric field to the respective pixel areas.

Each of the pixel electrodes is coupled to an associated one of the data lines via the source terminal and drain terminal of a thin film transistor (TFT), which is a switching device. The TFT is turned on in response to a scan pulse applied to the gate terminal thereof via an associated one of the gate lines, so as to charge a data signal on the associated data line into a pixel voltage.

Meanwhile, the driving circuit includes a gate driver for driving the gate lines, a data driver for driving the data lines, a timing controller for supplying control signals for control of the gate driver and data driver, and a power supply for supplying various drive voltages to be used in the LCD device.

The gate driver sequentially supplies scan pulses to the gate lines to sequentially drive liquid crystal cells in the liquid crystal panel on a line-by-line basis. In order to sequentially output the above-mentioned scan pulses, the gate driver includes a shift register.

The shift register includes a plurality of stages each having a plurality of switching elements.

A pull-down switching element, which is arranged at an output unit of each stage, functions to stabilize the associated gate line by a low voltage. To this end, the pull-down switching element supplies a discharge voltage to the gate line after generation of an output at the associated stage. The pull-down switching element should be maintained in an ON state for a large portion of one frame period. For this reason, degradation of the pull-down switching element may be accelerated.

Degradation of the pull-down switching element causes rising of the threshold voltage of the pull-down switching element. In this case, the pull-down switching element may not be turned on, even when a normal voltage is applied thereto.

SUMMARY OF THE INVENTION

Accordingly, the present invention is directed to a shift register that substantially obviates one or more problems due to limitations and disadvantages of the related art.

An object of the present invention is to provide a shift register capable of reducing malfunction of a circuit caused by degradation of a pull-down switching element by checking a voltage at a reset node to which a gate electrode of the pull-down switching element is coupled, to check a degree of degradation of the pull-down switching element, and appropriately adjusting a level of the inverter voltage supplied to an inverter in accordance with the checked degradation degree.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages each including a node controller and an output unit. The node controller includes an inverter to control a voltage at a reset node in accordance with a voltage at a set node, and the output unit outputs a scan pulse based on at least one of the voltage at the set node and the voltage at the reset node, and an inverter voltage controller for controlling a high-level inverter voltage supplied to each inverter of the stages, based on the voltage at at least one reset node in at least one of the stages.

The inverter voltage controller may include a voltage monitor for adjusting a level of a monitoring voltage in accordance with a level of a voltage applied to the reset node, and outputting the adjusted monitoring voltage to a monitoring input line. The inverter voltage controller may further include a voltage adjuster including a comparator that adjusts a level of the high-level inverter voltage based on the monitoring voltage applied to the monitoring input line and a predetermined reference voltage, and that supplies the adjusted high-level inverter voltage to the inverter.

The voltage monitor may include at least one monitoring switching element controlled in accordance with the voltage at the reset node. The monitoring switching element is coupled between the monitoring input line and a first base voltage line to transmit a first base voltage to the monitoring input line. The voltage monitor may further include a resistor coupled between the monitoring input line and a second base voltage line to transmit a second base voltage to the monitoring input line, wherein the resistor is one of a variable resistor and a switching element.

The at least one monitoring switching element may include two or more monitoring switching elements. Gate electrodes of the two or more monitoring switching elements may be coupled to one of the reset node of the corresponding stage and reset nodes in two or more of the stages. The two or more monitoring switching elements may be coupled in parallel between the monitoring input line and the first base voltage line.

The voltage adjuster may further include one of a first capacitor coupled between an output terminal of the comparator and the monitoring input line, and a level converter being one of a level shifter, a DC-DC converter and an amplifier which shifts the level of the high-level inverter voltage output from the comparator, wherein the inverter voltage controller further comprises a second capacitor coupled between the monitoring input line and a low voltage transmission line to transmit a low voltage.

The node controller may further include a first switching element and a second switching element, or the first and second switching elements and a third switching element. The first switching element is controlled in accordance with a start pulse or a scan pulse from a prior stage of the stages, and is coupled to a charge voltage line to transmit a charge voltage while being coupled to the set node. The second switching element is controlled in accordance with a scan pulse from a next stage of the stages, and is coupled between the set node and a first discharge voltage line to transmit a first discharge voltage to the set node. The third switching element is controlled in accordance with the voltage at the reset node of the selected stage, and is coupled between the set node of the selected stage and the first discharge voltage line to transmit the first discharge voltage to the set node of the selected stage.

The output unit may include a pull-up switching element controlled in accordance with the voltage at the set node. The pull-up switching element is coupled between a clock transmission line and an output terminal of the selected stage to transmit a clock pulse to the output terminal of the selected stage. The output unit may further include a pull-down switching element controlled in accordance with the voltage at the reset node. The pull-down switching element is coupled between the output terminal and a first discharge voltage line to transmit a first discharge voltage to the output terminal.

The inverter may include a first inversion switching element controlled in accordance with the high-level inverter voltage applied to a high-level inverter line after being output from the inverter voltage controller, the first inversion switching element coupled between the high-level inverter line and a common node; a second inversion switching element controlled in accordance with the voltage at the set node, the second inversion switching element coupled between the common node and a low-level inverter line to transmit a low-level inverter voltage to the common node; a third inversion switching element controlled in accordance with a voltage at the common node, the third inversion switching element coupled between the high-level inverter line and the reset node; and a fourth inversion switching element controlled in accordance with the voltage at the set node, the fourth inversion switching element coupled between the reset node and the low-level inverter line.

The inverter may further include one of a first structure including a fifth inversion switching element controlled in accordance with a scan pulse from a prior stage of the stages, the fifth inversion switching element coupled between the reset node and the low-level inverter line to transmit the low-level inverter voltage to the reset node; a second structure including a sixth inversion switching element controlled in accordance with the voltage at the reset node, the sixth inversion switching element coupled between the set node and the low-level inverter line or between the set node and an output terminal of the corresponding stage; a third structure including a seventh inversion switching element controlled in accordance with the voltage at the reset node, the seventh inversion switching element coupled between the set node and a fourth clock transmission line to transmit a fourth clock pulse to the set node; a fourth structure including an eighth inversion switching element controlled in accordance with a fifth clock pulse from a fifth clock transmission line, the eighth inversion switching element coupled between an output terminal of the prior stage and the set node; a fifth structure including a ninth inversion switching element controlled in accordance with a scan pulse from the corresponding stage, the ninth inversion switching element coupled between the reset node in the selected stage and the low-level inverter line; and a sixth structure including a tenth inversion switching element, an eleventh inversion switching element, and a third capacitor. The tenth inversion switching element may be controlled in accordance with the voltage at the set node, and is coupled between the reset node and the low-level inverter line. The eleventh inversion switching element may be controlled in accordance with the voltage at the reset node, and is coupled between the set node and the output terminal of the prior stage. The third capacitor may be coupled between the fifth clock transmission line and the reset node. The fifth clock pulse may be a clock pulse used as the scan pulse from the prior stage. The fourth clock pulse is used as the scan pulse of the corresponding stage.

The reset node may be divided into a first reset node and a second reset node. The inverter may be divided into a first inverter and a second inverter. The high-level inverter voltage may be divided into a first AC inverter voltage and a second AC inverter voltage having a phase inverted from a phase of the first AC inverter voltage. The monitoring voltage may be divided into a first monitoring voltage and a second monitoring voltage. The inverter voltage controller may include a first voltage monitor for adjusting a level of the first monitoring voltage in accordance with a level of a voltage applied to the first reset node, and outputting the adjusted first monitoring voltage to a first monitoring input line; a first voltage adjuster for adjusting a level of the first AC inverter voltage based on the first monitoring voltage applied to the first monitoring input line and a predetermined first reference voltage, and supplying the adjusted first AC inverter voltage to the first inverter; a second voltage monitor for adjusting a level of the second monitoring voltage in accordance with a level of a voltage applied to the second reset node, and outputting the adjusted second monitoring voltage to a second monitoring input line; and a second voltage adjuster for adjusting a level of the second AC inverter voltage based on the second monitoring voltage applied to the second monitoring input line and a predetermined second reference voltage, and supplying the adjusted second AC inverter voltage to the second inverter.

The first voltage monitor may include a first monitoring switching element controlled in accordance with the voltage at the first reset node and coupled between the first monitoring input line and a first base voltage line to transmit a first base voltage to the first monitoring input line. The first voltage monitor may further include a first resistor coupled between the first monitoring input line and a second base voltage line to transmit a second base voltage to the first monitoring input line. The second voltage monitor may include a second monitoring switching element controlled in accordance with the voltage at the second reset node and coupled between the second monitoring input line and a third base voltage line to transmit a third base voltage to the second monitoring input line. The second voltage monitor may further include a second resistor coupled between the second monitoring input line and a fourth base voltage line to transmit a fourth base voltage.

The reset node may be divided into a first reset node and a second reset node. The inverter may be divided into a first inverter and a second inverter. The high-level inverter voltage may be divided into a first AC inverter voltage and a second AC inverter voltage having a phase inverted from a phase of the first AC inverter voltage. The monitoring voltage may be divided into a first monitoring voltage and a second monitoring voltage. The inverter voltage controller may include a first voltage monitor for adjusting a level of the first monitoring voltage in accordance with a level of a voltage applied to the first reset node, and outputting the adjusted first monitoring voltage to a monitoring input line; a second voltage monitor for adjusting a level of the second monitoring voltage in accordance with a level of a voltage applied to the second reset node, and outputting the adjusted second monitoring voltage to the monitoring input line; and a voltage adjuster for adjusting a level of the first AC inverter voltage based on a predetermined first reference voltage and the first monitoring voltage applied to the monitoring input line, supplying the adjusted first AC inverter voltage to the first inverter, adjusting a level of the second AC inverter voltage based on a predetermined second reference voltage and the second monitoring voltage applied to the monitoring input line, and supplying the adjusted second AC inverter voltage to the second inverter.

The first voltage monitor may include a first monitoring switching element controlled in accordance with the voltage at the first reset node and coupled between the monitoring input line and a first base voltage line to transmit a first base voltage to the monitoring input line. The first voltage monitor may further include a first resistor coupled between the monitoring input line and a second base voltage line to transmit a second base voltage to the monitoring input line. The second voltage monitor may include a second monitoring switching element controlled in accordance with the voltage at the second reset node and coupled between the monitoring input line and a third base voltage line to transmit a third base voltage to the monitoring input line.

The shift register may further include at least one dummy stage including a dummy node controller having a dummy inverter to control a voltage at a dummy reset node in accordance with a voltage at a dummy set node. The inverter voltage controller controls a high-level inverter voltage supplied to each inverter of the stages and to the dummy inverter in the at least one dummy stage. The inverter voltage controller controls the high-level inverter voltage based on the voltage at at least one dummy reset node in the at least one dummy stage. The voltage monitor adjusts the monitoring voltage in accordance with a voltage of the dummy reset node in the at least one dummy stage The reset node may be divided into a first reset node and a second reset node. The dummy reset node may be divided into a first dummy reset node and a second dummy reset node. The inverter may be divided into a first inverter and a second inverter. The dummy inverter may be divided into a first dummy inverter and a second dummy inverter. The high-level inverter voltage may be divided into a first AC inverter voltage and a second AC inverter voltage having a phase inverted from a phase of the first AC inverter voltage. The monitoring voltage may be divided into a first monitoring voltage and a second monitoring voltage. The inverter voltage controller may include a first voltage monitor for adjusting a level of the first monitoring voltage in accordance with a level of a voltage applied to the first dummy reset node and outputting the adjusted first monitoring voltage to a first monitoring input line; a first voltage adjuster for adjusting a level of the first AC inverter voltage based on a predetermined first reference voltage and the first monitoring voltage applied to the first monitoring input line, and supplying the adjusted first AC inverter voltage to the first inverter and the first dummy inverter; a second voltage monitor for adjusting a level of the second monitoring voltage in accordance with a level of a voltage applied to the second dummy reset node and outputting the adjusted second monitoring voltage to a second monitoring input line; and a second voltage adjuster for adjusting a level of the second AC inverter voltage based on a predetermined second reference voltage and the second monitoring voltage applied to the second monitoring input line, and supplying the adjusted second AC inverter voltage to the second inverter and the second dummy inverter.

The first voltage monitor may include a first monitoring switching element controlled in accordance with the voltage at the first dummy reset node, the first monitoring switching element coupled between the first monitoring input line and a first base voltage line to transmit a first base voltage to the first monitoring input line. The first voltage monitor may further include a first resistor coupled between the first monitoring input line and a second base voltage line to transmit a second base voltage to the first monitoring input line. The second voltage monitor may include a second monitoring switching element controlled in accordance with the voltage at the second dummy reset node, the second monitoring switching element coupled between the second monitoring input line and a third base voltage line to transmit a third base voltage to the second monitoring input line. The second voltage monitor may further include a second resistor coupled between the second monitoring input line and a fourth base voltage line to transmit a fourth base voltage to the second monitoring input line.

The reset node may be divided into a first reset node and a second reset node. The dummy reset node may be divided into a first dummy reset node and a second dummy reset node. The inverter may be divided into a first inverter and a second inverter. The dummy inverter may be divided into a first dummy inverter and a second dummy inverter. The high-level inverter voltage may be divided into a first AC inverter voltage and a second AC inverter voltage having a phase inverted from a phase of the first AC inverter voltage. The monitoring voltage may be divided into a first monitoring voltage and a second monitoring voltage. The inverter voltage controller may include a first voltage monitor for adjusting a level of the first monitoring voltage in accordance with a level of a voltage applied to the first dummy reset node and outputting the adjusted first monitoring voltage to a monitoring input line; a second voltage monitor for adjusting a level of the second monitoring voltage in accordance with a level of a voltage applied to the second dummy reset node and outputting the adjusted second monitoring voltage to the monitoring input line; and a voltage adjuster for adjusting a level of the first AC inverter voltage based on a predetermined first reference voltage and the first monitoring voltage applied to the monitoring input line, supplying the adjusted first AC inverter voltage to the first inverter, adjusting a level of the second AC inverter voltage based on a predetermined second reference voltage and the second monitoring voltage applied to the monitoring input line, and supplying the adjusted second AC inverter voltage to the second inverter.

The first voltage monitor may include a first monitoring switching element controlled in accordance with the voltage at the first dummy reset node, the first monitoring switching element coupled between the monitoring input line and a first base voltage line to transmit a first base voltage to the monitoring input line. The first voltage monitor may further include a first resistor coupled between the monitoring input line and a second base voltage line to transmit a second base voltage. The second voltage monitor may include a second monitoring switching element controlled in accordance with the voltage at the second dummy reset node, the second monitoring switching element coupled between the monitoring input line and a third base voltage line to transmit a third base voltage to the monitoring input line. The second voltage monitor may further include a second resistor coupled between the monitoring input line and a fourth base voltage line to transmit a fourth base voltage to the monitoring input line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to various embodiments, examples of which are illustrated in the accompanying drawings.

Figure 1:
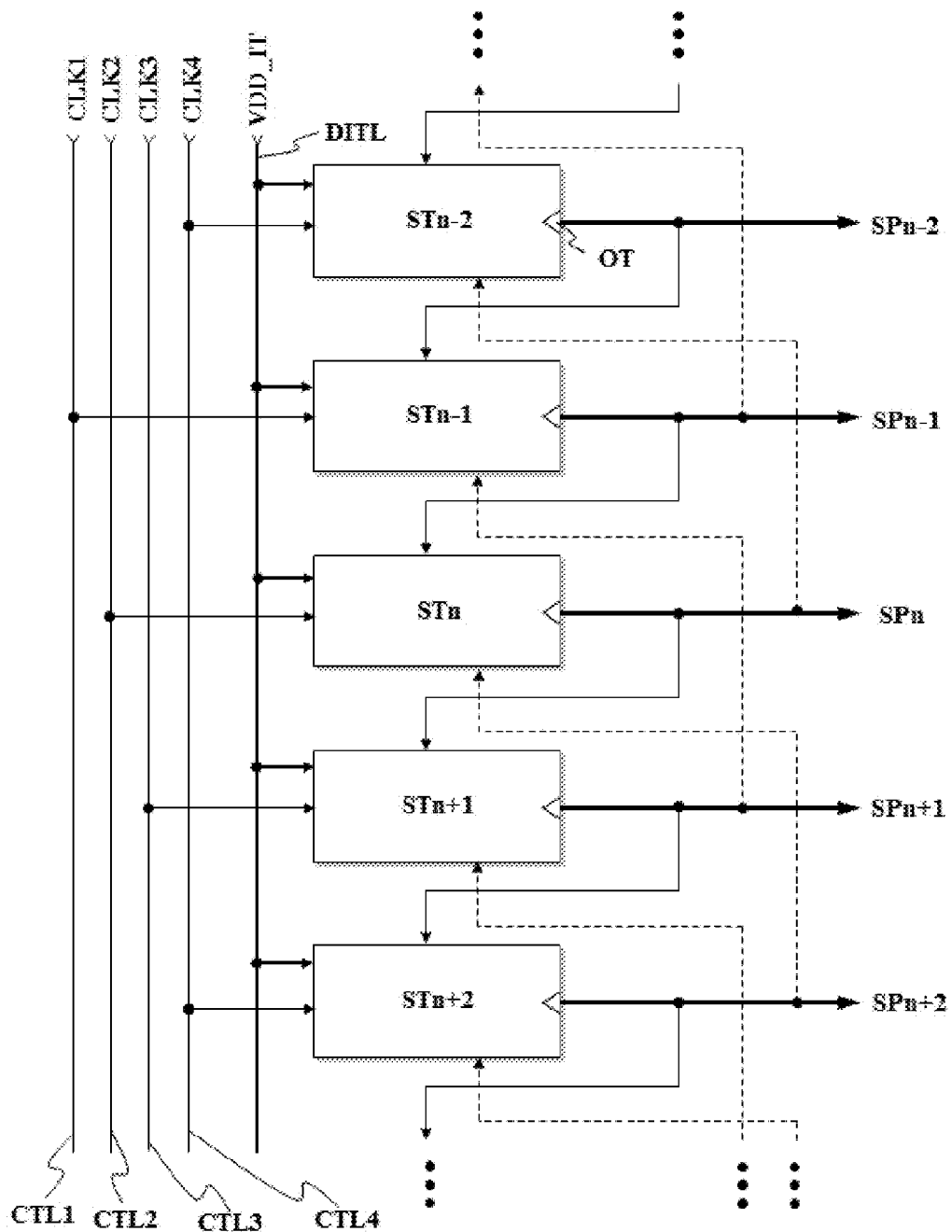
FIG. 1 is a diagram illustrating a shift register according to one embodiment.
Figure 2:
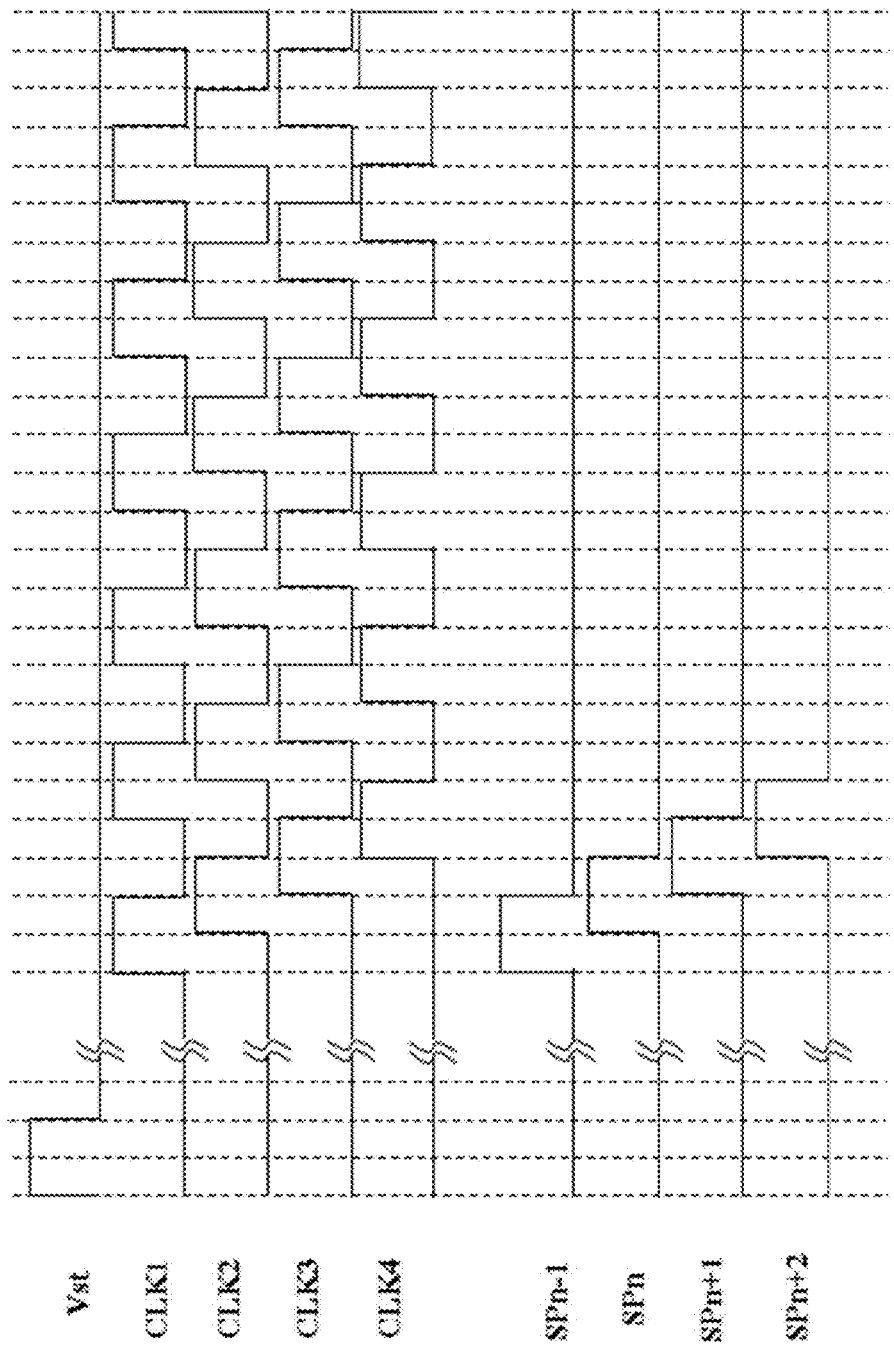
FIG. 2 is a timing diagram of various signals supplied to or output from each stage in the shift register illustrated in FIG. 1.

FIG. 1 is a diagram illustrating a shift register according to an embodiment of the present invention. FIG. 2 is a timing diagram of various signals supplied to or output from each stage in the shift register illustrated in FIG. 1.

As illustrated in FIG. 1, the shift register according to the embodiment of the present invention includes a plurality of stages STn−2 to STn+2. In each frame period, the stages STn−2 to STn+2 output scan pulses SPn−2 to SPn+2, respectively, through output terminals OT.

Each of the stages STn−2 to STn+2 drives a gate line and controls operation of a downstream stage using the respective scan pulse. Meanwhile, each stage may further control operation of an upstream stage, as shown by a dotted line in FIG. 1.

The stages STn−2 to STn+2 output respective scan pulses in a sequential manner in an order from an earlier one of stages STn−2 to STn+2. For example, the first stage ST1 outputs a first scan pulse SP1, the second stage ST2 subsequently outputs a second scan pulse SP2, the third stage ST3 subsequently outputs a third scan pulse SP3, . . . , and the a-th stage subsequently outputs an a-th scan pulse. Here, "a" is a natural number equal to or greater than 4.

Meanwhile, although not shown, the shift register further includes an a+1-th stage for outputting a scan pulse for reset of the a-th stage. The a+1-th stage is a dummy stage for reset control, which is not coupled to any gate line. That is, the scan pulse output from the reset control dummy stage is not supplied to any gate line.

The shift register having the above-described configuration may be internally built in a liquid crystal panel. That is, the liquid crystal panel includes a display portion for displaying an image and a non-display portion surrounding the display portion, and the shift register is built in the non-display portion of the liquid crystal panel.

Each stage of the shift register having the above-described configuration receives a charge voltage, a discharge voltage, a high-level inverter voltage, and a low-level inverter voltage. Each stage also receives at least one of first to fourth clock pulses CLK1 to CLK4 output in a circulating manner while having a phase difference between sequential clock pulses.

Meanwhile, the first one of the stages, namely, the first stage ST1, further receives a start pulse Vst.

All the charge voltage, discharge voltage, high-level inverter voltage, and low-level inverter voltage are DC voltages. In particular, the charge voltage and high-level inverter voltage exhibit a positive polarity, whereas the discharge voltage and low-level inverter voltage exhibit a negative polarity. Meanwhile, the discharge voltage and low-level inverter voltage may be grounded.

The first to fourth clock pulses CLK1 to CLK4 are sequentially output in a circulating manner. That is, a group of first to fourth clock pulses CLK1 to CLK4 are sequentially output, and then a next group of first to fourth clock pulses CLK1 to CLK4 are sequentially output. Thus, the first clock pulse CLK1 is output in a period between an output period of the fourth clock pulse CLK4 and an output period of the second clock pulse CLK2. In this case, the fourth clock pulse CLK4 may be output in sync with the start pulse Vst. When the fourth clock pulse CLK4 is synchronized with the start pulse Vst, the fourth clock pulse CLK4 is output earlier than the remaining ones of the first to fourth clock pulses CLK1 to CLK4.

The first to fourth clock pulses CLK1 to CLK4 are output such that the pulse widths of neighboring clock pulses overlap with each other. For example, as illustrated in FIG. 2, a first half of the pulse width of the second clock pulse CLK2 overlaps with a second half of the pulse width of the first clock pulse CLK1, and a second half of the pulse width of the second clock pulse CLK2 overlaps with a first half of the pulse width of the third clock pulse CLK3.

Since pulse widths of the neighboring clock pulses overlap with each other, scan pulses generated based on the first to fourth clock pulses CLK1 to CLK4 are also output such that the pulse widths of neighboring ones thereof overlap with each other, as illustrated in FIG. 2.

The first to fourth clock pulses CLK1 to CLK4 are used for scan pulse generation of respective stages. Each stage receives one of the first to fourth clock pulses CLK1 to CLK4, and generates a scan pulse, using the received clock pulse.

For example, the 4k+1-th stage charges a set node thereof, using the fourth clock pulse CLK4, and outputs a scan pulse, using the first clock pulse CLK1. The 4k+2-th stage charges a set node thereof, using the first clock pulse CLK1, and outputs a scan pulse, using the second clock pulse CLK2. The 4k+3-th stage charges a set node thereof, using the second clock pulse CLK2, and outputs a scan pulse, using the third clock pulse CLK3. The 4k+4-th stage charges a set node thereof, using the third clock pulse CLK3, and outputs a scan pulse, using the fourth clock pulse CLK4. Here, "k" is a natural number.

Although an example using four clock pulses having different phases is illustrated, any number of different clock pulses may be used, so long as the number of different clock pulses is two or more.

Each of the first to fourth clock pulses CLK1 to CLK4 is output several times per frame period. However, the start pulse Vst is output once per frame period. In other words, each of the first to fourth clock pulses CLK1 to CLK4 periodically exhibits an active state (high-level state) several times per frame period, whereas the start pulse Vst exhibits an active state once per frame period.

In order to enable each stage to output a scan pulse, a setting operation of the stage precedes each clock pulse. Setting of a stage means that the stage becomes an output enable state, that is, the stage can output a clock pulse supplied thereto as a scan pulse. To this end, each stage is set by a scan pulse supplied thereto from an upstream stage. That is, the n-th stage STn is set in response to a scan pulse from the n-p-th stage. Here, "n" is a natural number, and "p" is a natural number smaller than "n".

For example, the n-th stage STn is set in response to a scan pulse SPn−1 from the n−1-th stage STn−1. Of course, the first stage is set in response to a clock pulse or the start pulse Vst from the timing controller because there is no stage arranged upstream of the first stage, which is arranged at a most uppermost side.

Meanwhile, each stage is reset by a scan pulse supplied thereto from a stage arranged downstream thereof. Resetting of a stage means that the stage becomes an output disable state, that is, the stage cannot output a clock pulse supplied thereto as a scan pulse.

For example, the n-th stage STn is reset in response to a scan pulse from the n+q-th stage. Here, "q" is a natural number, and may be 2. Meanwhile, "q" and "p" may be set to be the same number.

Meanwhile, the a+1-th stage is disabled in response to a clock pulse or the start pulse Vst from the timing controller because there is no stage arranged downstream of the above-described reset control dummy stage.

Hereinafter, a configuration of each stage in the shift register configured as described above will be described in more detail.

Figure 3:
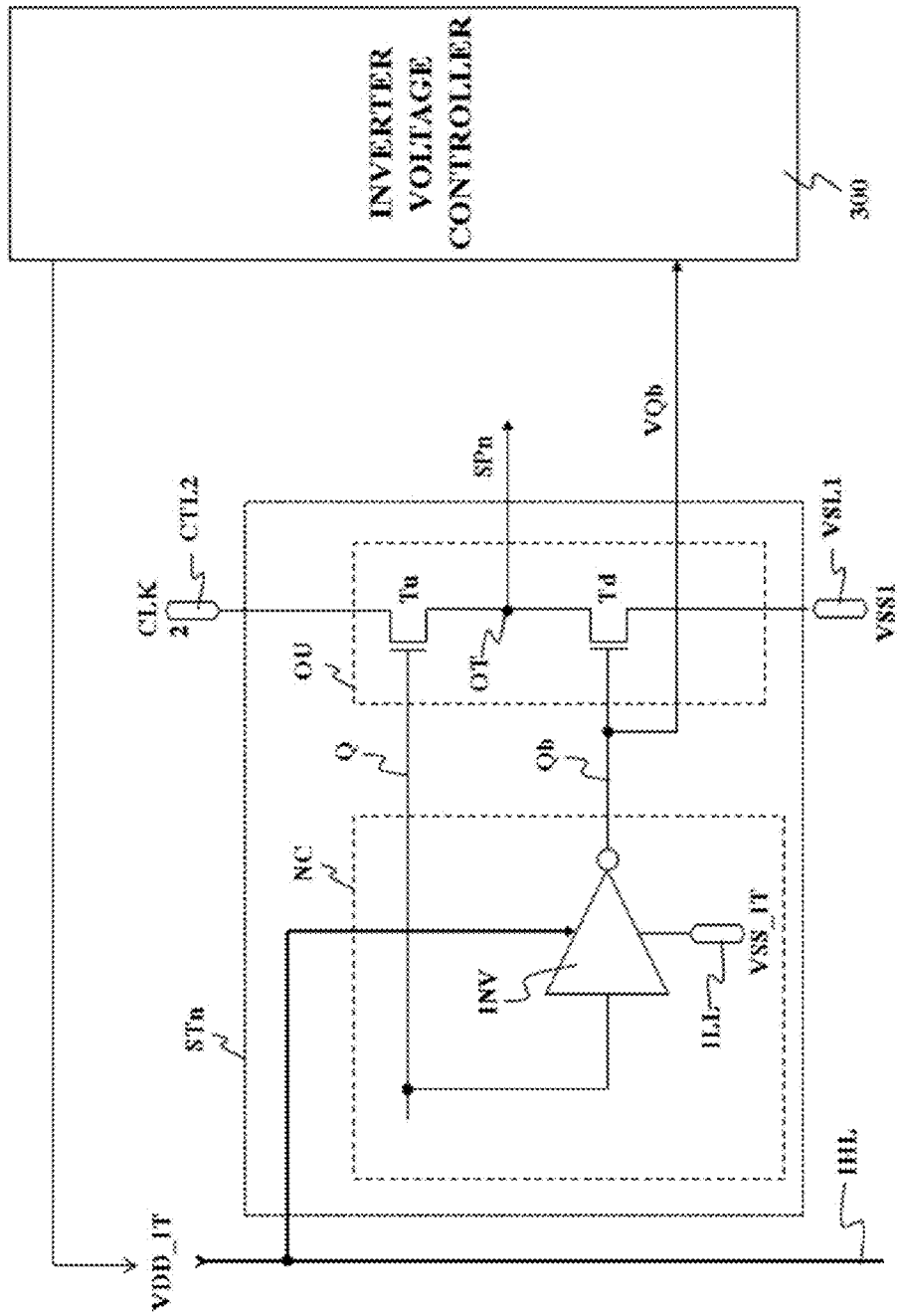
FIG. 3 is a diagram illustrating a configuration of each stage according to a first embodiment.

FIG. 3 is a diagram illustrating a configuration of each stage according to a first embodiment of the present invention. FIG. 3 illustrates a configuration of one stage illustrated in FIG. 1 and an inverter voltage controller coupled to the stage.

The illustrated stage, namely, the n-th stage STn, includes a node controller NC and an output unit OU, as illustrated in FIG. 3.

The node controller NC included in the n-th stage STn controls voltage states of set and reset nodes Q and Qb thereof, based on at least one of a scan pulse from an upstream stage and a scan pulse from a downstream stage.

The node controller NC includes an inverter INV to control a voltage at the reset node Qb in accordance with a voltage applied to the set node Q. That is, the inverter INV brings the voltage at the reset node Qb into a low level state (discharge state) when the voltage at the set node Q is in a high level state (charge state) and brings the voltage at the reset node Qb into a high level state when the voltage at the set node Q is in a low-level state.

In this case, the inverter INV brings the voltage at the reset node Qb into a high level state, using a high-level inverter voltage VDD_IT supplied thereto through a high-level inverter line IHL. The inverter INV also brings the voltage at the reset node Qb into a low level state, using a low-level inverter voltage VSS_IT supplied thereto through a low-level inverter line ILL.

The high-level inverter line IHL and low-level inverter line ILL are coupled to all stages. Accordingly, the high-level inverter voltage VDD_IT, which is supplied to each stage, is varied in accordance with adjustment of the level of the high-level inverter voltage VDD_IT supplied to the high-level inverter line IHL. Similarly, the low-level inverter voltage VSS_IT, which is supplied to each stage, is varied in accordance with adjustment of the level of the low-level inverter voltage VSS_IT supplied to the low-level inverter line ILL.

The output unit OU included in the n-th stage STn outputs a scan pulse SPn, based on at least one of the voltage at the set node Q and the voltage at the reset node Qb. In detail, the output unit OU outputs a high-level clock pulse (for example, CLK2) supplied thereto, as a scan pulse (for example, SPn), when the set node Q is in a charge state, and the reset node Qb is a discharge state. On the other hand, when the set node Q is in a discharge state, and the reset node Qb is a charge state, the output unit OU outputs a first discharge voltage VSS1. The scan pulse SPn and first discharge voltage VSS1 are output through an output terminal OT of the associated stage (for example, STn).

To this end, the output unit OU may include a pull-up switching element Tu and a pull-down switching element Td.

The pull-up switching element Tu included in the output unit OU of the n-th stage STn is controlled in accordance with the voltage at the set node Q of the n-th stage STn. The pull-up switching element Tu is coupled between a second clock transmission line CTL2 and the output terminal OT of the n-th stage STn to transmit the second clock pulse CLK2 to the output terminal OT. The pull-up switching element Tu is turned on or off in accordance with the voltage of the set node Q. In an ON state, the pull-up switching element Tu transmits the second clock pulse CLK2 to the output terminal OT.

The pull-down switching element Td is controlled in accordance with the voltage at the reset node Qb. The pull-down switching element Td is coupled between the output terminal OT and a first discharge voltage line VSL1 to transmit the first discharge voltage VSS1 to the output terminal OT. That is, the pull-down switching element Td is turned on or off in accordance with the voltage of the reset node Qb. In an ON state, the pull-down switching element Td transmits the first discharge voltage VSS1 to the output terminal OT.

All stages may have the same configuration as the configuration of the n-th stage STn as illustrated in FIG. 3.

Meanwhile, an inverter voltage controller 300 is coupled to at least one of the all stages, to check a degree of degradation of the pull-down switching element Td of the coupled stage (switching elements coupled to the reset node Qb of the coupled stage at gate electrodes thereof, if such switching elements are present). Based on the checked results, the inverter voltage controller 300 adjusts the level of the high-level inverter voltage VDD_IT. For example, degradation of the pull-down switching element Td is increased as the driving time of the shift register increases. In this regard, the inverter voltage controller 300 further increases the level of the high-level inverter voltage VDD_IT as degradation of the pull-down switching element Td increases.

The inverter voltage controller 300 checks a degree of degradation of the pull-down switching element Td, based on a voltage at at least one reset node Qb. Although FIG. 3 illustrates an example in which the inverter voltage controller 300 is coupled to the rest node Qb of one stage, namely, the n-th stage STn, the present invention is not limited to such a connection configuration. That is, the inverter voltage controller 300 according to the present invention may be coupled to, for example, at least two reset nodes Qb respectively included in at least two different stages.

Meanwhile, the inverter voltage controller 300 may be installed within one of the stages.

Hereinafter, the configuration of the inverter voltage controller 300 will be described in detail.

Figure 4:
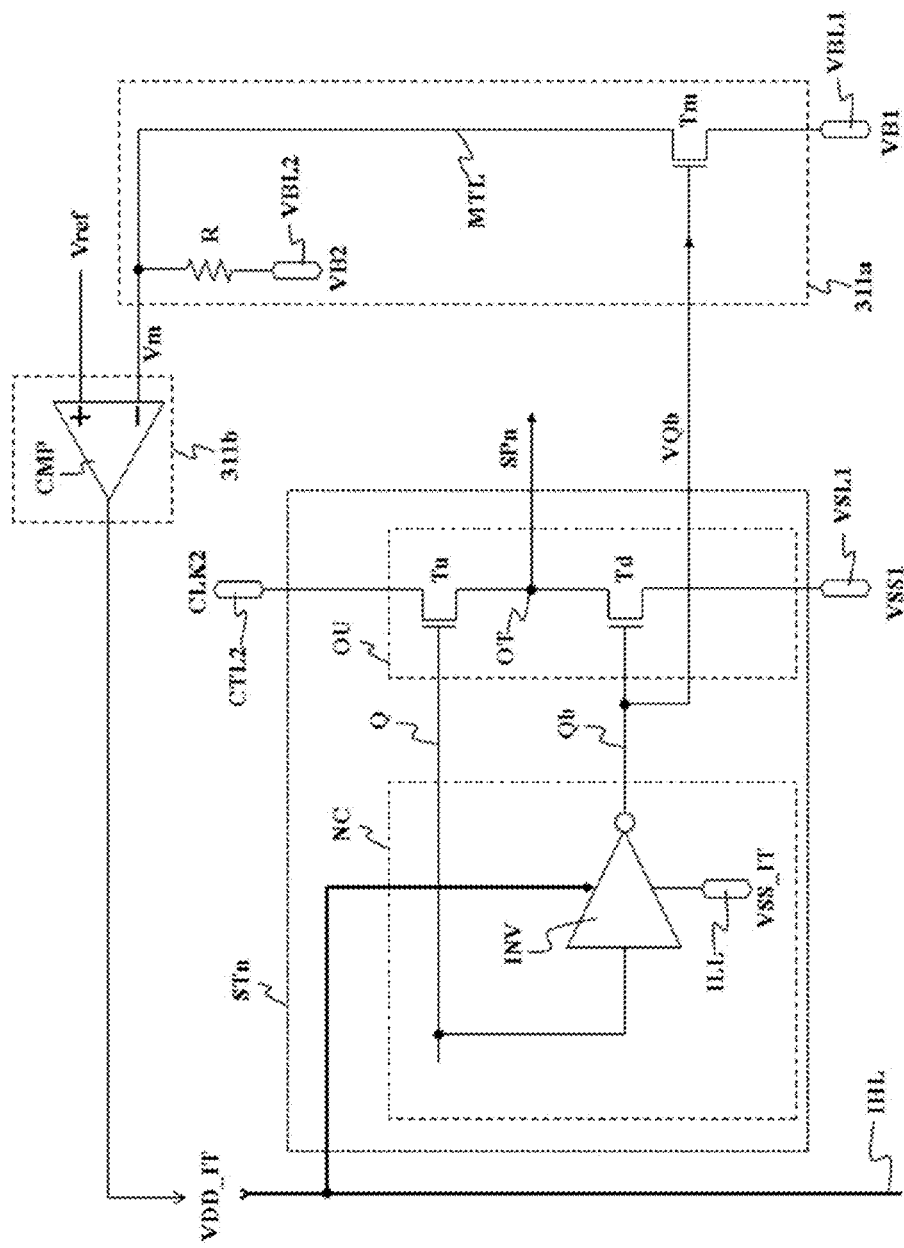
FIG. 4 is a diagram illustrating a detailed configuration of an inverter voltage controller illustrated in FIG. 3.

FIG. 4 is a diagram illustrating a detailed configuration of the inverter voltage controller 300 illustrated in FIG. 3.

As illustrated in FIG. 4, the inverter voltage controller 300 includes a voltage monitor 311a and a voltage adjuster 311b.

The voltage monitor 311a adjusts the level of a monitoring voltage Vm in accordance with the level of a voltage applied to the reset node Qb included in one of the stages (for example, STn), and outputs the adjusted monitoring voltage Vm to a monitoring input line MTL.

To this end, the voltage monitor 311a includes a monitoring switching element Tm and a resistor R, as illustrated in FIG. 4.

The monitoring switching element Tm is controlled in accordance with a voltage at the reset node Qb included in one of the stages (for example, STn). The monitoring switching element Tm is coupled between the monitoring input line MTL, to which the monitoring voltage Vm is input, and a first base voltage line VBL1 to transmit a first base voltage VB1. The monitoring switching element Tm is used as an index for checking of a degradation degree of switching elements coupled to the reset node Qb through gate electrodes thereof (for example, pull-down switching elements). That is, the degradation degree of the monitoring switching element Tm means the degradation degree of switching elements coupled to the reset node Qb through gate electrodes thereof (for example, pull-down switching elements).

The resistor R is coupled between the monitoring input line MTL and a second base voltage line VBL2 to transmit a second base voltage VB2.

The voltage adjuster 311b adjusts the level of the high-level inverter voltage VDD_IT, based on a predetermined reference voltage Vref and the monitoring voltage Vm applied to the monitoring input line MTL. The voltage adjuster 311b supplies the adjusted high-level inverter voltage VDD_IT to the inverter INV.

As illustrated in FIG. 4, the voltage adjuster 311b includes a comparator CMP for comparing the monitoring voltage Vm from the monitoring input line MTL with the reference voltage Vref, adjusting the level of the high-level inverter voltage VDD_IT, based on the compared results, and then supplying the adjusted high-level inverter voltage VDD_IT to the inverter INV. In this case, the high-level inverter voltage VDD_IT output from the comparator CMP is supplied to the inverter INV via the high-level inverter line IHL.

Meanwhile, in the case of FIG. 3, the reference voltage Vref is input to a non-inverting terminal (+) of the comparator CMP, and the monitoring voltage Vm is input to an inverting terminal (−) of the comparator CMP. Conversely, it may be possible to implement a configuration in which the reference voltage Vref is input to the inverting terminal (−) of the comparator CMP, and the monitoring voltage Vm is input to the non-inverting terminal (+) of the comparator CMP.

The reference voltage Vref is a DC voltage having a fixed level, whereas the monitoring voltage Vm is varied in accordance with the level of the voltage at the reset node Qb. Accordingly, the comparator CMP adjusts the level of an output thereof, that is, the level of the high-level inverter voltage VDD_IT, to equalize the monitoring voltage Vm input thereto with the reference voltage Vref. Thus, the level of the high-level inverter voltage VDD_IT is varied in accordance with the level of the monitoring voltage Vm.

The above-described high-level inverter voltage VDD_IT may be defined by the following Expression 1.

$$VDD\_IT = f(VQb, Vref, VB2, VB1) \quad \text{[Expression 1]}$$

That is, in accordance with the above Expression 1, the high-level inverter voltage VDD_IT is defined as a function having a value determined in accordance with the voltage VQb at the reset node Qb, the reference voltage Vref, the second base voltage VB2, and the first base voltage VB1.

In this case, an operational amplifier exhibiting high gain may be used as the comparator CMP. When such an operational amplifier is used as the comparator CMP, the high-level inverter voltage VDD_IT and the voltage VQb at the reset node Qb are set to almost equalize the monitoring voltage Vm with the second base voltage VB2 and the reference voltage Vref.

The voltage adjuster 311b configured as described above adjusts the level of the high-level inverter voltage VDD_IT, to cause the resistance of the monitoring switching element Tm to be constant. In this case, current flowing through the monitoring switching element Tm is determined by the second base voltage VB2, the reference voltage Vref, the first base voltage VB1, and the voltage VQb at the reset node Qb. The voltage adjuster 311b adjusts the level of the high-level inverter voltage VDD_IT applied to the reset node Qb, to cause the current to be substantially constant.

Accordingly, the inverter voltage controller 300 of the present invention may apply an optimal voltage to the reset node Qb. Thus, it may be possible to prevent malfunction of the circuit caused by degradation of switching elements coupled to the reset node Qb through gate electrodes thereof (for example, pull-down switching elements).

Meanwhile, it may be possible to set the first discharge voltage VSS1 and first base voltage VB1 in FIG. 4 to have the same level, in order to make driving conditions of the monitoring switching element Tm and pull-down switching element Td similar.

Figure 5A:
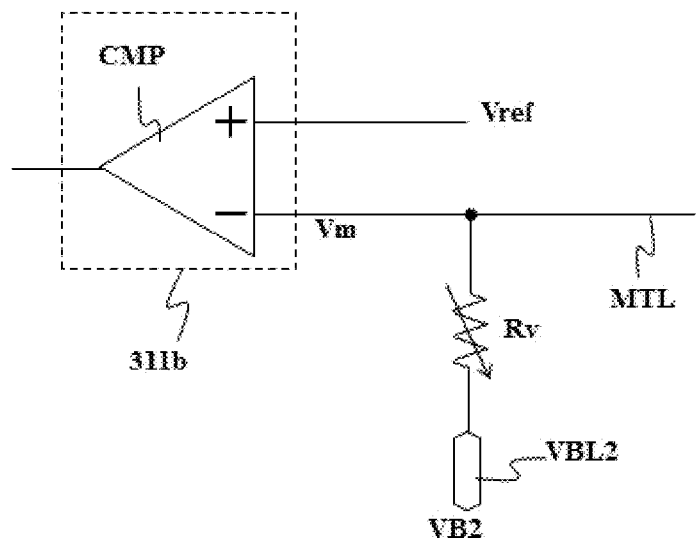
FIGS. 5A and 5B are diagrams illustrating alternative configurations of a resistor included in a voltage monitor of FIG. 4.
Figure 5B:
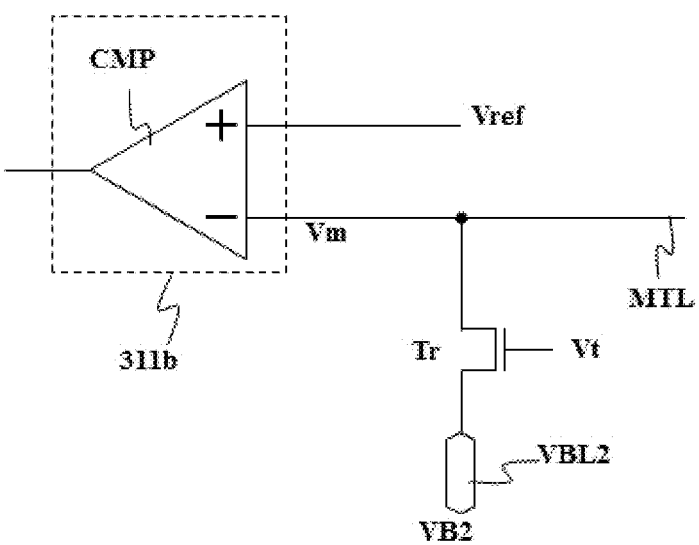

FIGS. 5A and 5B are diagrams illustrating alternative configurations of the resistor included in the voltage monitor 311a of FIG. 4.

As illustrated in FIG. 5A, the resistor R included in the voltage monitor 311a may be substituted with a variable resistor Rv.

Alternatively, as illustrated in FIG. 5B, the resistor R included in the voltage monitor 311a may be substituted with a switching element Tr. In this case, it is possible to adjust the resistance (internal resistance) of the switching element Tr by adjusting the level of a voltage Vt applied to the switching element Tr.

Figure 6A:
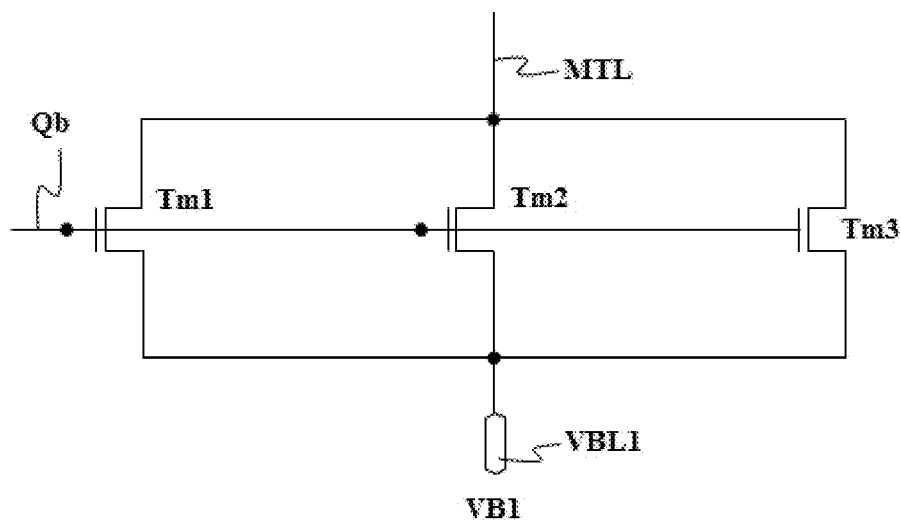
FIGS. 6A and 6B are diagrams illustrating alternative configurations of a monitoring switching element included in the voltage monitor of FIG. 4.
Figure 6B:
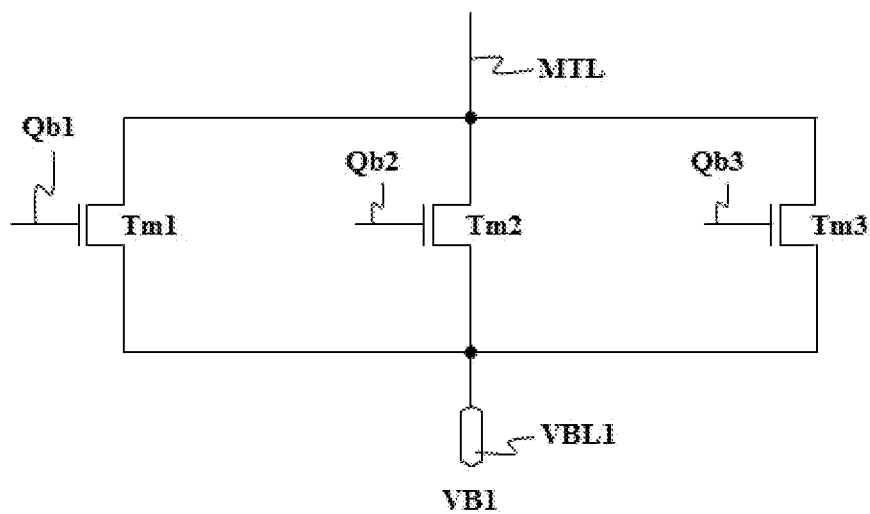

FIGS. 6A and 6B are diagrams illustrating alternative configurations of the monitoring switching element Tm included in the voltage monitor 311a of FIG. 4.

When two or more monitoring elements Tm1, Tm2, and Tm3 are provided, as illustrated in FIG. 6A, gate electrodes of the monitoring elements Tm1, Tm2, and Tm3 may be coupled in common to the reset node Qb included in one of the stages (for example, STn). In this case, the two or more monitoring elements Tm1, Tm2, and Tm3 are coupled in parallel between the monitoring input line MTL and the first base voltage line VBL1.

Alternatively, as illustrated in FIG. 6B, the two or more monitoring elements Tm1, Tm2, and Tm3 may be individually controlled in accordance with voltages at respective reset nodes Qb1, Qb2, and Qb3 in a plurality of stages. In this case, the monitoring elements Tm1, Tm2, and Tm3 are coupled in parallel between the monitoring input line MTL and the first base voltage line VBL1. For example, the gate electrode of the first monitoring switching element Tm1 is coupled to the reset node Qb1 of the n−1-th stage STn−1, the gate electrode of the second monitoring switching element Tm2 is coupled to the reset node Qb2 of the n-th stage STn, and the gate electrode of the third monitoring switching element Tm3 is coupled to the reset node Qb3 of the n+1-th stage STn+1.

Figure 7:
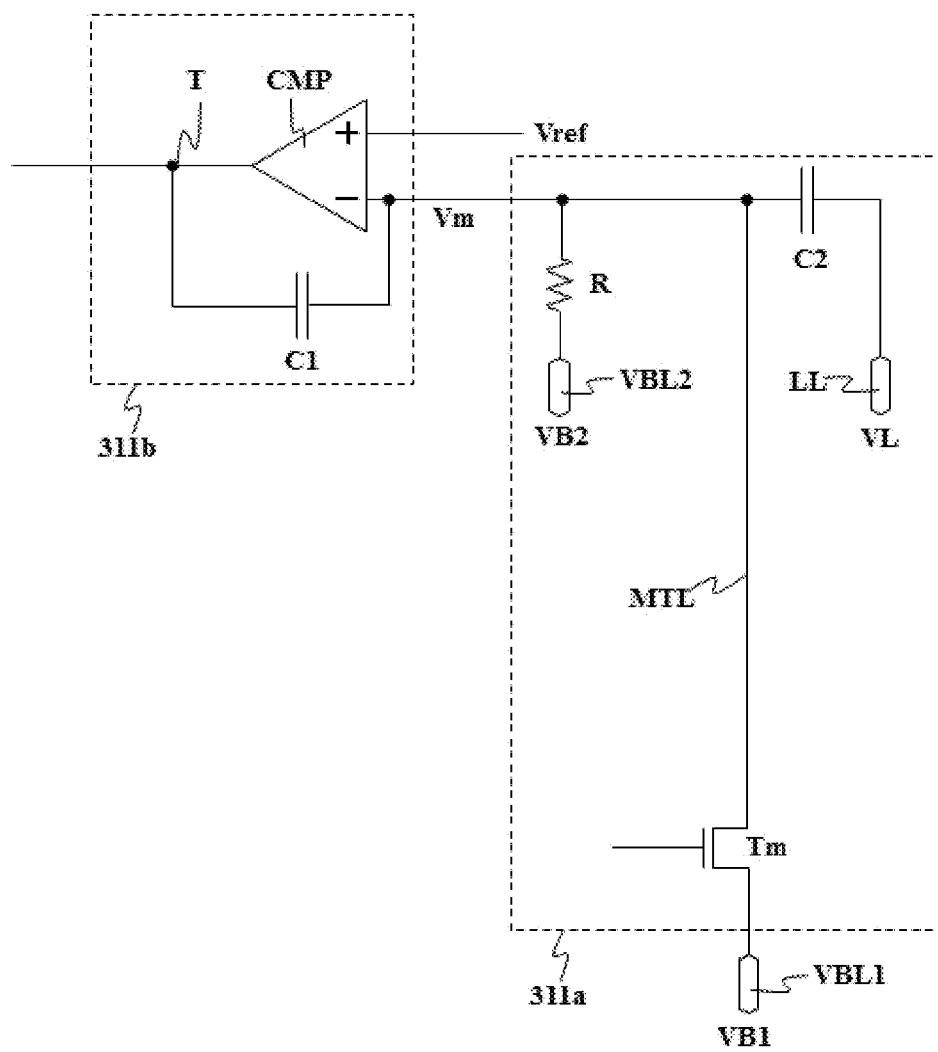
FIG. 7 is a diagram illustrating another configuration of a comparator included in the voltage adjuster of FIG. 4.

FIG. 7 is a diagram illustrating another configuration of the comparator CMP included in the voltage adjuster 311b of FIG. 4.

As illustrated in FIG. 7, one embodiment of the voltage adjuster 311b further includes a first capacitor C1 coupled between an output terminal T of the comparator CMP and the monitoring input line MTL.

Figure 8:
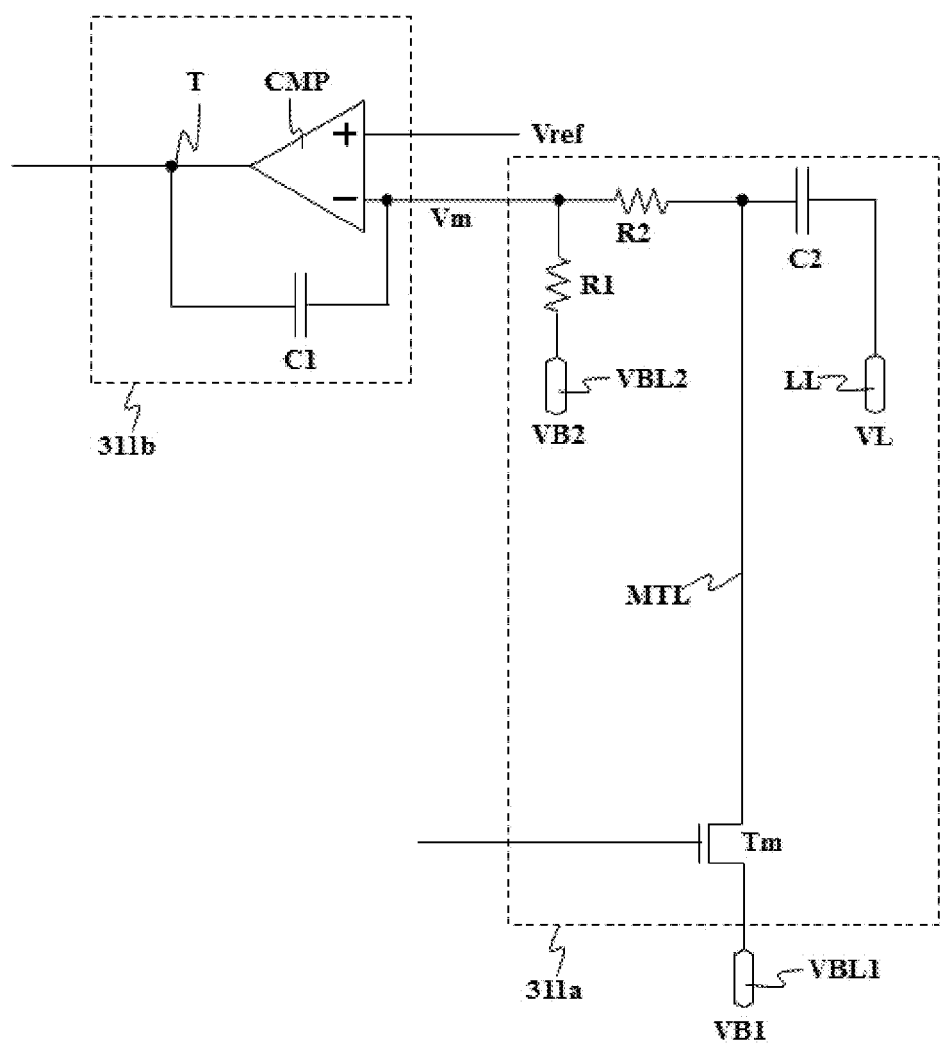
FIG. 8 is a diagram illustrating another configuration of the voltage monitor of FIG. 4.

FIG. 8 is a diagram illustrating another configuration of the voltage monitor 311a of FIG. 4.

As illustrated in FIG. 8, the voltage monitor 311a may further include a second resistor R2 and a second capacitor C2.

The second resistor R2 is coupled between one side of the first resistor R1 and the monitoring input line MTL, to be coupled in parallel to the monitoring switching element Tm.

The second capacitor C2 is coupled between the monitoring input line MTL and a low voltage line LL to transmit a low voltage VL. The second capacitor C2 functions to suppress an abrupt variation in the monitoring voltage Vm. That is, variation in the level of the monitoring voltage Vm is suppressed in accordance with the resistance of the monitoring switching element Tm and the value of the second capacitor C2. Accordingly, even when the voltage at the reset node Qb is abruptly varied to a low level state (discharge state) for a short period of time during operation of the associated stage, the high-level inverter voltage VDD_IT is not almost influenced by the variation.

Figure 9:
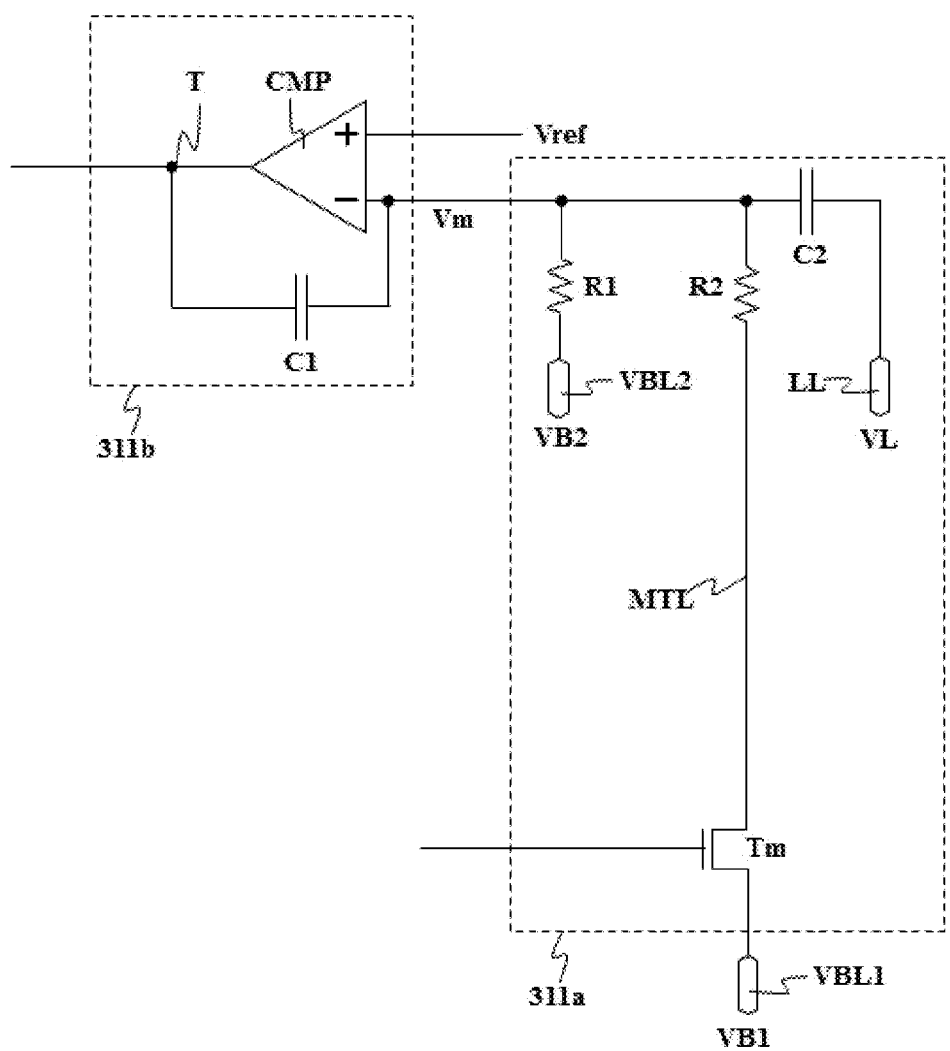
FIG. 9 is a diagram illustrating another configuration of the voltage monitor of FIG. 4.

FIG. 9 is a diagram illustrating another configuration of the voltage monitor 311a of FIG. 4.

As illustrated in FIG. 9, the voltage monitor 311a may further include a second resistor R2 and a second capacitor C2.

The second resistor R2 is coupled between one side of the first resistor R1 and the monitoring input line MTL, to be coupled in series to the monitoring switching element Tm.

The second capacitor C2 is coupled between one side of the second resistor R2 and the low voltage line LL to transmit the low voltage VL.

Figure 10:
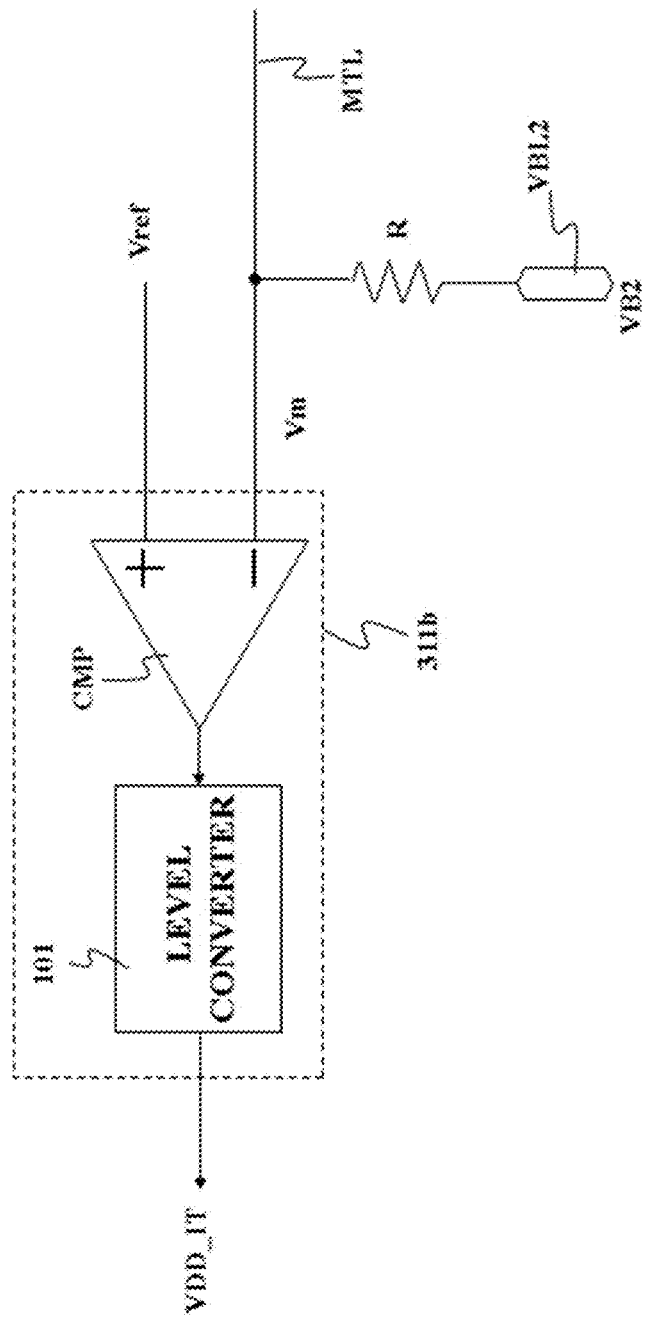
FIG. 10 is a diagram illustrating another configuration of the voltage monitor of FIG. 4.

FIG. 10 is a diagram illustrating another configuration of the voltage adjuster 311b of FIG. 4.

As illustrated in FIG. 10, the voltage adjuster 311b may further include a level converter 101. The level converter 101 shifts the level of the high-level inverter voltage VDD_IT from the comparator CMP. That is, when the range of the output voltage of the comparator CMP is narrow, the level converter 101 may be used to expand the range.

As the level converter 101, a level shifter, a DC-DC converter, an amplifier, or the like may be used.

Figure 11:
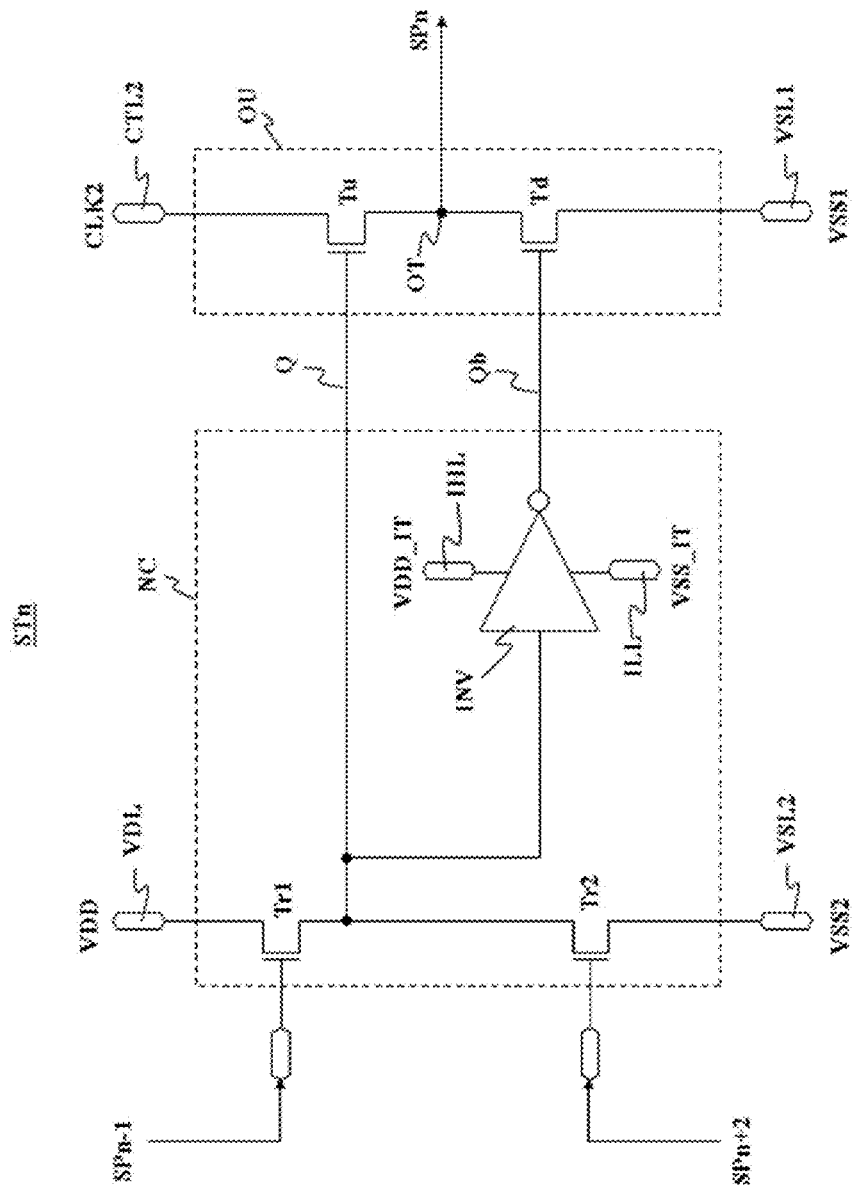
FIG. 11 is a diagram illustrating a detailed configuration of each stage.

FIG. 11 is a diagram illustrating a detailed configuration of each stage.

Although FIG. 11 illustrates a detailed configuration of the n-th stage STn, the remaining stages may have the configuration as illustrated in FIG. 11.

The node controller NC of the n-th stage STn may further include first and second switching elements Tr1 and Tr2 in addition to the inverter INV.

The first switching element Tr1 included in the n-th stage STn is controlled in accordance with a scan pulse from an upstream stage (for example, SPn−1). The first switching element Tr1 is coupled between a charge voltage line VDL and the set node Q to transmit a charge voltage VDD to the set node Q. The first switching element Tr1 is turned on or off in accordance with a scan pulse SPn−1 from the upstream stage. In an ON state, the first switching element Tr1 transmits the charge voltage VDD to the set node Q.

The first switching element Tr1 included in the first stage outputting a scan pulse earlier than the remaining stages is controlled by the start pulse Vst from the timing controller.

Meanwhile, the first switching element Tr1 included in the n-th stage STn may receive a scan pulse SPn−1 from the upstream stage, in place of the charge voltage VDD.

The first switching element Tr1 included in the first stage ST1 may receive a start pulse Vst, in place of the charge voltage VDD.

The second switching element Tr2 included in the n-th stage STn is controlled by a scan pulse from the downstream stage (for example, SPn+2). The second switching element Tr2 is coupled between the set node Q and a second discharge voltage line VSL2 to transmit a second discharge voltage VSS2 to the set node Q. The second switching element Tr2 is turned on or off in accordance with a scan pulse SPn+2 from the downstream stage. In an ON state, the second switching element Tr2 transmits the second discharge voltage VSS2 to the set node Q.

The second switching element Tr2 included in the dummy stage for reset control is controlled by the start pulse Vst from the timing controller.

Hereinafter, the configuration of the inverter INV according to the present invention will be described with reference to the accompanying drawings.

First Embodiment of Inverter INV

Figure 12:
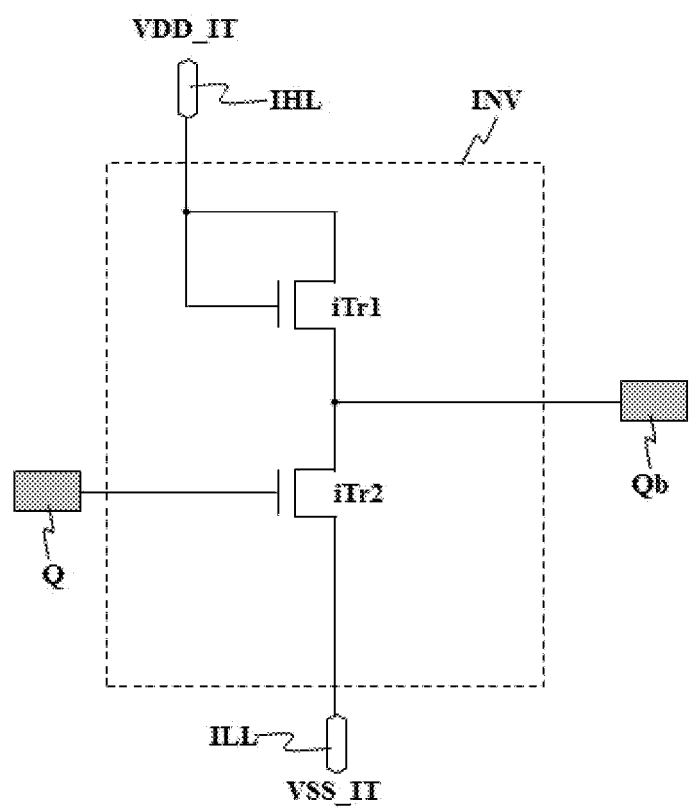
FIG. 12 is a diagram illustrating a detailed configuration of an inverter according to a first embodiment.

FIG. 12 is a diagram illustrating a detailed configuration of the inverter INV according to a first embodiment.

As illustrated in FIG. 12, the inverter INV included in the n-th stage STn includes a first inversion switching element iTr1 and a second inversion switching element iTr2.

The first inversion switching element iTr1 included in the n-th stage STn is controlled in accordance with the high-level inverter voltage VDD_IT from the high-level inverter line IHL. The first inversion switching element iTr1 is coupled between the high-level inverter line IHL and the reset node Qb. That is, the first inversion switching element iTr1 is turned on or off in accordance with the high-level inverter voltage VDD_IT. In an ON state, the first inversion switching element iTr1 transmits the high-level inverter voltage VDD_IT to the reset node Qb.

The second inversion switching element iTr2 included in the n-th stage STn is controlled in accordance with a voltage at the set node Q. The second inversion switching element iTr2 is coupled between the reset node Qb and the low voltage line. That is, the second inversion switching element iTr2 is turned on or off in accordance with a voltage at the set node Q. In an ON state, the second inversion switching element iTr2 couples the reset node Qb to the low voltage line. A low voltage VL1 is supplied to the low voltage line.

Meanwhile, the second inversion switching element iTr2 has a larger size (for example, channel width) than the first inversion switching element iTr1 in order to bring the reset node Qb into a discharge state when both the first inversion switching element iTr1 and the second inversion switching element iTr2 are in an ON state.

Second Embodiment of Inverter INV

Figure 13:
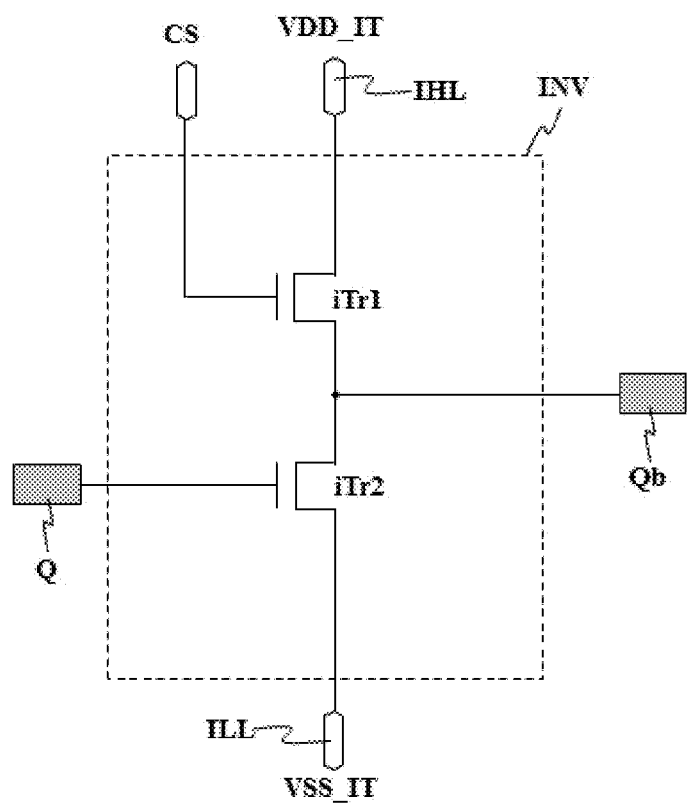
FIG. 13 is a diagram illustrating a detailed configuration of the inverter according to a second embodiment.

FIG. 13 is a diagram illustrating a detailed configuration of the inverter INV according to a second embodiment.

As illustrated in FIG. 13, the inverter INV included in the n-th stage STn includes a first inversion switching element iTr1 and a second inversion switching element iTr2.

The first inversion switching element iTr1 included in the n-th stage STn is controlled in accordance with a control signal CS. The first inversion switching element iTr1 is coupled between the high-level inverter line IHL and the reset node Qb. That is, the first inversion switching element iTr1 is turned on or off in accordance with the control signal CS. In an ON state, the first inversion switching element iTr1 transmits the high-level inverter voltage VDD_IT to the reset node Qb.

The second inversion switching element iTr2 included in the n-th stage STn is controlled in accordance with a voltage at the set node Q. The second inversion switching element iTr2 is coupled between the reset node Qb and the low voltage line. That is, the second inversion switching element iTr2 is turned on or off in accordance with a voltage at the set node Q. In an ON state, the second inversion switching element iTr2 transmits the low-level inverter voltage VSS_IT from the low-level inverter line ILL to the reset node Qb.

In this case, the control signal CS is maintained in a low voltage state when the set node Q is in a charge state (high level state) while being maintained in a high voltage state when the set node Q is a discharge state (low level state). When the control signal CS is in a high voltage state, the first inversion switching element iTr1 receiving the control signal CS is turned on. On the other hand, when the control signal CS is in a low voltage state, the first inversion switching element iTr1 receiving the control signal CS is turned off.

Meanwhile, the second inversion switching element iTr2 has a larger size (for example, channel width) than the first inversion switching element iTr1 in order to bring the reset node Qb into a discharge state when both the first inversion switching element iTr1 and the second inversion switching element iTr2 are in an ON state.

Third Embodiment of Inverter INV

Figure 14:
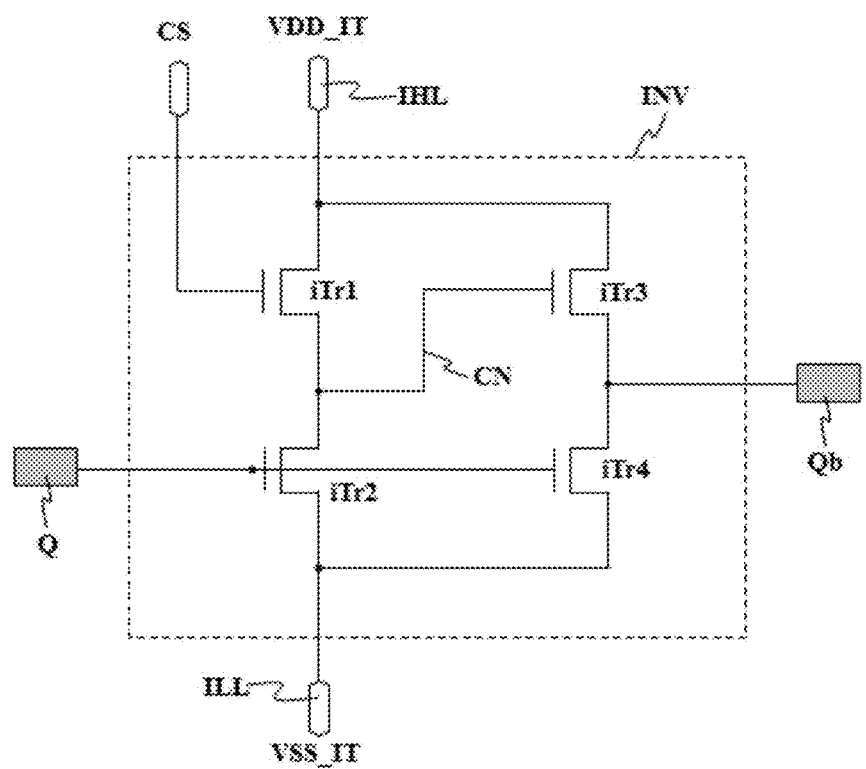
FIG. 14 is a diagram illustrating a detailed configuration of the inverter according to a third embodiment.

FIG. 14 is a diagram illustrating a detailed configuration of the inverter INV according to a third embodiment.

As illustrated in FIG. 14, the inverter INV included in the n-th stage STn includes first to fourth inversion switching elements iTr1 to iTr4.

The first inversion switching element iTr1 included in the n-th stage STn is controlled in accordance with a control signal CS from the outside. The first inversion switching element iTr1 is coupled between the high-level inverter line IHL and a common node CN. The first inversion switching element iTr1 is turned on or off in accordance with the control signal CS. In an ON state, the first inversion switching element iTr1 transmits the high-level inverter voltage VDD_IT to the common node CN.

The second inversion switching element iTr2 included in the n-th stage STn is controlled in accordance with a voltage at the set node Q. The second inversion switching element iTr2 is coupled between the common node CN and the low-level inverter line ILL. The second inversion switching element iTr2 is turned on or off in accordance with a voltage at the set node Q. In an ON state, the second inversion switching element iTr2 transmits the low-level inverter voltage VSS_IT to the common node CN.

The third inversion switching element iTr3 included in the n-th stage STn is controlled in accordance with the control signal CS from the outside. The third inversion switching element iTr3 is coupled between the high-level inverter line IHL and the reset node Qb. The third inversion switching element iTr3 is turned on or off in accordance with a voltage at the common node CN. In an ON state, the third inversion switching element iTr3 transmits the high-level inverter voltage VDD_IT to the reset node Qb.

The fourth inversion switching element iTr4 included in the n-th stage STn is controlled in accordance with a voltage at the set node Q. The fourth inversion switching element iTr4 is coupled between the reset node Qb and the low-level inverter line ILL. The fourth inversion switching element iTr4 is turned on or off in accordance with a voltage at the set node Q. In an ON state, the fourth inversion switching element iTr4 transmits the low-level inverter voltage VSS_IT to the reset node Qb.

In this case, the control signal CS is maintained in a low voltage state when the set node Q is in a charge state (high level state) while being maintained in a high voltage state when the set node Q is a discharge state (low level state). When the control signal CS is in a high voltage state, the first inversion switching element iTr1 receiving the control signal CS is turned on. On the other hand, when the control signal CS is in a low voltage state, the first inversion switching element iTr1 receiving the control signal CS is turned off.

Meanwhile, the second inversion switching element iTr2 has a larger size (for example, channel width) than the first inversion switching element iTr1 in order to bring the reset node Qb into a discharge state when both the first inversion switching element iTr1 and the second inversion switching element iTr2 are in an ON state.

Fourth Embodiment of Inverter INV

Figure 15:
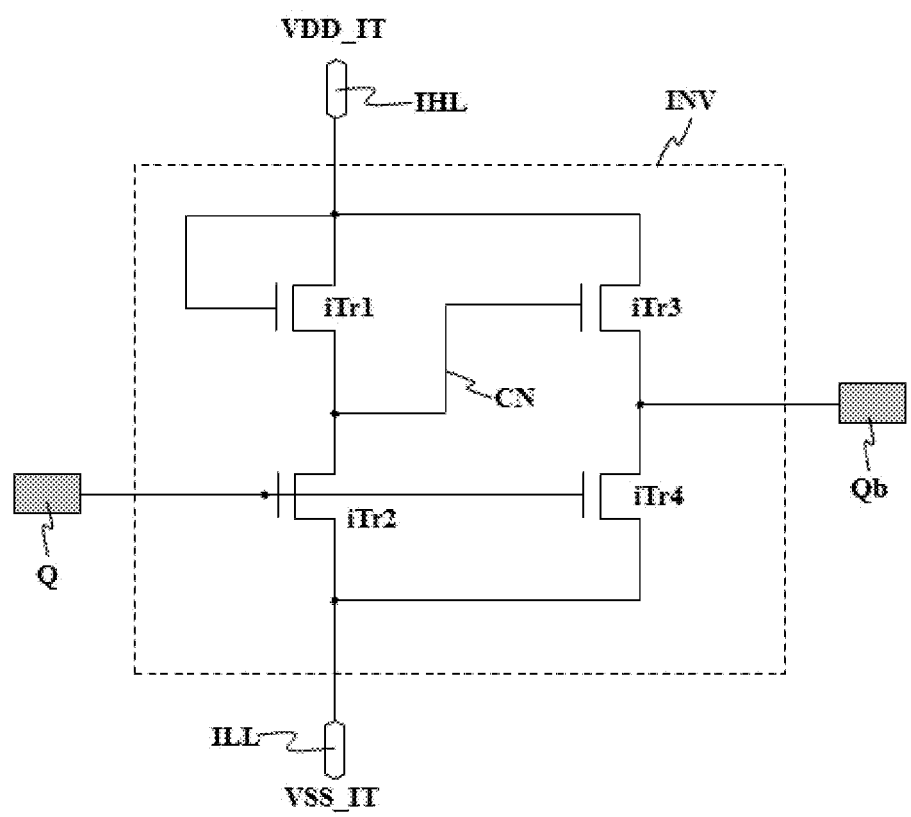
FIG. 15 is a diagram illustrating a detailed configuration of the inverter according to a fourth embodiment.

FIG. 15 is a diagram illustrating a detailed configuration of the inverter INV according to a fourth embodiment.

As illustrated in FIG. 15, the inverter INV included in the n-th stage STn includes first to fourth inversion switching elements iTr1 to iTr4.

The first inversion switching element iTr1 included in the n-th stage STn is controlled in accordance with the high-level inverter voltage VDD_IT from the high-level inverter line IHL. The first inversion switching element iTr1 is coupled between the high-level inverter line IHL and a common node CN. The first inversion switching element iTr1 is turned on or off in accordance with the high-level inverter voltage VDD_IT. In an ON state, the first inversion switching element iTr1 transmits the high-level inverter voltage VDD_IT to the common node CN.

The second inversion switching element iTr2 included in the n-th stage STn is controlled in accordance with a voltage at the set node Q. The second inversion switching element iTr2 is coupled between the common node CN and the low-level inverter line ILL. The second inversion switching element iTr2 is turned on or off in accordance with a voltage at the set node Q. In an ON state, the second inversion switching element iTr2 transmits the low-level inverter voltage VSS_IT to the common node CN.

The third inversion switching element iTr3 included in the n-th stage STn is controlled in accordance with a voltage at the common node CN. The third inversion switching element iTr3 is coupled between the high-level inverter line IHL and the reset node Qb. The third inversion switching element iTr3 is turned on or off in accordance with a voltage at the common node CN. In an ON state, the third inversion switching element iTr3 transmits the high-level inverter voltage VDD_IT to the reset node Qb.

The fourth inversion switching element iTr4 included in the n-th stage STn is controlled in accordance with a voltage at the set node Q. The fourth inversion switching element iTr4 is coupled between the reset node Qb and the low-level inverter line ILL. The fourth inversion switching element iTr4 is turned on or off in accordance with a voltage at the set node Q. In an ON state, the fourth inversion switching element iTr4 transmits the low-level inverter voltage VSS_IT to the reset node Qb.

Meanwhile, the second inversion switching element iTr2 has a larger size (for example, channel width) than the first inversion switching element iTr1 in order to bring the reset node Qb into a discharge state when both the first inversion switching element iTr1 and the second inversion switching element iTr2 are in an ON state.

Fifth Embodiment of Inverter INV

Figure 16:
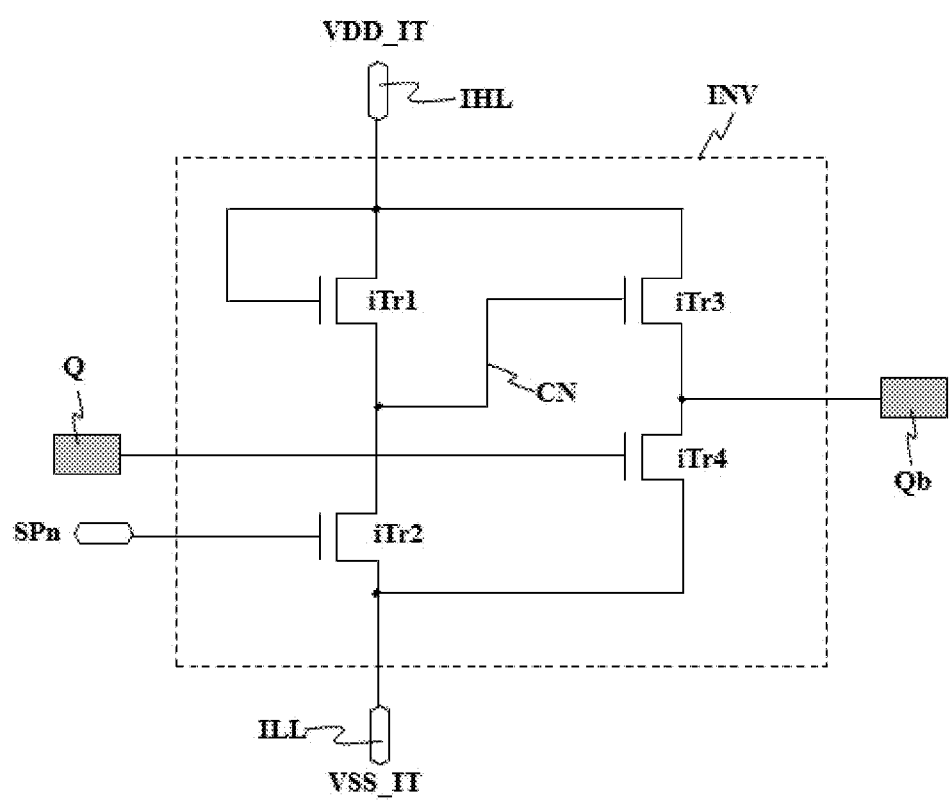
FIG. 16 is a diagram illustrating a detailed configuration of the inverter according to a fifth embodiment.

FIG. 16 is a diagram illustrating a detailed configuration of the inverter INV according to a fifth embodiment.

As illustrated in FIG. 16, the inverter INV included in the n-th stage STn includes first to fourth inversion switching elements iTr1 to iTr4.

The first inversion switching element iTr1 included in the n-th stage STn is controlled in accordance with the high-level inverter voltage VDD_IT from the high-level inverter line IHL. The first inversion switching element iTr1 is coupled between the high-level inverter line IHL and a common node CN. The first inversion switching element iTr1 is turned on or off in accordance with the high-level inverter voltage VDD_IT. In an ON state, the first inversion switching element iTr1 transmits the high-level inverter voltage VDD_IT to the common node CN.

The second inversion switching element iTr2 included in the n-th stage STn is controlled in accordance with a scan pulse SPn from the n-th stage STn. The second inversion switching element iTr2 is coupled between the common node CN and the low-level inverter line ILL. The second inversion switching element iTr2 is turned on or off in accordance with the scan pulse SPn. In an ON state, the second inversion switching element iTr2 transmits the low-level inverter voltage VSS_IT to the common node CN.

The third inversion switching element iTr3 included in the n-th stage STn is controlled in accordance with a voltage at the common node CN. The third inversion switching element iTr3 is coupled between the high-level inverter line IHL and the reset node Qb. The third inversion switching element iTr3 is turned on or off in accordance with a voltage at the common node CN. In an ON state, the third inversion switching element iTr3 transmits the high-level inverter voltage VDD_IT to the reset node Qb.

The fourth inversion switching element iTr4 included in the n-th stage STn is controlled in accordance with a voltage at the set node Q. The fourth inversion switching element iTr4 is coupled between the reset node Qb and the low-level inverter line ILL. The fourth inversion switching element iTr4 is turned on or off in accordance with a voltage at the set node Q. In an ON state, the fourth inversion switching element iTr4 transmits the low-level inverter voltage VSS_IT to the reset node Qb.

Meanwhile, the second inversion switching element iTr2 has a larger size (for example, channel width) than the first inversion switching element iTr1 in order to bring the reset node Qb into a discharge state when both the first inversion switching element iTr1 and the second inversion switching element iTr2 are in an ON state.

Sixth Embodiment of Inverter INV

Figure 17:
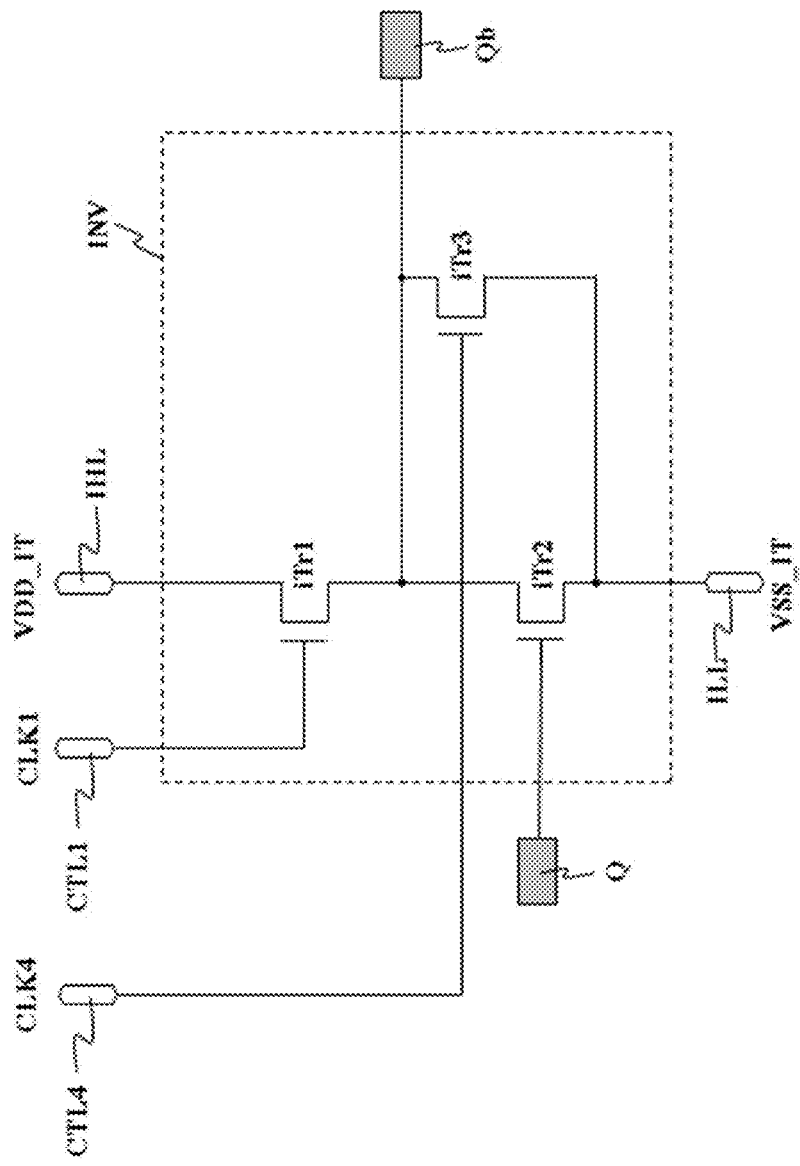
FIG. 17 is a diagram illustrating a detailed configuration of the inverter according to a sixth embodiment.

FIG. 17 is a diagram illustrating a detailed configuration of the inverter INV according to a sixth embodiment.

As illustrated in FIG. 17, the inverter INV included in the n-th stage STn includes first to third inversion switching elements iTr1 to iTr3.

The first inversion switching element iTr1 included in the n-th stage STn is controlled in accordance with the first clock pulse CLK1 from the first clock transmission line CTL1. The first inversion switching element iTr1 is coupled between the high-level inverter line IHL and the reset node Qb. The first inversion switching element iTr1 is turned on or off in accordance with the first clock pulse CLK1. In an ON state, the first inversion switching element iTr1 transmits the high-level inverter voltage VDD_IT to the reset node Qb. In this case, the clock pulse supplied to the first inversion switching element iTr1 may be any one of the first to fourth clock pulses CLK1 to CLK4 illustrated in FIG. 2. In this embodiment, as an example of the clock pulse, the first clock pulse CLK1 is employed.

The second inversion switching element iTr2 included in the n-th stage STn is controlled in accordance with a voltage at the set node Q. The second inversion switching element iTr2 is coupled between the reset node Qb and the low-level inverter line ILL. The second inversion switching element iTr2 is turned on or off in accordance with the voltage at the set node Q. In an ON state, the second inversion switching element iTr2 transmits the low-level inverter voltage VSS_IT to the reset node Qb.

The third inversion switching element iTr3 included in the n-th stage STn is controlled in accordance with the fourth clock pulse CLK4 from the fourth clock transmission line CTL4. The third inversion switching element iTr3 is coupled between the reset node Qb and the low-level inverter line ILL. The third inversion switching element iTr3 is turned on or off in accordance with the fourth clock pulse CLK4. In an ON state, the third inversion switching element iTr3 transmits the low-level inverter voltage VSS_IT to the reset node Qb. In this case, the clock pulse supplied to the third inversion switching element iTr3 may be any one of the first to fourth clock pulses CLK1 to CLK4 illustrated in FIG. 2. In this embodiment, as an example of the clock pulse, the fourth clock pulse CLK4 is employed.

Meanwhile, the second inversion switching element iTr2 has a larger size (for example, channel width) than the first inversion switching element iTr1 in order to bring the reset node Qb into a discharge state when both the first inversion switching element iTr1 and the second inversion switching element iTr2 are in an ON state.

Seventh Embodiment of Inverter INV

Figure 18:
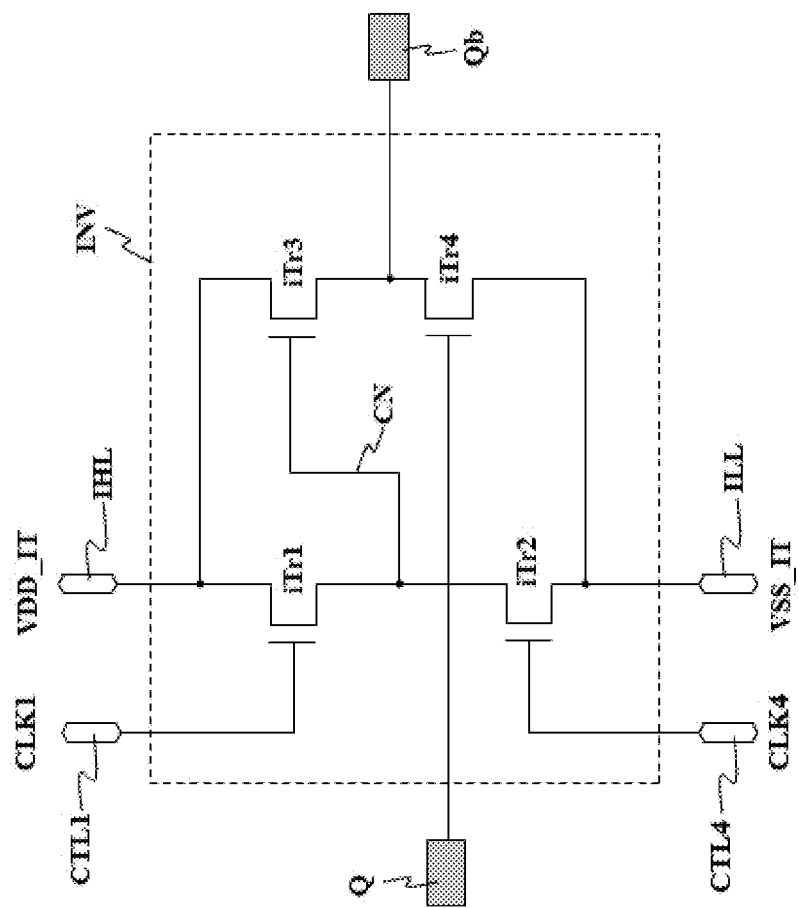
FIG. 18 is a diagram illustrating a detailed configuration of the inverter according to a seventh embodiment.

FIG. 18 is a diagram illustrating a detailed configuration of the inverter INV according to a seventh embodiment.

As illustrated in FIG. 18, one embodiment of the inverter INV included in the n-th stage STn includes first to fourth inversion switching elements iTr1 to iTr4.

The first inversion switching element iTr1 included in the n-th stage STn is controlled in accordance with the first clock pulse CLK1 from the first clock transmission line CTL1. The first inversion switching element iTr1 is coupled between the high-level inverter line IHL and a common node CN. The first inversion switching element iTr1 is turned on or off in accordance with the first clock pulse CLK1. In an ON state, the first inversion switching element iTr1 transmits the high-level inverter voltage VDD_IT to the common node CN. In this case, the clock pulse supplied to the first inversion switching element iTr1 may be any one of the first to fourth clock pulses CLK1 to CLK4 illustrated in FIG. 2. In this embodiment, as an example of the clock pulse, the first clock pulse CLK1 is employed.

The second inversion switching element iTr2 included in the n-th stage STn is controlled in accordance with the fourth clock pulse CLK4 from the fourth clock transmission line CTL4. The second inversion switching element iTr2 is coupled between the common node CN and the low-level inverter line ILL. The second inversion switching element iTr2 is turned on or off in accordance with the fourth clock pulse CLK4. In an ON state, the second inversion switching element iTr2 transmits the low-level inverter voltage VSS_IT to the common node CN. In this case, the clock pulse supplied to the second inversion switching element iTr2 may be any one of the first to fourth clock pulses CLK1 to CLK4 illustrated in FIG. 2. In this embodiment, as an example of the clock pulse, the fourth clock pulse CLK4 is employed.

The third inversion switching element iTr3 included in the n-th stage STn is controlled in accordance with a voltage at the common node CN. The third inversion switching element iTr3 is coupled between and the high-level inverter line IHL and the reset node Qb. The third inversion switching element iTr3 is turned on or off in accordance with the voltage at the common node CN. In an ON state, the third inversion switching element iTr3 transmits the high-level inverter voltage VDD_IT to the reset node Qb.

The fourth inversion switching element iTr4 included in the n-th stage STn is controlled in accordance with a voltage at the set node Q. The fourth inversion switching element iTr4 is coupled between the reset node Qb and the low-level inverter line ILL. The fourth inversion switching element iTr4 is turned on or off in accordance with the voltage at the set node Q. In an ON state, the fourth inversion switching element iTr4 transmits the low-level inverter voltage VSS_IT to the reset node Qb.

Meanwhile, the second inversion switching element iTr2 has a larger size (for example, channel width) than the first inversion switching element iTr1 in order to bring the reset node Qb into a discharge state when both the first inversion switching element iTr1 and the second inversion switching element iTr2 are in an ON state.

FIGS. 19A to 19E and 20 are diagrams illustrating inversion switching elements, which may be added to the inverter INV. The inverter INV according to each of the first to seventh embodiments illustrated in FIGS. 12 to 18 may further include at least one of six example structures illustrated in FIGS. 19A to 19E and 20.

Hereinafter, each of the six structures will be described in detail.

Figure 19A:
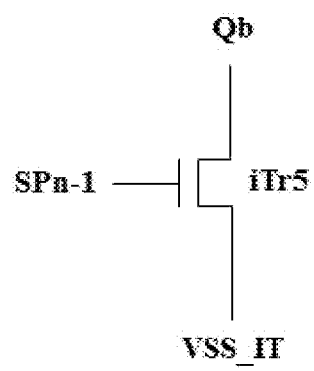
FIGS. 19A to 19E and 20 are diagrams illustrating example inversion switching elements, which may be added to the inverter.

The first structure includes a fifth inversion switching element iTr5, as illustrated in FIG. 19A.

The fifth inversion switching element iTr5 included in the n-th stage STn is controlled in accordance with a scan pulse from the upstream stage (for example, SPn−1). The fifth inversion switching element iTr5 is coupled between the reset node Qb and the low-level inverter line ILL. The fifth inversion switching element iTr5 is turned on or off in accordance with the scan pulse SPn−1 from the upstream stage. In an ON state, the fifth inversion switching element iTr5 transmits the low-level inverter voltage VSS_IT to the reset node Qb.

Figure 19B:
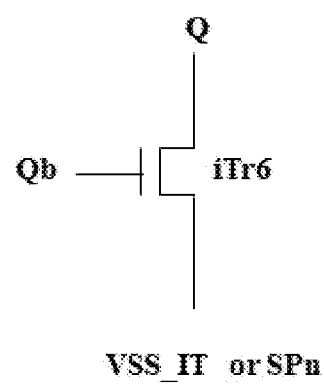

The second structure includes a sixth inversion switching element iTr6, as illustrated in FIG. 19B. The sixth inversion switching element iTr6 included in the n-th stage STn is controlled in accordance with a voltage at the reset node Qb. The sixth inversion switching element iTr6 is coupled between the set node Q and the low-level inverter line ILL. The sixth inversion switching element iTr6 is turned on or off in accordance with the voltage at the reset node Qb. In an ON state, the sixth inversion switching element iTr6 transmits the low-level inverter voltage VSS_IT to the set node Q. Meanwhile, the scan pulse SPn from the n-th stage STn may be applied to the sixth inversion switching element iTr6, in place of the low-level inverter voltage VSS_IT.

Figure 19C:
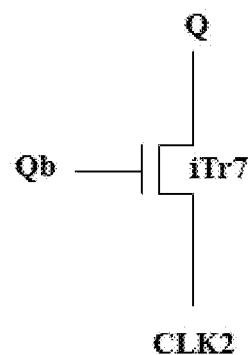

The third structure includes a seventh inversion switching element iTr7, as illustrated in FIG. 19C. The seventh inversion switching element iTr7 included in the n-th stage STn is controlled in accordance with a voltage at the reset node Qb. The seventh inversion switching element iTr7 is coupled between the set node Q and a clock transmission line to transmit a clock pulse. The seventh inversion switching element iTr7 is turned on or off in accordance with the voltage at the reset node Qb. In an ON state, the seventh inversion switching element iTr7 transmits a clock pulse, such as the second clock pulse CLK2, to the set node Q. Here, the clock pulse applied to the seventh inversion switching element iTr7 means a clock pulse used as the scan pulse SPn of the n-th stage STn. In place of this clock pulse, any one of the remaining clock pulses may be applied to the seventh inversion switching element iTr7. That is, any one of the first clock pulse CLK1, third clock pulse CLK3, and fourth clock pulse CLK4 may be applied to the seventh inversion switching element iTr7.

Figure 19D:
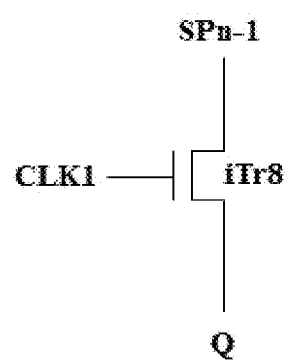

The fourth structure includes an eighth inversion switching element iTr8, as illustrated in FIG. 19D. The eighth inversion switching element iTr8 included in the n-th stage STn is controlled by a clock pulse, such as the first clock pulse CLK1 from the first clock transmission line CTL1. The eighth inversion switching element iTr8 is coupled between an output terminal of the upstream stage, from which a scan pulse from the upstream stage (for example, SPn−1) is output, and the set node Q. The eighth inversion switching element iTr8 is turned on or off in accordance with the first clock pulse CLK1. In an ON state, the eighth inversion switching element iTr8 transmits the scan pulse SPn−1 from an upstream stage to the set node Q of the n-th stage STn. Here, the clock pulse applied to the eighth inversion switching element iTr8 means a clock pulse used as the scan pulse SPn−1 of an upstream stage (the stage arranged upstream of the n-th stage, for example, STn−1). In this embodiment, as an example of the clock pulse, the first clock pulse CLK1 is employed. As illustrated in FIG. 2, the second clock pulse CLK2 is used as the scan pulse SPn of the n-th stage STn, and the first clock pulse CLK1 is used as the scan pulse SPn−1 of the n−1-th stage STn−1.

Figure 19E:
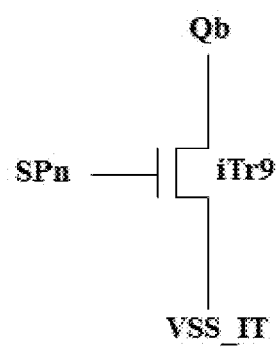

The fifth structure includes a ninth inversion switching element iTr9, as illustrated in FIG. 19E. The ninth inversion switching element iTr9 included in the n-th stage STn is controlled in accordance with the scan pulse SPn from the n-th stage STn. The ninth inversion switching element iTr9 is coupled between the reset node Qb and the low-level inverter line ILL. The ninth inversion switching element iTr9 is turned on or off in accordance with the scan pulse SPn. In an ON state, the ninth inversion switching element iTr9 transmits the low-level inverter voltage VSS_IT to the reset node Qb.

Figure 20:
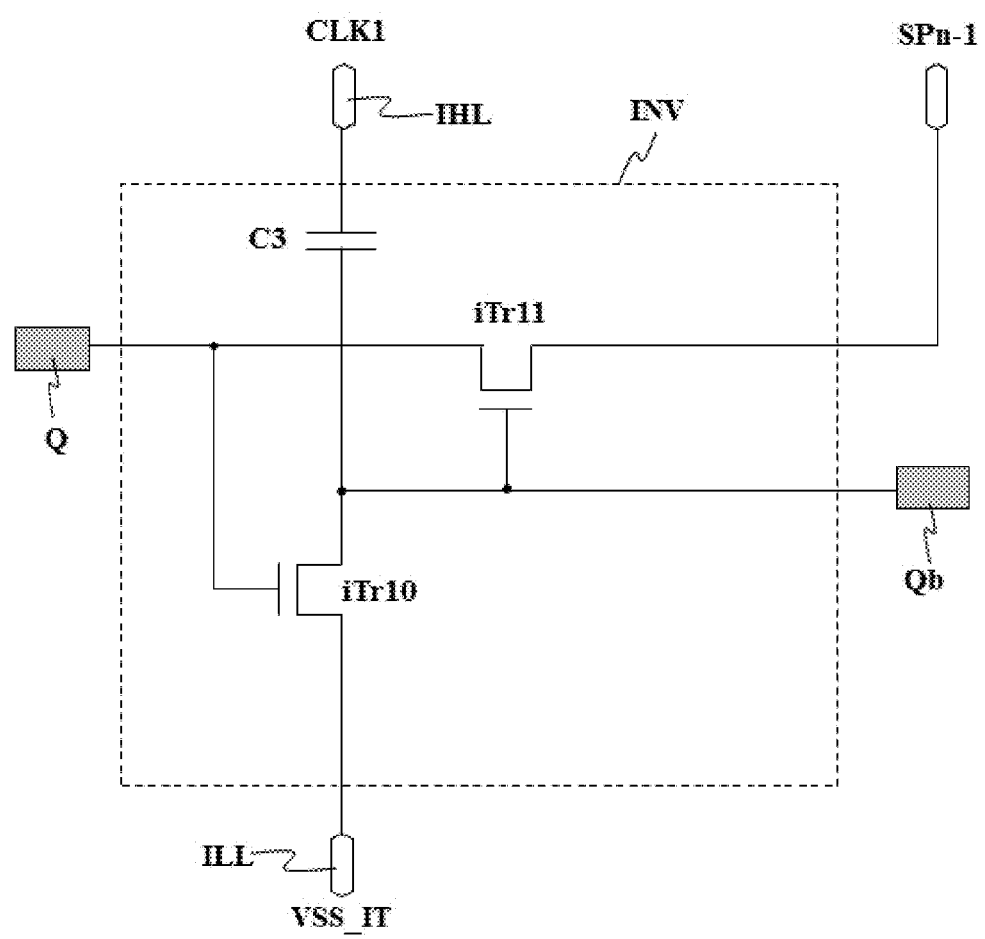

The sixth structure includes a tenth inversion switching element iTr10, an eleventh inversion switching element iTr11, and a third capacitor C3, as illustrated in FIG. 20.

The tenth inversion switching element iTr10 included in the n-th stage STn is controlled in accordance with a voltage at the set node Q. The tenth inversion switching element iTr10 is coupled between the reset node Qb and the low-level inverter line ILL. The tenth inversion switching element iTr10 is turned on or off in accordance with the voltage at the set node Q. In an ON state, the tenth inversion switching element iTr10 transmits the low-level inverter voltage VSS_IT to the reset node Qb.

The eleventh inversion switching element iTr11 included in the n-th stage STn is controlled in accordance with a voltage at the reset node Qb. The eleventh inversion switching element iTr11 is coupled between the set node Q and an output terminal of an upstream stage, from which a scan pulse from the upstream stage (for example, SPn−1) is output. The eleventh inversion switching element iTr11 is turned on or off in accordance with the voltage at the reset node Qb. In an ON state, the eleventh inversion switching element iTr11 transmits the scan pulse SPn−1 from the upstream stage to the set node Q.

The third capacitor C3 included in the n-th stage STn is coupled between the first clock transmission line CLK1 and the reset node Qb. Here, the clock pulse applied to the third capacitor C3 means a clock pulse used as the scan pulse SPn−1 of the upstream stage (the stage arranged upstream of the n-th stage, for example, STn−1). In this embodiment, as an example of the clock pulse, the first clock pulse CLK1 is employed. As illustrated in FIG. 2, the second clock pulse CLK2 is used as the scan pulse SPn of the n-th stage STn, and the first clock pulse CLK1 is used as the scan pulse SPn−1 of the n−1-th stage STn−1.

Figure 21:
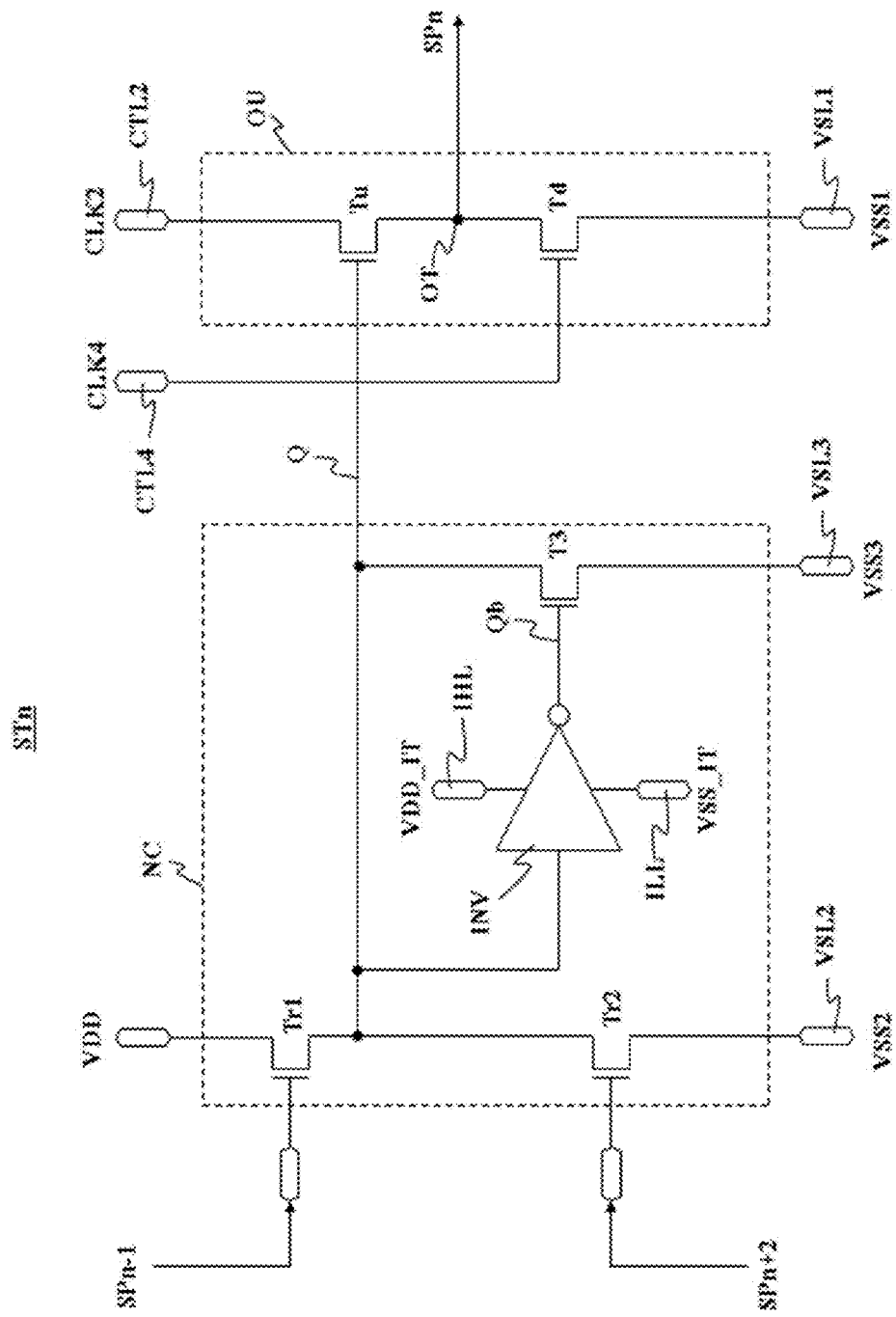
FIG. 21 is a diagram illustrating another configuration of each stage.

FIG. 21 is a diagram illustrating another configuration of each stage.

The node controller NC included in the n-th stage STn includes first to third switching elements Tr1 to Tr3, as illustrated in FIG. 21.

In this case, the first and second switching elements Tr1 and Tr2 are identical to those of FIG. 11 and, as such, descriptions thereof will refer to descriptions given in conjunction with FIG. 11.

The third inversion switching element Tr3 included in the n-th stage STn is controlled in accordance with a voltage at the reset node Qb. The third inversion switching element iTr3 is coupled between the set node Q and a third discharge voltage line VSL3 to transmit a third discharge voltage VSS3.

The third inversion switching element iTr3 is turned on or off in accordance with the voltage at the reset node Qb. In an ON state, the third inversion switching element iTr3 transmits the third discharge voltage VSS3 to the set node Q.

Meanwhile, in the case of FIG. 21, the gate electrode of the pull-down switching element Td included in the output unit OU is coupled to another clock transmission line (for example, CTL4), differently than the case of FIG. 11 in which the gate electrode is coupled to the reset node Qb. The pull-down switching element Td of FIG. 21 is turned on or off in accordance with the fourth clock pulse CLK4. In an ON state, the pull-down switching element Td transmits the first discharge voltage VSS1 to the output terminal OT.

When each stage has the structure of FIG. 21, the third switching element Tr3 will be the switching element, degradation of which will be checked by the inverter voltage controller 300.

Figure 22:
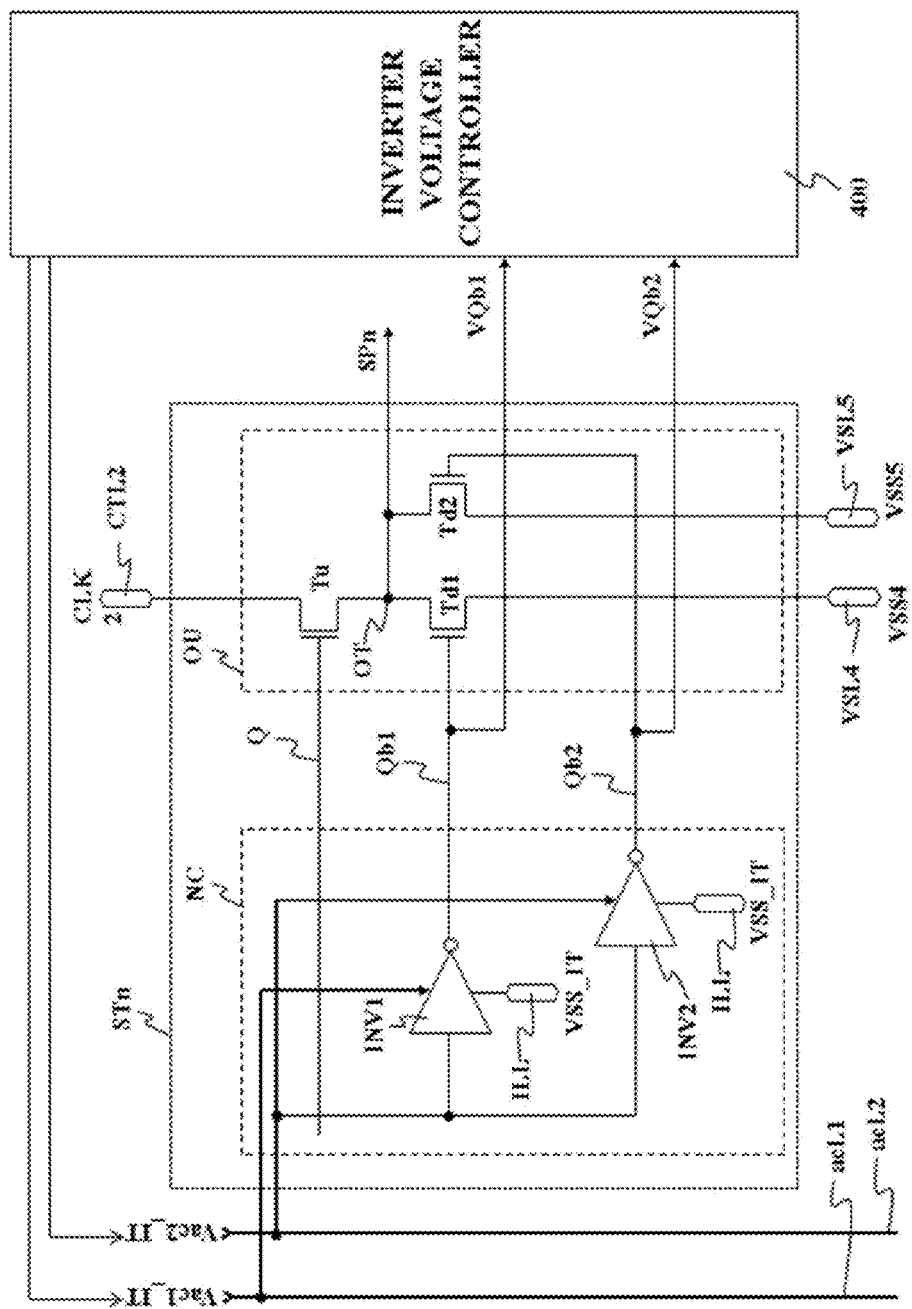
FIG. 22 is a diagram illustrating a configuration of each stage according to a second embodiment.

FIG. 22 is a diagram illustrating a configuration of each stage according to a second embodiment of the present invention. FIG. 22 illustrates a configuration of one stage illustrated in FIG. 1 and an inverter voltage controller coupled to the stage.

The illustrated stage, namely, the n-th stage STn, includes a node controller NC and an output unit OU, as illustrated in FIG. 22.

The node controller NC included in the n-th stage STn controls voltage states of a set node Q thereof and first and second reset nodes Qb1 and Qb2 thereof, based on at least one of a scan pulse from an upstream stage and a scan pulse from a downstream stage.

The node controller NC includes first and second inverters INV1 and INV2. The first inverter INV1 controls a voltage at the first reset node Qb1 in accordance with a voltage applied to the set node Q. The second inverter INV2 controls a voltage at the second reset node Qb2 in accordance with the voltage applied to the set node Q.

That is, the first inverter INV1 brings the voltage at the first reset node Qb1 into a low level state (discharge state) when the voltage at the set node Q is in a high level state (charge state). On the other hand, when the voltage at the set node Q is in a low-level state, the first inverter INV1 brings the voltage at the first reset node Qb1 into a high level state or a low level state in accordance with a state of a first AC inverter voltage Vac1_IT in a corresponding frame period.

Meanwhile, the second inverter INV2 brings the voltage at the second reset node Qb2 into a low level state when the voltage at the set node Q is in a high level state. On the other hand, when the voltage at the set node Q is in a low-level state, the second inverter INV2 brings the voltage at the second reset node Qb2 into a high level state or a low level state in accordance with a state of a second AC inverter voltage Vac2_IT in a corresponding frame period.

In this case, the first inverter INV1 brings the voltage at the first reset node Qb1 into a high level state, using the first AC inverter voltage Vac1_IT supplied thereto through a first AC inverter line acL1. The first inverter INV1 also brings the voltage at the first reset node Qb1 into a low level state, using a low-level inverter voltage VSS_IT supplied thereto through a low-level inverter line ILL.

The second inverter INV2 brings the voltage at the second reset node Qb2 into a high level state, using the second AC inverter voltage Vac2_IT supplied thereto through a second AC inverter line acL2. The second inverter INV2 also brings the voltage at the second reset node Qb2 into a low level state, using the low-level inverter voltage VSS_IT supplied thereto through the low-level inverter line ILL.

Each of the first AC inverter voltage Vac1_IT and second AC inverter voltage Vac2_IT is an AC signal alternately having the level of the charge voltage VDD and the level of the first discharge voltage VSS1 in units of f frames ("f" is a natural number). The first AC inverter voltage Vac1_IT is a signal having a waveform inverted 180° from that of the second AC inverter voltage Vac2_IT. Accordingly, when the first AC inverter voltage Vac1_IT is maintained at the level of the charge voltage VDD in a particular frame period, the second AC inverter voltage Vac2_IT is maintained at the level of the first discharge voltage VSS1.

The first AC inverter line acL1, second AC inverter line acL2, and low-level inverter line ILL are coupled in common to all stages. Accordingly, the first AC inverter voltage Vac1_IT, which is supplied to each stage, is varied in accordance with adjustment of the level of the first AC inverter voltage Vac1_IT transmitted to the first AC inverter line acL1. Similarly, the second AC inverter voltage Vac2_IT, which is supplied to each stage, is varied in accordance with adjustment of the level of the second AC inverter voltage Vac2_IT transmitted to the second AC inverter line acL2. The low-level inverter voltage VSS_IT, which is transmitted to each stage, is varied in accordance with adjustment of the level of the low-level inverter voltage VSS_IT supplied to the low-level inverter line ILL.

The output unit OU included in the n-th stage STn outputs a scan pulse SPn, based on at least one of the voltage at the set node Q, the voltage at the first reset node Qb1, and the voltage at the second reset node Qb2. In detail, the output unit OU outputs a high-level clock pulse (for example, CLK2) supplied thereto, as a scan pulse (for example, SPn), when the set node Q is in a charge state, and one of the first and second reset nodes Qb1 and Qb2 is a discharge state. On the other hand, when the set node Q is in a discharge state, and the reset node Qb is a charge state, the output unit OU outputs a first discharge voltage VSS1. The scan pulse SPn and first discharge voltage VSS1 are output through an output terminal OT of the associated stage (for example, STn).

To this end, the output unit OU may include a pull-up switching element Tu, and first and second pull-down switching elements Td1 and Td2.

The pull-up switching element Tu included in the output unit OU of the n-th stage STn is controlled in accordance with the voltage at the set node Q of the n-th stage STn. The pull-up switching element Tu is coupled between a second clock transmission line CTL2 and the output terminal OT of the n-th stage STn to transmit the second clock pulse CLK2 to the output terminal OT. The pull-up switching element Tu is turned on or off in accordance with the voltage of the set node Q. In an ON state, the pull-up switching element Tu transmits the second clock pulse CLK2 to the output terminal OT.

The first pull-down switching element Td1 is controlled in accordance with the voltage at the first reset node Qb1. The first pull-down switching element Td1 is coupled between the output terminal OT and a fourth discharge voltage line VSL4 to transmit the fourth discharge voltage VSS4 to the output terminal OT. That is, the first pull-down switching element Td1 is turned on or off in accordance with the voltage of the first reset node Qb1. In an ON state, the first pull-down switching element Td1 transmits the fourth discharge voltage VSS4 to the output terminal OT.

The second pull-down switching element Td2 is controlled in accordance with the voltage at the second reset node Qb2. The second pull-down switching element Td2 is coupled between the output terminal OT and a fifth discharge voltage line VSL5 to transmit a fifth discharge voltage VSS5. That is, the second pull-down switching element Td2 is turned on or off in accordance with the voltage of the second reset node Qb2. In an ON state, the second pull-down switching element Td2 transmits the fifth discharge voltage VSS5 to the output terminal OT.

All stages may have the same configuration as the configuration of the n-th stage STn as illustrated in FIG. 22.

Meanwhile, an inverter voltage controller 400 is coupled to at least one of the all stages, to check a degree of degradation of the first and second pull-down switching elements Td1 and Td2 of the coupled stage (switching elements coupled to the first and second reset nodes Qb1 and Qb2 of the coupled stage at gate electrodes thereof, if such switching elements are present). Based on the checked results, the inverter voltage controller 400 adjusts the levels of the first and second AC inverter voltages Vac1_IT and Vac2_IT. For example, degradation of the first and second pull-down switching elements Td1 and Td2 is increased as the driving time of the shift register increases. In this regard, the inverter voltage controller 400 further increases the levels of the first and second AC inverter voltages Vac1_IT and Vac2_IT as degradation of the first and second pull-down switching elements Td1 and Td2 increases.

The inverter voltage controller 400 checks degrees of degradation of the first and second pull-down switching elements Td1 and Td2, based on a voltage at at least one first reset node Qb1 and a voltage at at least one second reset node Qb2. Although FIG. 22 illustrates an example in which the inverter voltage controller 400 is coupled to the first and second rest nodes Qb1 and Qb2 of one stage, namely, the n-th stage STn, the present invention is not limited to such a configuration. That is, the inverter voltage controller 400 according to the present invention may be coupled to, for example, at least two first reset nodes Qb1 and at least two second reset nodes Qb2 respectively included in at least two different stages.

Meanwhile, the inverter voltage controller 400 may be installed within one of the stages.

Hereinafter, the configuration of the inverter voltage controller 400 will be described in detail.

Figure 23:
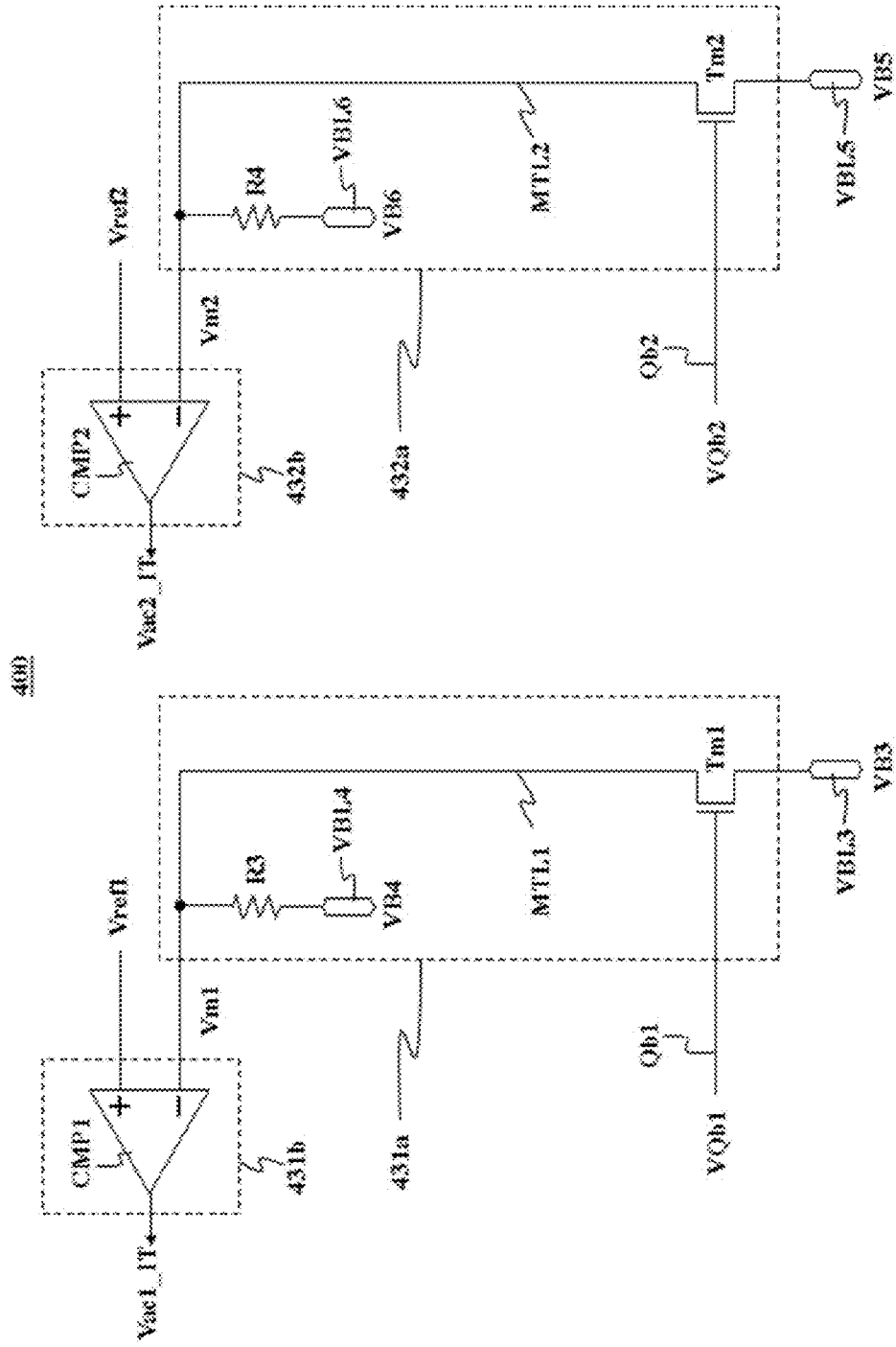
FIG. 23 is a diagram illustrating a detailed configuration of an inverter voltage controller illustrated in FIG. 22.

FIG. 23 is a diagram illustrating a detailed configuration of one embodiment of the inverter voltage controller 400 illustrated in FIG. 22.

As illustrated in FIG. 23, the inverter voltage controller 400 includes a first voltage monitor 431a, a first voltage adjuster 431b, a second voltage monitor 432a, and a second voltage adjuster 432b.

The first voltage monitor 431a adjusts the level of a first monitoring voltage Vm1 in accordance with the level of a voltage VQb1 applied to the first reset node Qb1 included in one of the stages (for example, STn), and outputs the adjusted first monitoring voltage Vm1 to a first monitoring input line MTL1.

To this end, the first voltage monitor 431a includes a first monitoring switching element Tm1 and a third resistor R3, as illustrated in FIG. 23.

The first monitoring switching element Tm1 is controlled in accordance with the voltage at the first reset node Qb1 included in one of the stages (for example, STn). The first monitoring switching element Tm1 is coupled between the first monitoring input line MTL1, to which the first monitoring voltage Vm1 is input, and a third base voltage line VBL3 to transmit a third base voltage VB3. The first monitoring switching element Tm1 is used as an index for checking of a degradation degree of switching elements coupled to the first reset node Qb1 through gate electrodes thereof (for example, first pull-down switching elements). That is, the degradation degree of the first monitoring switching element Tm1 means the degradation degree of switching elements coupled to the first reset node Qb1 through gate electrodes thereof (for example, first pull-down switching elements).

The third resistor R3 is coupled between the first monitoring input line MTL1 and a fourth base voltage line VBL4 to transmit a fourth base voltage VB4.

The first voltage adjuster 431b adjusts the level of the first AC inverter voltage Vac1_IT, based on a predetermined first reference voltage Vref1 and the first monitoring voltage Vm1 applied to the first monitoring input line MTL1. The first voltage adjuster 431b supplies the adjusted AC first inverter voltage Vac1_IT to the first inverter INV.

As illustrated in FIG. 23, the first voltage adjuster 431b includes a first comparator CMP1 for comparing the first monitoring voltage Vm1 from the first monitoring input line MTL1 with the first reference voltage Vref1, adjusting the level of the first AC inverter voltage Vac1_IT, based on the compared results, and then supplying the adjusted first AC inverter voltage Vac1_IT to the first inverter INV1. In this case, the first AC inverter voltage Vac1_IT output from the first comparator CMP1 is supplied to the first inverter INV1 via the first AC inverter line acL1.

Meanwhile, in the case of FIG. 23, the first reference voltage Vref1 is input to a non-inverting terminal (+) of the first comparator CMP1, and the first monitoring voltage Vm1 is input to an inverting terminal (−) of the first comparator CMP1. Conversely, it may be possible to implement a configuration in which the first reference voltage Vref1 may be input to the inverting terminal (−) of the first comparator CMP1, and the first monitoring voltage Vm1 may be input to the non-inverting terminal (+) of the first comparator CMP1.

The first reference voltage Vref1 is a DC voltage having a fixed level, whereas the first monitoring voltage Vm1 is varied in accordance with the level of the voltage at the first reset node Qb1. Accordingly, the first comparator CMP1 adjusts the level of an output thereof, that is, the level of the first AC inverter voltage Vac1_IT, to equalize the first monitoring voltage Vm1 input thereto with the first reference voltage Vref1. Thus, the level of the first AC inverter voltage Vac1_IT is varied in accordance with the level of the first monitoring voltage Vm.

In this case, an operational amplifier exhibiting high gain may be used as the first comparator CMP1.

The second voltage monitor 432a adjusts the level of a second monitoring voltage Vm2 in accordance with the level of a voltage VQb2 applied to the second reset node Qb2 included in one of the stages (for example, STn), and outputs the adjusted second monitoring voltage Vm2 to a second monitoring input line MTL2.

To this end, the second voltage monitor 432a includes a second monitoring switching element Tm2 and a fourth resistor R4, as illustrated in FIG. 23.

The second monitoring switching element Tm2 is controlled in accordance with the voltage at the second reset node Qb2 included in one of the stages (for example, STn). The second monitoring switching element Tm2 is coupled between the second monitoring input line MTL2, to which the second monitoring voltage Vm2 is input, and a fifth base voltage line VBL5 to transmit a fifth base voltage VB5. The second monitoring switching element Tm2 is used as an index for checking of a degradation degree of switching elements coupled to the second reset node Qb2 through gate electrodes thereof (for example, second pull-down switching elements). That is, the degradation degree of the second monitoring switching element Tm2 means the degradation degree of switching elements coupled to the second reset node Qb2 through gate electrodes thereof (for example, second pull-down switching elements).

The fourth resistor R4 is coupled between the second monitoring input line MTL2 and a sixth base voltage line VBL6 to transmit a sixth base voltage VB6 to the input line MTL2.

The second voltage adjuster 432b adjusts the level of the second AC inverter voltage Vac2_IT, based on a predetermined second reference voltage Vref2 and the second monitoring voltage Vm2 applied to the second monitoring input line MTL2. The second voltage adjuster 432b supplies the adjusted second AC inverter voltage Vac2_IT to the second inverter INV2.

As illustrated in FIG. 23, the second voltage adjuster 432b includes a second comparator CMP2 for comparing the second monitoring voltage Vm2 from the second monitoring input line MTL2 with the second reference voltage Vref2, adjusting the level of the second AC inverter voltage Vac2_IT, based on the compared results, and then supplying the adjusted second AC inverter voltage Vac2_IT to the second inverter INV2. In this case, the second AC inverter voltage Vac2_IT output from the second comparator CMP2 is supplied to the second inverter INV2 via the second AC inverter line acL2.

Meanwhile, in the case of FIG. 23, the second reference voltage Vref2 is input to a non-inverting terminal (+) of the second comparator CMP2, and the second monitoring voltage Vm2 is input to an inverting terminal (−) of the second comparator CMP2. Conversely, it may be possible to implement a configuration in which the second reference voltage Vref2 may be input to the inverting terminal (−) of the second comparator CMP2, and the second monitoring voltage Vm2 may be input to the non-inverting terminal (+) of the second comparator CMP2.

The second reference voltage Vref2 is a DC voltage having a fixed level, whereas the second monitoring voltage Vm2 is varied in accordance with the level of the voltage at the second reset node Qb2. Accordingly, the second comparator CMP2 adjusts the level of an output thereof, that is, the level of the second AC inverter voltage Vac2_IT, to equalize the second monitoring voltage Vm2 input thereto with the second reference voltage Vref2. Thus, the level of the second AC inverter voltage Vac2_IT is varied in accordance with the level of the second monitoring voltage Vm.

In this case, an operational amplifier exhibiting high gain may be used as the second comparator CMP2.

Meanwhile, the third base voltage VB3 and fifth base voltage VB5 may have the same level. In this case, one of the third base voltage VB3 and fifth base voltage VB5 may be supplied to the first and second monitoring switching elements Tm1 and Tm2 via a single line.

The fourth base voltage VB4 and sixth base voltage VB6 may have the same level. In this case, one of the fourth base voltage VB4 and sixth base voltage VB6 may be supplied to the third and fourth resistors R3 and R4 via a single line.

Meanwhile, the first voltage adjuster 431b and second voltage adjuster 432b perform different operations for the same frame period. That is, the first AC inverter voltage Vac1_IT and second AC inverter voltage Vac2_IT should exhibit opposite voltage states in the same frame period, respectively, as described above. Accordingly, if operations of the voltage adjusters are set such that, in a first frame period, the first AC inverter voltage Vac1_IT has a high level state (for example, charge voltage level), and the second AC inverter voltage Vac2_IT has a low level state (for example, discharge voltage level), the first voltage adjuster 431b outputs, in the first frame period, a high-level first AC inverter voltage Vac1_IT adjusted in level in accordance with the level of the voltage at the first reset node Qb1. On the other hand, in the first frame period, the second voltage adjuster 432b outputs a low voltage having a constant level (for example, the first discharge voltage), irrespective of the level of the voltage at the second reset node Qb2. In order to reduce power consumption, the second voltage adjuster 431b may not generate any output during the first frame period.

Meanwhile, in a predetermined frame period, the first voltage adjuster 431b may output a low voltage having a constant level, and the second voltage adjuster 432b may output a level-adjusted second AC inverter voltage Vac2_IT. During the predetermined frame period, the first voltage adjuster 431b may not generate any output.

For the above-described operations of the first and second voltage adjusters 431b and 432b, operations of the first comparator CMP1 and second comparator CMP2 may be controlled on a frame basis. For example, in a first frame period, a drive voltage is supplied to the first comparator CMP1, and no drive voltage is supplied to the second comparator CMP2.

The inverter voltage controller 400 according to various embodiments may apply an optimal voltage to the first and second reset nodes Qb1 and Qb2. Thus, it may be possible to prevent malfunction of the circuit caused by degradation of switching elements coupled to the first and second reset nodes Qb1 and Qb2 through gate electrodes thereof (for example, pull-down switching elements).

Meanwhile, it may be possible to set the fourth discharge voltage VSS4 and third base voltage VB3 in FIG. 23 to have the same level, in order to make driving conditions of the first monitoring switching element Tm1 and first pull-down switching element Td1 similar.

It may also be possible to set the fifth discharge voltage VSS5 and fifth base voltage VB5 in FIG. 23 to have the same level, in order to make driving conditions of the second monitoring switching element Tm2 and second pull-down switching element Td2 similar.

Figure 24A:
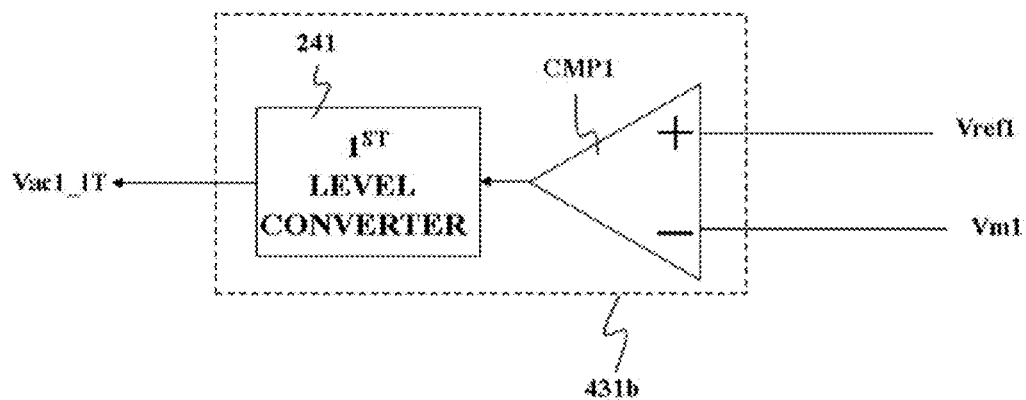
FIGS. 24A and 24B are diagrams illustrating alternative configurations of each of first and second voltage adjuster in FIG. 23.
Figure 24B:
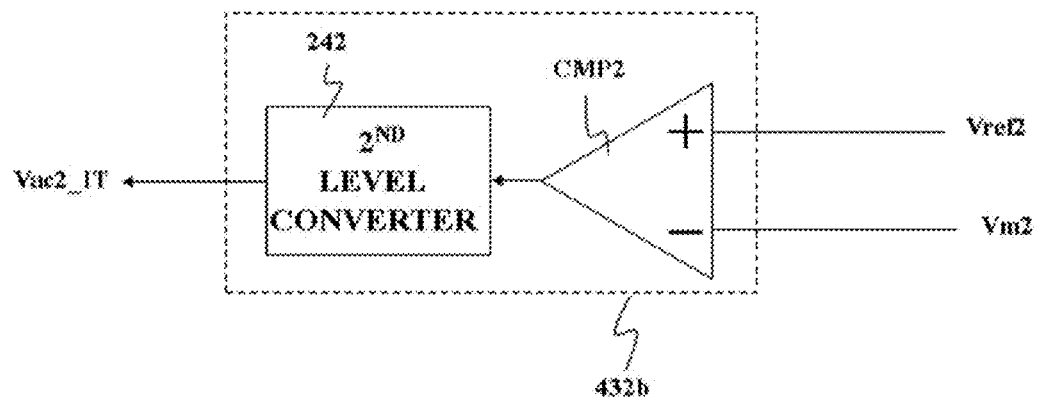

FIGS. 24A and 24B are diagrams illustrating alternative configurations of each of the first and second voltage adjusters 431b and 432b in FIG. 23.

As illustrated in FIG. 24A, the first voltage adjuster 431b may further include a first level converter 241. The first level converter 241 shifts the level of the first AC inverter voltage Vac1_IT from the first comparator CMP1. That is, when the range of the output voltage of the first comparator CMP 1 is narrow, the first level converter 241 may be used to expand the range.

As the first level converter 241, a level shifter, a DC-DC converter, an amplifier, or the like may be used.

As illustrated in FIG. 24B, the second voltage adjuster 432b may further include a second level converter 242. The second level converter 242 shifts the level of the second AC inverter voltage Vac2_IT from the second comparator CMP2. That is, when the range of the output voltage of the second comparator CMP2 is narrow, the second level converter 242 may be used to expand the range.

As the second level converter 242, a level shifter, a DC-DC converter, an amplifier, or the like may be used.

Meanwhile, the first and second level converters 241 and 242 perform different operations for the same frame period. That is, the first level converter 241 may output the first AC inverter voltage Vac1_IT supplied thereto after converting the level of the first AC inverter voltage Vac1_IT, whereas the second level converter 242 may output a low voltage having a constant level, irrespective of the second AC inverter voltage Vac2_IT supplied thereto. In order to reduce power consumption, the second level converter 242 may not generate any output during the first frame period.

For such operations of the first and second level converters 241 and 242, an operation control signal may be supplied to the first and second level converters 241 and 242. The operation control signal has different values on a frame basis. For example, when the operation control signal exhibits a high state in the first frame period, the first level converter 241 may adjust the first AC inverter voltage Vac1_IT supplied thereto in response to the operation control signal, and may then output the adjusted first AC inverter voltage Vac1_IT. On the other hand, the second level converter 242 may output a low voltage, irrespective of the second AC inverter voltage Vac2_IT supplied thereto.

Figure 25:
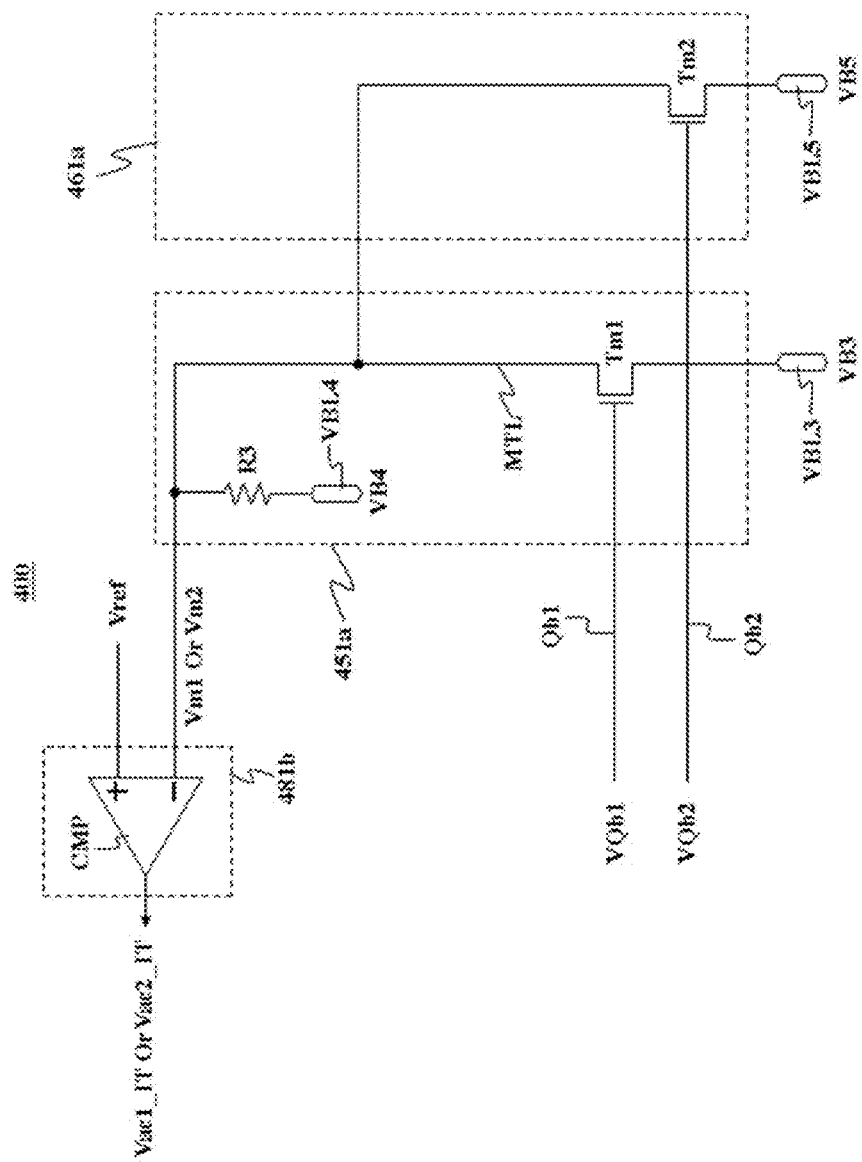
FIG. 25 is a diagram illustrating another configuration of the inverter voltage controller in FIG. 22.

FIG. 25 is a diagram illustrating another configuration of the inverter voltage controller 400 in FIG. 22.

As illustrated in FIG. 25, the inverter voltage controller 400 includes a first voltage monitor 451a, a second voltage monitor 461a, and a voltage adjuster 481b.

The first voltage monitor 451a adjusts the level of the first monitoring voltage Vm1 in accordance with the level of the voltage VQb1 applied to the first reset node Qb1 included in one of the stages (for example, STn), and outputs the adjusted first monitoring voltage Vm1 to the monitoring input line MTL.

To this end, the first voltage monitor 451a includes a first monitoring switching element Tm1 and a third resistor R3, as illustrated in FIG. 25.

The first monitoring switching element Tm1 is controlled in accordance with the voltage at the first reset node Qb1 included in one of the stages (for example, STn). The first monitoring switching element Tm1 is coupled between a monitoring input line MTL, to which the first monitoring voltage Vm1 is input, and a fourth base voltage line VBL4 to transmit a fourth base voltage VB4. The first monitoring switching element Tm1 is used as an index for checking of a degradation degree of switching elements coupled to the first reset node Qb1 through gate electrodes thereof (for example, first pull-down switching elements). That is, the degradation degree of the first monitoring switching element Tm1 means the degradation degree of switching elements coupled to the first reset node Qb1 through gate electrodes thereof (for example, first pull-down switching elements).

The third resistor R3 is coupled between the monitoring input line MTL and the fourth base voltage line VBL4 to transmit the fourth base voltage VB4.

The second voltage monitor 461a adjusts the level of the second monitoring voltage Vm2 in accordance with the level of the voltage VQb2 applied to the second reset node Qb2 included in one of the stages (for example, STn), and outputs the adjusted second monitoring voltage Vm2 to the monitoring input line MTL.

To this end, the second voltage monitor 461a includes a second monitoring switching element Tm2, as illustrated in FIG. 25.

The second monitoring switching element Tm2 is controlled in accordance with the voltage at the second reset node Qb2 included in one of the stages (for example, STn). The second monitoring switching element Tm2 is coupled between the monitoring input line MTL, to which the second monitoring voltage Vm2 is input, and a fifth base voltage line VBL5 to transmit a fifth base voltage VB5 to the monitoring input line MTL. The second monitoring switching element Tm2 is used as an index for checking of a degradation degree of switching elements coupled to the second reset node Qb2 through gate electrodes thereof (for example, second pull-down switching elements). That is, the degradation degree of the second monitoring switching element Tm2 means the degradation degree of switching elements coupled to the second reset node Qb2 through gate electrodes thereof (for example, second pull-down switching elements).

The voltage adjuster 481b adjusts the level of the first AC inverter voltage Vac1_IT, based on a predetermined reference voltage Vref and the first monitoring voltage Vm1 applied to the monitoring input line MTL. The voltage adjuster 481b supplies the adjusted first AC inverter voltage Vac1_IT to the first inverter INV1. The voltage adjuster 481b also adjusts the level of the second AC inverter voltage Vac2_IT, based on the predetermined reference voltage Vref and the second monitoring voltage Vm2 applied to the monitoring input line MTL. The voltage adjuster 481b supplies the adjusted second AC inverter voltage Vac2_IT to the second inverter INV2.

As illustrated in FIG. 25, the voltage adjuster 481b includes a comparator CMP. The comparator CMP compares the first monitoring voltage Vm1 from the monitoring input line MTL with the reference voltage Vref, adjusts the level of the first AC inverter voltage Vac1_IT based on the compared results, and then supplies the adjusted first AC inverter voltage Vac1_IT to the first inverter INV1. The comparator CMP also compares the second monitoring voltage Vm2 from the monitoring input line MTL with the reference voltage Vref, adjusts the level of the second AC inverter voltage Vac2_IT, based on the compared results, and then supplies the adjusted second AC inverter voltage Vac2_IT to the second inverter INV2.

Meanwhile, in the case of FIG. 25, the reference voltage Vref is input to a non-inverting terminal (+) of the comparator CMP, and the monitoring voltage Vm1 or Vm2 is input to an inverting terminal (−) of the comparator CMP. Conversely, it may be possible to implement a configuration in which the reference voltage Vref is input to the inverting terminal (−) of the comparator CMP, and the monitoring voltage Vm1 or Vm2 is input to the non-inverting terminal (+) of the comparator CMP.

The reference voltage Vref is a DC voltage having a fixed level, whereas the monitoring voltage Vm1 or Vm2 is varied in accordance with the level of the voltage at the reset node Qb1 or Qb2. Accordingly, the comparator CMP adjusts the level of an output thereof, that is, the level of the Ac inverter voltage Vac1_IT or Vac2_IT, to equalize the monitoring voltage Vm1 or Vm2 input thereto with the reference voltage Vref. Thus, the level of the AC inverter voltage Vac1_IT or Vac2_IT is varied in accordance with the level of the monitoring Vm1 or Vm2.

In this case, an operational amplifier exhibiting high gain may be used as the comparator CMP.

Meanwhile, the third base voltage VB3 and fifth base voltage VB5 may have the same level. In this case, one of the third base voltage VB3 and fifth base voltage VB5 may be supplied to the first and second monitoring switching elements Tm1 and Tm2 via a single line.

The fourth base voltage VB4 and sixth base voltage VB6 may have the same level. In this case, one of the fourth base voltage VB4 and sixth base voltage VB6 may be supplied to the third and fourth resistors R3 and R4 via a single line.

Meanwhile, the output path of the output from the voltage adjuster 481b may be changed in accordance with frame periods. For example, when the first AC inverter voltage Vac1_IT should be output in a high level state, and the second AC inverter voltage Vac2_IT should be output in a low level state, in the first frame period, the output Vac1_IT from the voltage adjuster 481b is supplied to the first inverter INV1 without being supplied to the second inverter INV2 in the first frame period. For this function, a selection switching element (not shown) may further be provided. The selection switching element may receive the above-described operation control signal. For example, when the operation control signal is in a high level state in the first frame period, the selection switching element may connect the voltage adjuster 481b and first AC inverter line acL1 in response to the high-level operation control signal. On the other hand, when the operation control signal is in a low level state in the first frame period, the selection switching element may connect the voltage adjuster 481b and second AC inverter line acL2 in response to the low-level operation control signal.

In this case, the selection switching element may be installed within the voltage adjuster 481b.

Meanwhile, it may be possible to change the output path of the voltage adjuster, using a level converter having the function of the selection switching element, in place of the selection switching element. This will be described in detail with reference to FIG. 26.

Figure 26:
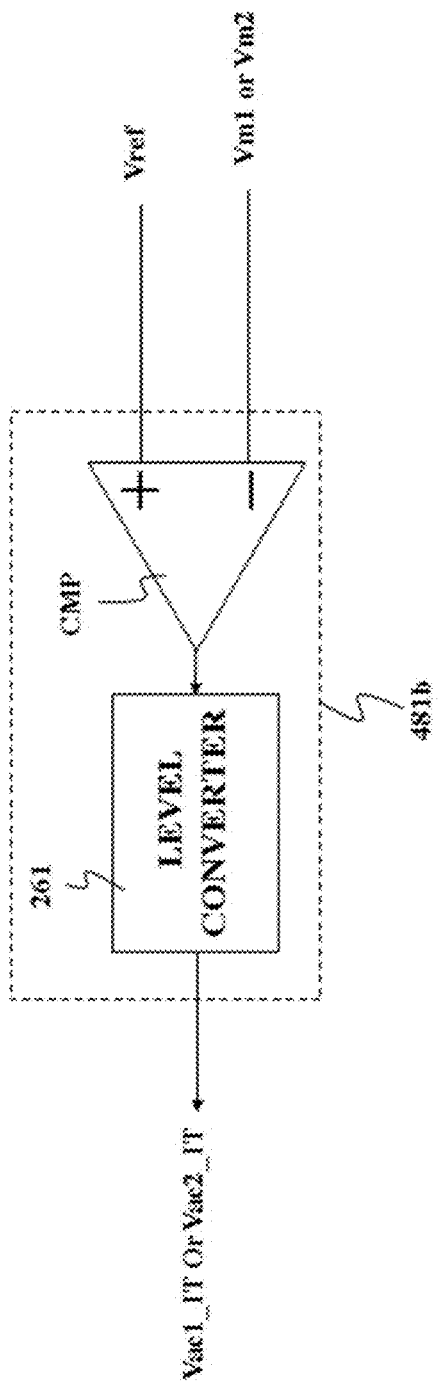
FIG. 26 is a diagram illustrating another configuration of a voltage adjuster of FIG. 25.

FIG. 26 is a diagram illustrating another configuration of the voltage adjuster 481b of FIG. 25.

As illustrated in FIG. 26, the voltage adjuster 481b may further include a level converter 261. The level converter 261 shifts the level of the AC inverter voltage Vac1_IT or Vac2_IT from the comparator CMP, and determines an output path of the level-shifted AC inverter voltage Vac1_IT or Vac2_IT in accordance with the operation control signal. For example, when the operation control signal is in a high level state in the first frame period, the level converter 261 connects the voltage adjuster 481b and first AC inverter line acL1 in response to the high-level operation control signal. On the other hand, when the operation control signal is in a low level state in the first frame period, the level converter 261 couples the voltage adjuster 481b to the second AC inverter line acL2 in response to the low-level operation control signal.

As the level converter 261, a level shifter, a DC-DC converter, an amplifier, or the like, which additionally has the function of the above-described selection switching element, may be used.

Meanwhile, the above-described inverter voltage controller may be coupled to a dummy stage, which is separately prepared. This will be described in detail with reference to FIG. 27. Here, it is noted that the dummy stage is a separate constituent element different from the above-described dummy stage for reset control.

Figure 27:
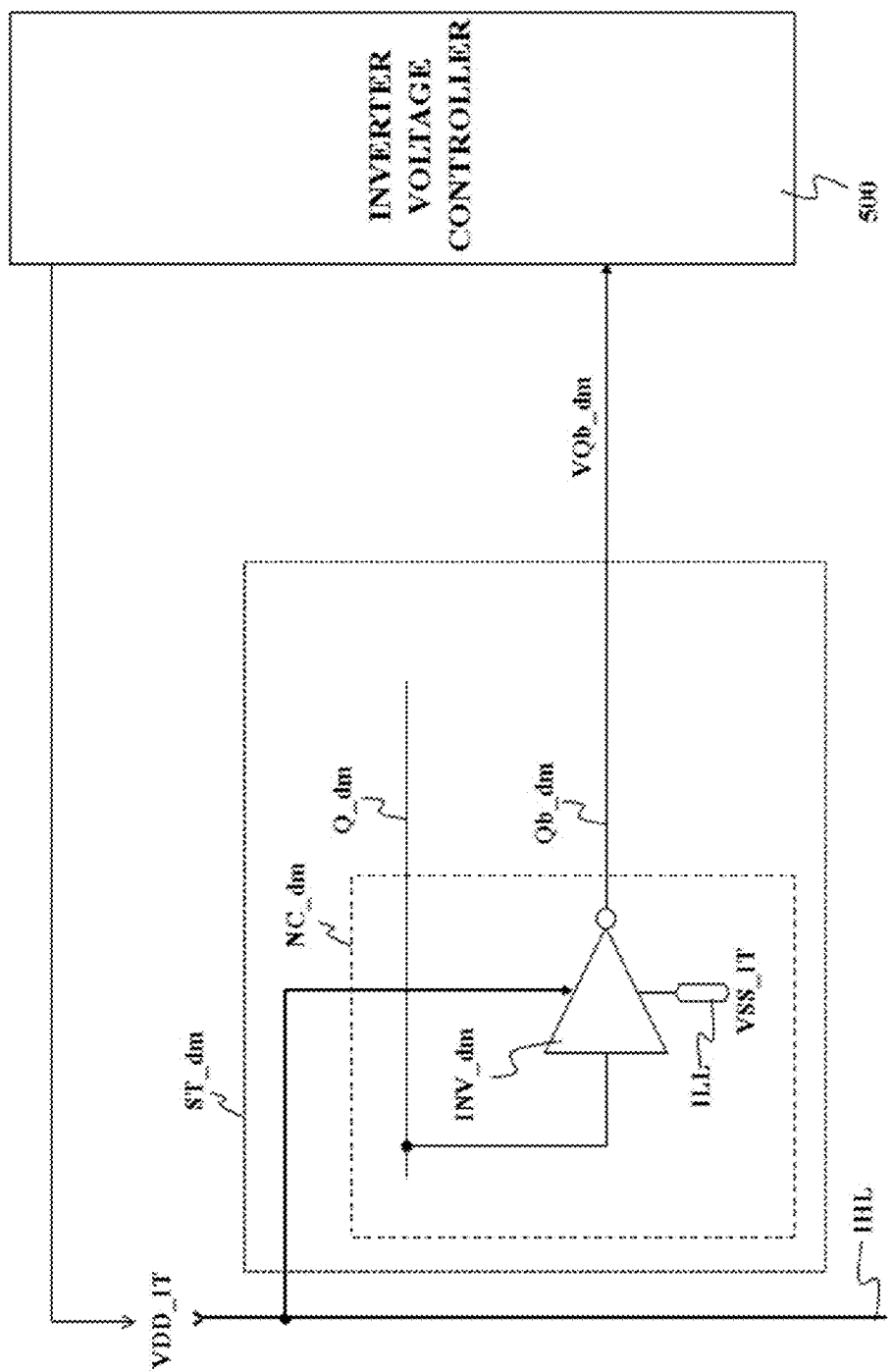
FIG. 27 is a diagram illustrating a connection structure between a dummy stage and an inverter voltage controller according to one embodiment.

FIG. 27 is a diagram illustrating a coupling structure between a dummy stage and an inverter voltage controller 500 according to an embodiment of the present invention.

The dummy stage, which is designated by reference character "ST_dm", includes a dummy node controller NC_dm, as illustrated in FIG. 27.

The dummy node controller NC_dm includes a dummy inverter INV_dm for controlling a voltage VQb_dm at a dummy reset node Qb_dm in accordance with a voltage at a dummy set node Q_dm.

The inverter voltage controller 500 controls the high-level inverter voltage VDD_IT supplied to each inverter of the plural stages and supplied to at least one dummy inverter INV_dm included in at least one dummy stage ST_dm. The inverter voltage controller 500 controls the high-level inverter voltage VDD_IT based on a voltage of at least one reset node Qb_dm included in at least one dummy stage ST_dm.

As described with reference to FIG. 3, the high-level inverter voltage VDD_IT is supplied to the inverters INV respectively included in the stages STn−2 to STn+2 and the dummy inverter INV_dm included in the dummy stage ST_dm via the high-level inverter line IHL.

Hereinafter, a configuration of the inverter voltage controller 500 will be described in detail.

Figure 28:
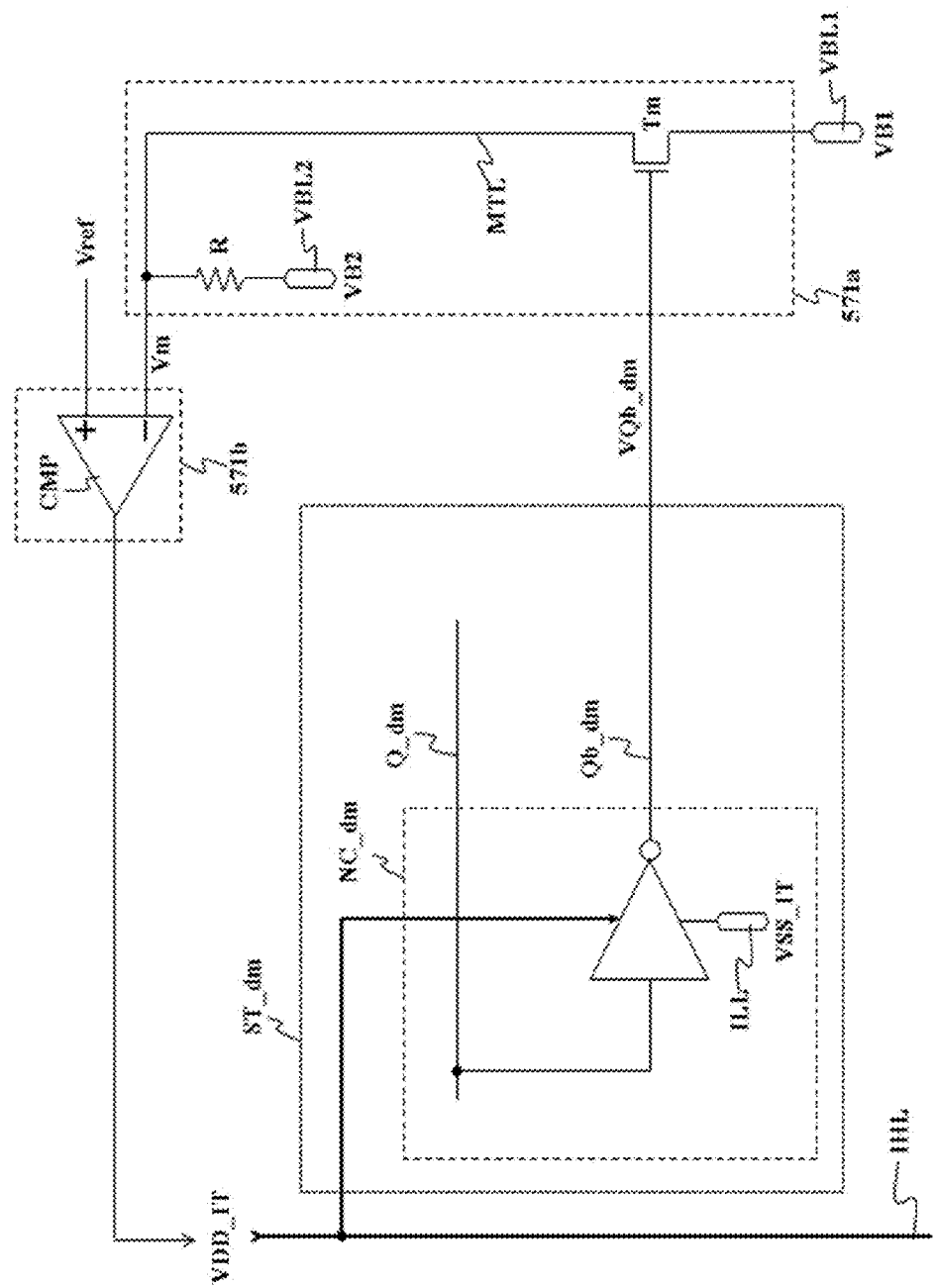
FIG. 28 is a diagram illustrating a detailed configuration of an inverter voltage controller illustrated in FIG. 27.

FIG. 28 is a diagram illustrating a detailed configuration of the inverter voltage controller 500 illustrated in FIG. 27.

As illustrated in FIG. 28, the inverter voltage controller 500 includes a voltage monitor 571a and a voltage adjuster 571b.

The voltage monitor 571a adjusts the level of a monitoring voltage Vm in accordance with the level of a voltage applied to the dummy reset node Qb_dm included in the dummy stage ST_dm, and outputs the adjusted monitoring voltage Vm to the monitoring input line MTL.

To this end, the dummy voltage monitor 571a includes a monitoring switching element Tm and a resistor R, as illustrated in FIG. 28.

The monitoring switching element Tm is controlled in accordance with a voltage at the dummy reset node Qb_dm included in the dummy stage ST_dm. The monitoring switching element Tm is coupled between the monitoring input line MTL, to which the monitoring voltage Vm is input, and the first base voltage line VBL1 to transmit the first base voltage VB1. The monitoring switching element Tm is used as an index for checking of a degradation degree of switching elements coupled to the reset nodes Qb of the remaining stages STn-2 to STn+2 through gate electrodes thereof (for example, pull-down switching elements). That is, the degradation degree of the monitoring switching element Tm means the degradation degree of switching elements coupled to the reset nodes Qb through gate electrodes thereof (for example, pull-down switching elements).

The resistor R is coupled between the monitoring input line MTL and the second base voltage line VBL2 to transmit the second base voltage VB2 to the monitoring input line MTL.

The voltage adjuster 571b adjusts the level of the high-level inverter voltage VDD_IT based on a predetermined reference voltage Vref and the monitoring voltage Vm applied to the monitoring input line MTL. The voltage adjuster 571b supplies the adjusted high-level inverter voltage VDD_IT to the dummy inverter INV_dm.

As illustrated in FIG. 28, the voltage adjuster 571b includes a comparator CMP for comparing the monitoring voltage Vm from the monitoring input line MTL with the reference voltage Vref, adjusting the level of the high-level inverter voltage VDD_IT based on the compared results, and then supplying the adjusted high-level inverter voltage VDD_IT to the dummy inverter INV_dm. In this case, the high-level inverter voltage VDD_IT output from the comparator CMP is supplied to the dummy inverter INV_dm via the high-level inverter line IHL. In this case, the inverters INV of the remaining stages receive the high-level inverter voltage VDD_IT via the high-level inverter line IHL.

In the case of FIG. 28, the reference voltage Vref is input to a non-inverting terminal (+) of the comparator CMP, and the monitoring voltage Vm is input to an inverting terminal (−) of the comparator CMP. Conversely, it may be possible to implement a configuration in which the reference voltage Vref is input to the inverting terminal (−) of the comparator CMP, and the monitoring voltage Vm is input to the non-inverting terminal (+) of the comparator CMP.

The reference voltage Vref is a DC voltage having a fixed level, whereas the monitoring voltage Vm is varied in accordance with the level of the voltage at the dummy reset node Qb_dm. Accordingly, the comparator CMP adjusts the level of an output thereof, that is, the level of the high-level inverter voltage VDD_IT, to equalize the monitoring voltage Vm input thereto with the reference voltage Vref. Thus, the level of the high-level inverter voltage VDD_IT is varied in accordance with the level of the monitoring voltage Vm.

In this case, an operational amplifier exhibiting high gain may be used as the comparator CMP.

The inverter voltage controller 500 of the present invention may apply an optimal voltage to the reset node Qb. Thus, it may be possible to reduce incidence of malfunction of the circuit caused by degradation of switching elements coupled to the reset node Qb through gate electrodes thereof (for example, pull-down switching elements).

Meanwhile, the dummy stage ST_dm of FIG. 28 may have the same circuit configuration as the above-described stages. For example, the dummy stage ST_dm may have the same configuration as the n-th stage STn illustrated in FIG. 11. The output terminal OT of the dummy stage ST_dm having the structure illustrated in FIG. 11 is not coupled to any gate line. Such a structure may be realized through a method of connecting the inverter voltage controller to the above-described reset control dummy stage.

Figure 29:
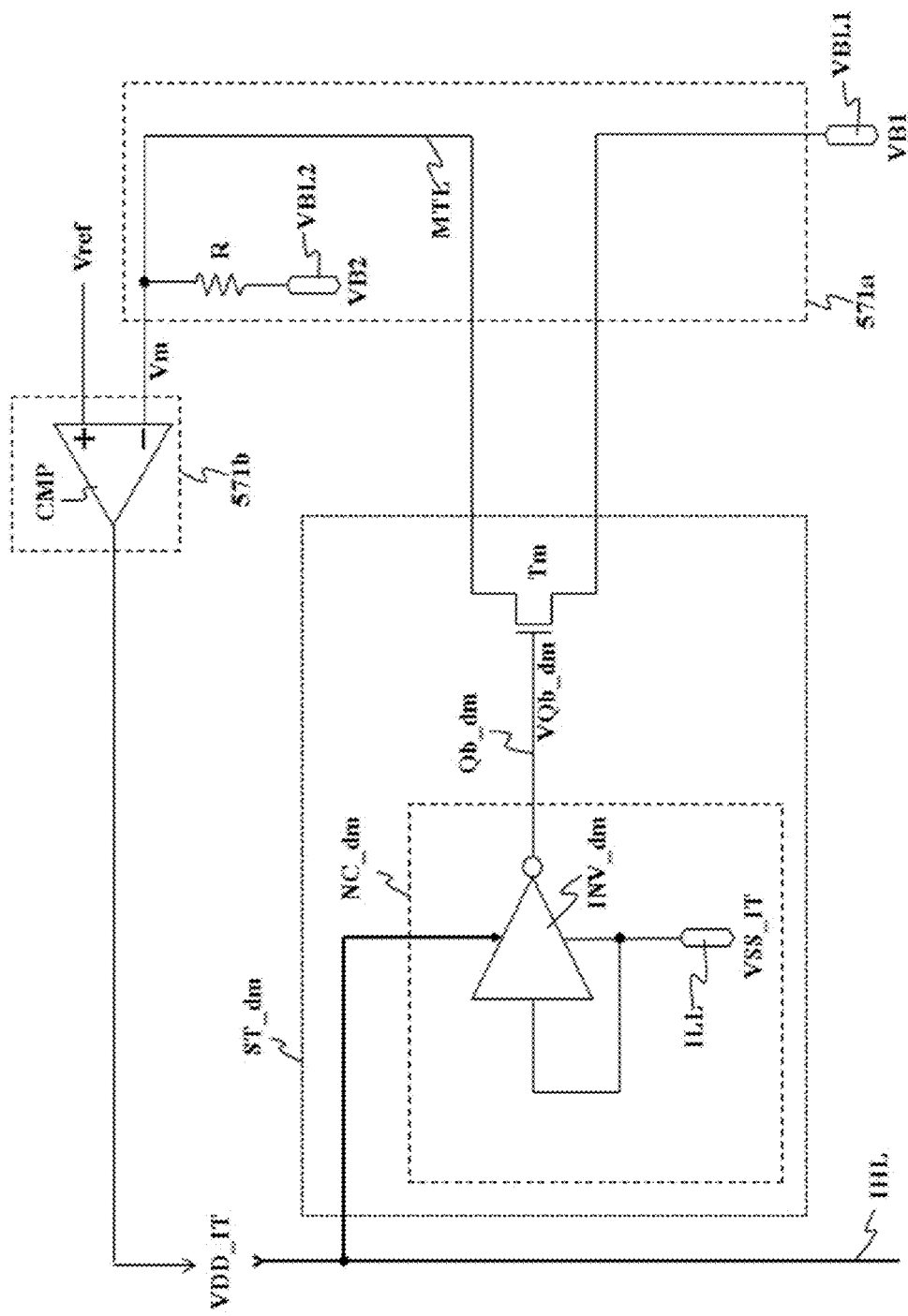
FIG. 29 is a diagram illustrating another configuration of the inverter voltage controller in FIG. 27.

FIG. 29 is a diagram illustrating another configuration of the inverter voltage controller 500 in FIG. 27.

As illustrated in FIG. 29, the monitoring switching element Tm of the inverter voltage controller 500 may be installed within the dummy stage ST_dm.

The dummy stage ST_dm of FIG. 29 does not include the dummy set node Q_dm. In this case, the input terminal of the dummy inverter INV_dm may be coupled to the low-level inverter line ILL.

Figure 30:
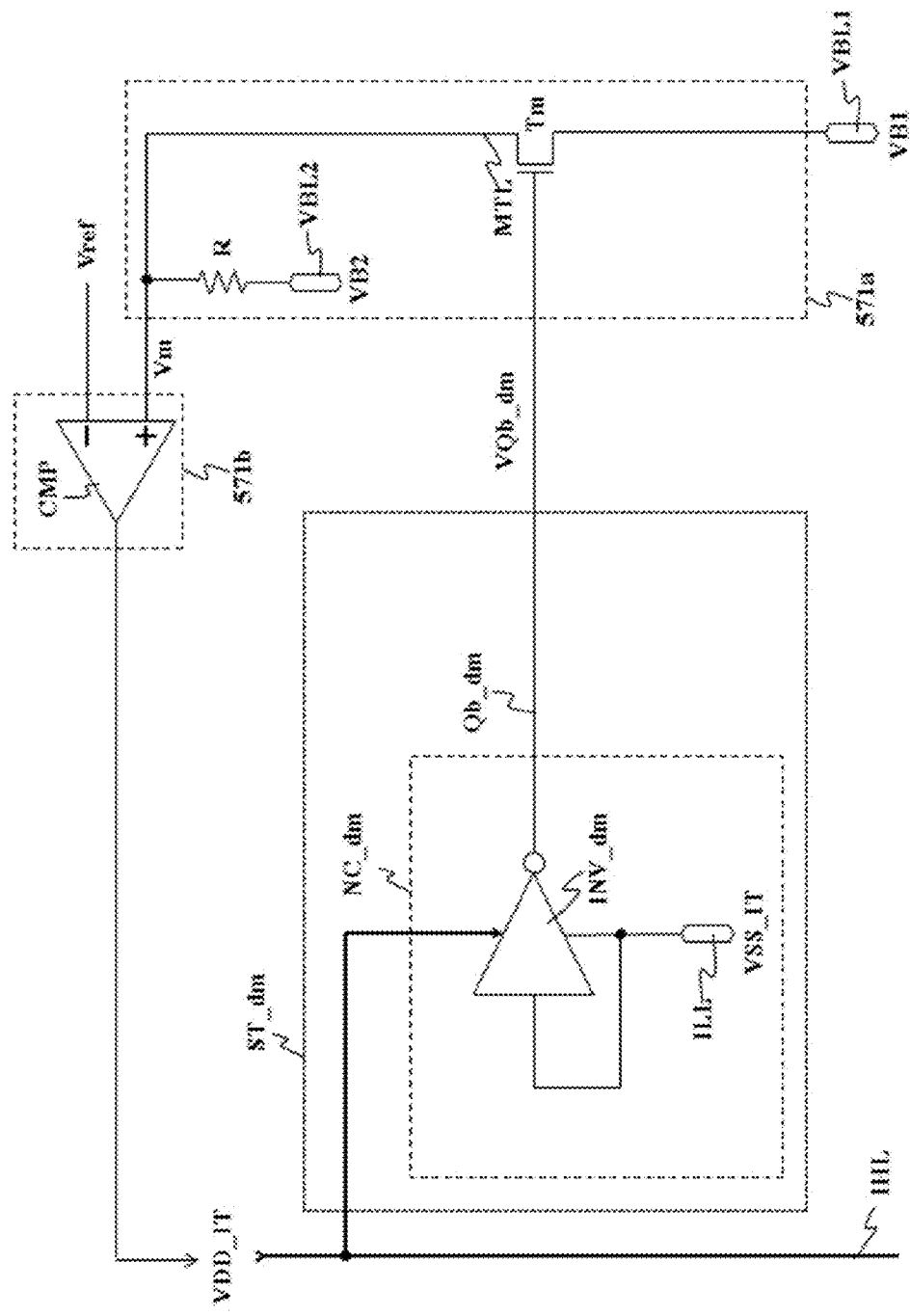
FIG. 30 is a diagram illustrating another configuration of the inverter voltage controller in FIG. 27.

FIG. 30 is a diagram illustrating another configuration of the inverter voltage controller 500 in FIG. 27. As illustrated in FIG. 30, the dummy stage ST_dm does not include the dummy set node Q_dm. The input terminal of the dummy inverter INV_dm is coupled to the low-level inverter line ILL. The monitoring voltage Vm is input to the non-inverting terminal (+) of the comparator CMP, and the reference voltage Vref is input to the inverting terminal (−) of the comparator CMP.

Figure 31:
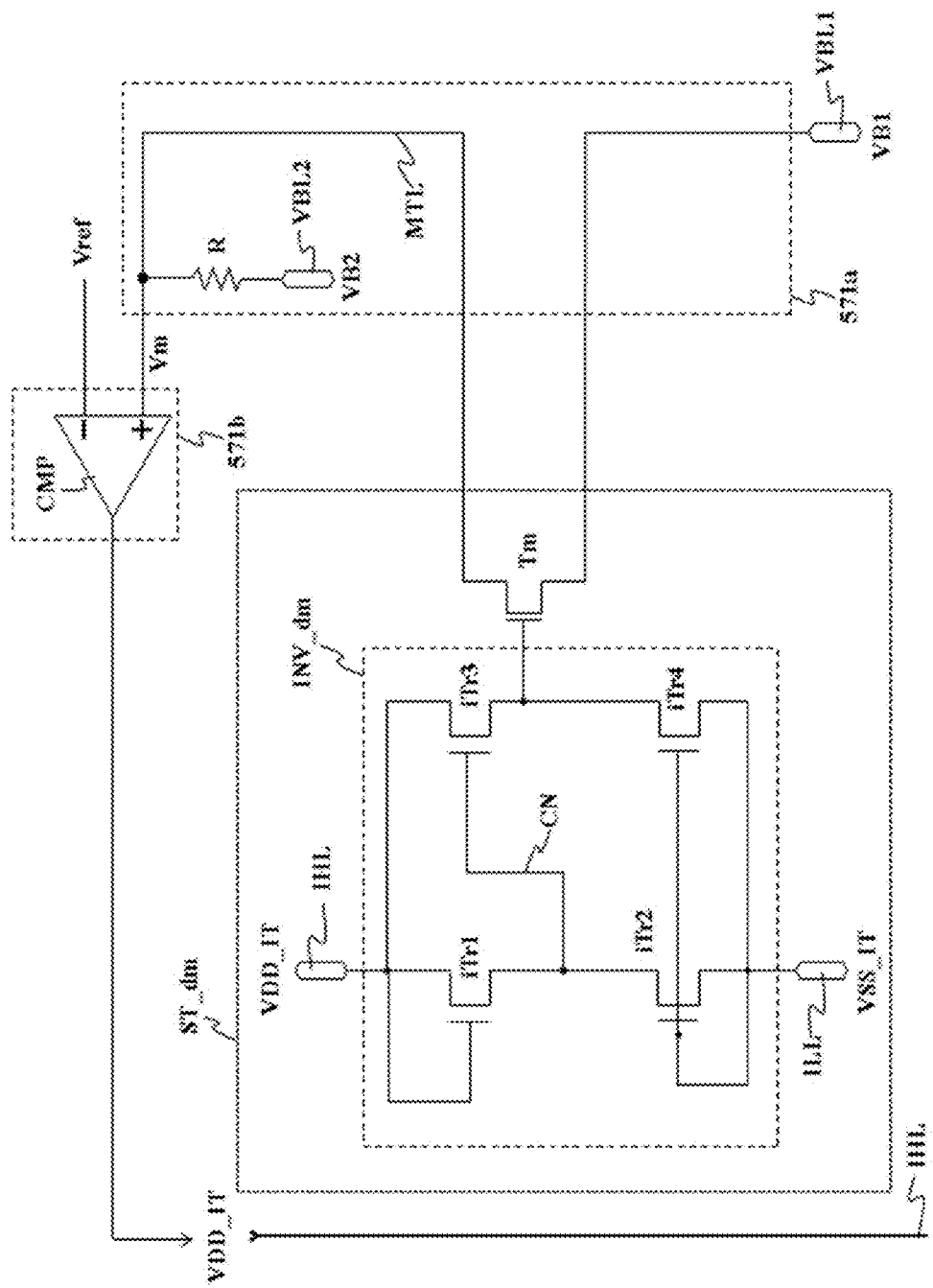
FIG. 31 is a diagram illustrating a circuit configuration applicable to a dummy inverter of FIG. 29.

FIG. 31 is a diagram illustrating a circuit configuration applicable to the dummy inverter INV_dm of FIG. 29.

As illustrated in FIG. 31, the dummy inverter INV_dm may have a circuit configuration as illustrated in FIG. 15. Of course, there is no dummy set node Q_dm in the dummy stage ST_dm of FIG. 31 and, as such, the gate electrodes of the second to fourth inversion switching elements iTr2 to iTr4 in this circuit configuration are coupled to the low-level inverter line ILL, in place of the dummy reset node Q_dm.

Figure 32:
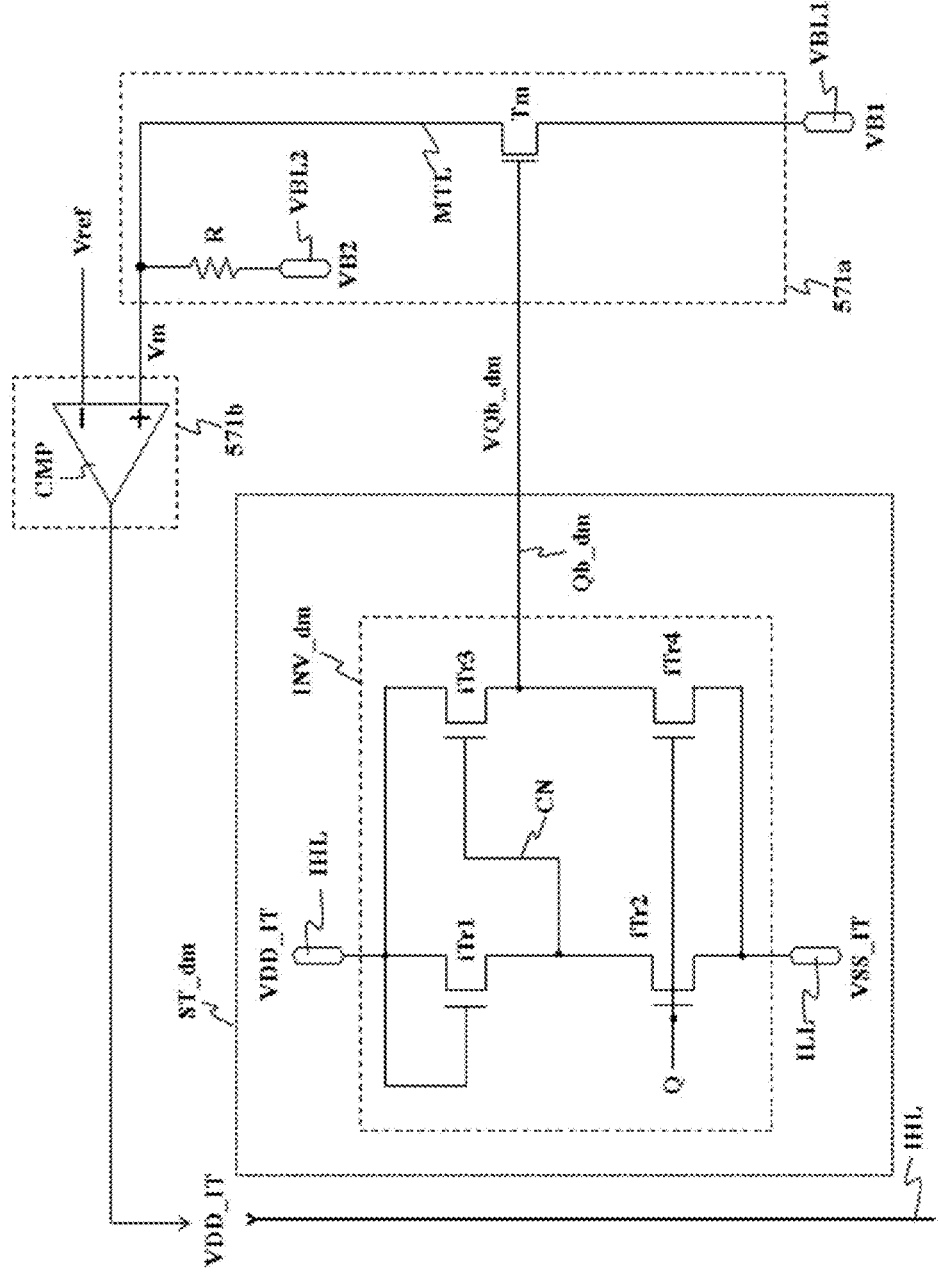
FIG. 32 is a diagram illustrating another circuit configuration applicable to the dummy inverter of FIG. 29.

FIG. 32 is a diagram illustrating another circuit configuration applicable to the dummy inverter INV_dm of FIG. 29.

As illustrated in FIG. 32, the dummy inverter INV_dm may have a circuit configuration as illustrated in FIG. 15. Of course, there is no dummy set node Q_dm in the dummy stage ST_dm of FIG. 32 and, as such, the gate electrodes of the second to fourth inversion switching elements iTr2 to iTr4 in this circuit configuration may be coupled to the set node Q of another stage.

Meanwhile, although not shown, the gate electrodes of the second to fourth inversion switching elements iTr2 to iTr4 in the structure, in which there is no dummy set node Q_dm in the dummy stage ST_dm of FIG. 31 or 32, may receive a scan pulse from another neighboring stage or an external signal. In this case, the external signal may have a similar waveform to the voltage at the set node Q of the neighboring stage.

Figure 33:
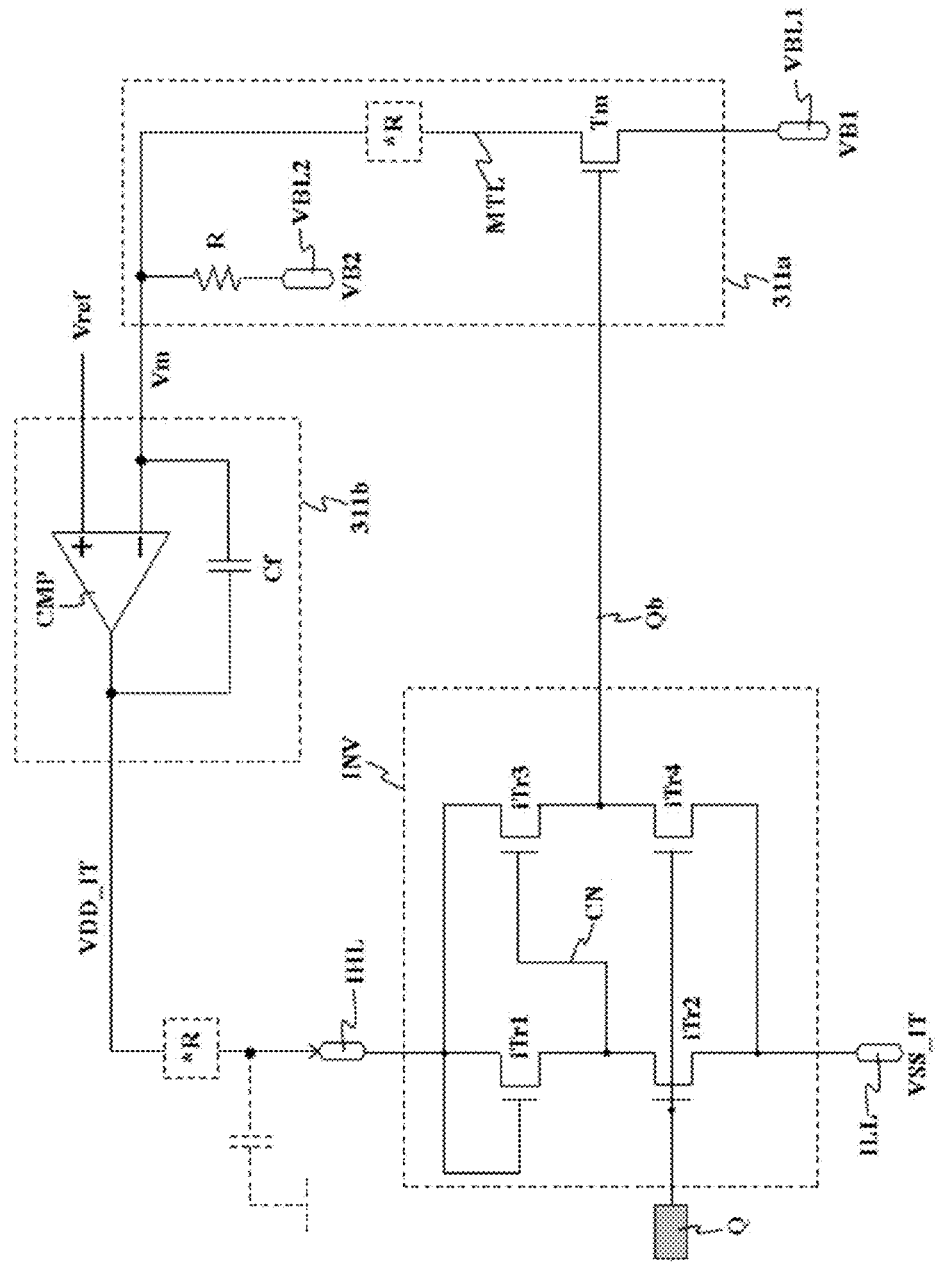
FIG. 33 is a diagram illustrating a simulation circuit of the shift register according to an embodiment of the present invention.

FIG. 33 is a diagram illustrating a simulation circuit of the shift register according to an embodiment of the present invention.

The circuit illustrated in FIG. 33 has a structure in which the voltage monitors 311a and 311b of FIG. 4 are combined with the inverter INV of FIG. 15. In the case of FIG. 33, the voltage adjuster 311b may further include a feedback capacitor Cf. In FIG. 33, "*R" represents a load of the liquid crystal panel.

In initial setting for a simulation test, the reference voltage Vref is first set to −6V, and the resistance of the monitoring switching element Tm is then adjusted to equalize the monitoring voltage Vm with the reference voltage Vref of −6V. In this case, the voltage at the reset node Qb may be adjusted for the resistance adjustment.

In this simulation circuit, when the resistance of the monitoring switching element Tm increases (that is, the threshold voltage of the monitoring switching element is shifted), the monitoring voltage Vm falls, thereby causing the high-level inverter voltage VDD_IT to rise. Rising of the high-level inverter voltage VDD_IT causes rising of the voltage at the reset node QB and, as such, the resistance of the monitoring switching element Tm is decreased.

Figure 34A:
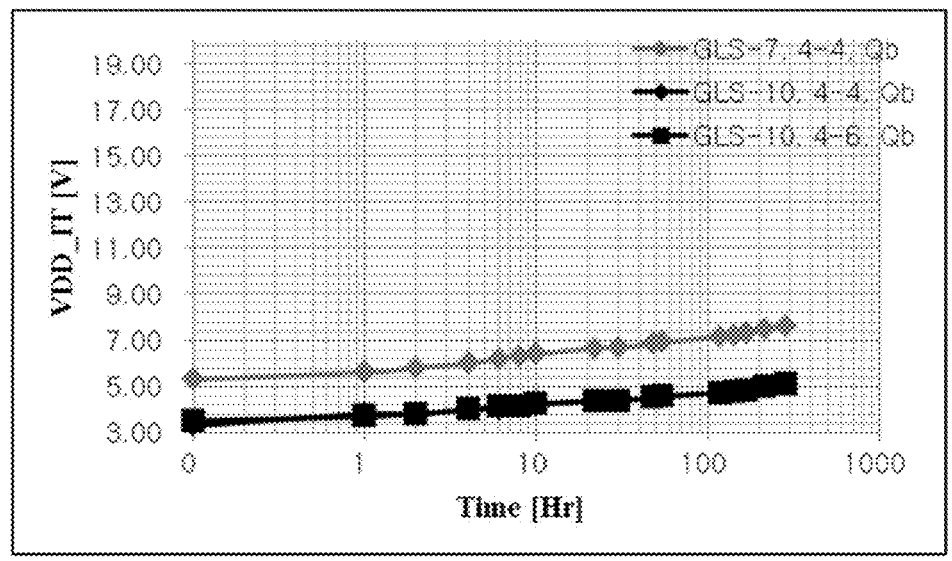
FIGS. 34A to 34C are diagrams for comparison between the present invention and the related art.
Figure 34B:
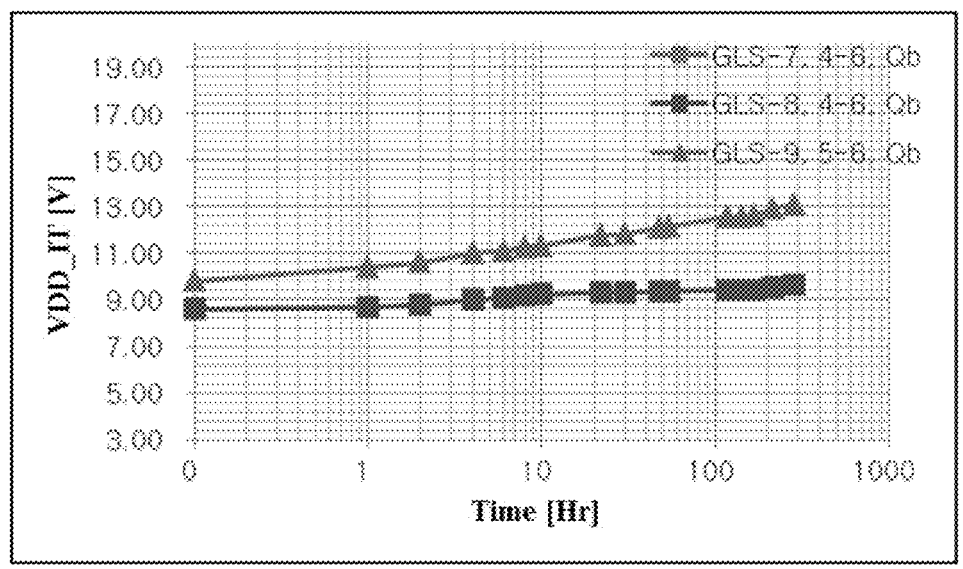
Figure 34C:
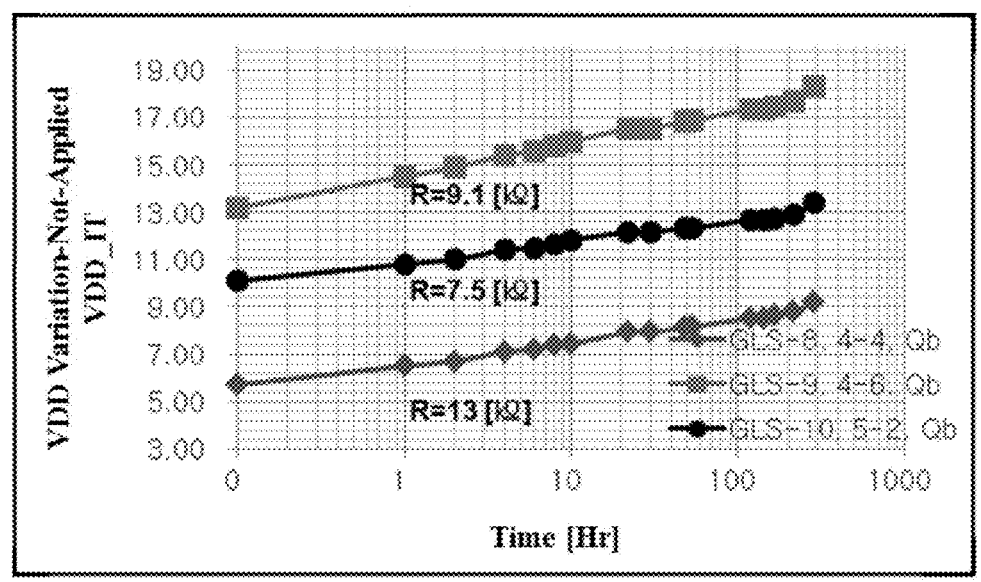

FIGS. 34A to 34C are diagrams for comparison between various embodiments described herein and the related art.

In FIG. 34A to 34C, driving conditions and results of the present invention and the related art are shown in the following table 1.

TABLE 1

| | Degradation Degree After 288 hour | | |
|---|---|---|---|
| | Condition 1 of Present Invention (FIG. 34A) | Condition 2 of Present Invention (FIG. 34B) | The Related Art (FIG. 34C) |
| Stress V | 10 V | 15 V | ~30 V |
| Average Degradation Voltage [V] | 1.91 | 2.17 | 3.97 |

Referring to FIGS. 34A to 34C and the table 1, it can be seen that degradation is suppressed to a level corresponding to 50 to 60% of degradation in the related art.

As apparent from the above description, the shift register according to various embodiments has the following effects.

In various embodiments of the shift register described herein, the voltage at the reset node, to which the gate electrode of the pull-down switching element is coupled, is checked, to check a degree of degradation of the pull-down switching element. The level of the inverter voltage supplied to the inverter is adjusted in accordance with the checked degradation degree.

Accordingly, it is possible to reduce malfunction of the circuit not only caused by degradation of the pull-down switching element, but also caused by degradation of other switching elements coupled to the reset node through gate electrodes thereof.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

What is claimed is:

1. A shift register comprising:
a plurality of stages, each stage comprising a node controller and an output unit, the node controller including an inverter controlling a voltage at a reset node in accordance with a voltage at a set node, and the output unit outputting a scan pulse based on at least one of the voltage at the set node and the voltage at the reset node; and
an inverter voltage controller for controlling a high-level inverter voltage supplied to the inverter of each of the plurality of stages based on the voltage at at least one reset node in at least one of the stages.

2. The shift register according to claim 1, wherein the inverter voltage controller comprises:
a voltage monitor for adjusting a level of a monitoring voltage in accordance with a level of a voltage applied to the reset node, and outputting the adjusted monitoring voltage to a monitoring input line; and
a voltage adjuster including a comparator adjusting a level of the high-level inverter voltage based on the monitoring voltage applied to the monitoring input line and a predetermined reference voltage, and supplying the adjusted high-level inverter voltage to the inverter.

3. The shift register according to claim 2, wherein the voltage monitor comprises:
at least one monitoring switching element controlled in accordance with the voltage at the reset node, and coupled between the monitoring input line and a first base voltage line to transmit a first base voltage to the monitoring input line; and
a resistor coupled between the monitoring input line and a second base voltage line to transmit a second base voltage to the monitoring input line,
wherein the resistor is one of a variable resistor and a switching element.

4. The shift register according to claim 3, wherein:
the at least one monitoring switching element comprises two or more monitoring switching elements;
gate electrodes of the two or more monitoring switching elements are coupled to one of the reset node of the corresponding stage and reset nodes in two or more of the stages; and
the two or more monitoring switching elements are coupled in parallel between the monitoring input line and the first base voltage line.

5. The shift register according to claim 2, wherein the voltage adjuster further comprises one of:
a first capacitor coupled between an output terminal of the comparator and the monitoring input line, and
a level converter being one of a level shifter, a DC-DC converter and an amplifier which shifts the level of the high-level inverter voltage output from the comparator,
wherein the inverter voltage controller further comprises a second capacitor coupled between the monitoring input line and a low voltage transmission line to transmit a low voltage to the monitoring input line.

6. The shift register according to claim 1,
wherein the output unit comprises:
a pull-up switching element controlled in accordance with the voltage at the set node, and coupled between a clock transmission line and an output terminal to transmit a clock pulse to the output terminal; and
a pull-down switching element controlled in accordance with the voltage at the reset node, and coupled between the output terminal and a first discharge voltage line to transmit a first discharge voltage to the output terminal,
wherein the node controller comprises a first switching element and a second switching element, wherein:
the first switching element is controlled in accordance with a start pulse or a scan pulse from a prior stage of the stages, and coupled to a charge voltage line to transmit a charge voltage while being coupled to the set node; and
the second switching element is controlled in accordance with a scan pulse from a next stage of the stages, and coupled between the set node and a first discharge voltage line to transmit a first discharge voltage to the set node.

7. The shift register according to claim 6, wherein the node controller further comprises a third switching element, the third switching element controlled in accordance with the voltage at the reset node of the selected stage and coupled between the set node of the selected stage and the first discharge voltage line to transmit the first discharge voltage to the set node of the selected stage.

8. The shift register according to claim 1, wherein the inverter comprises:
- a first inversion switching element controlled in accordance with the high-level inverter voltage applied to a high-level inverter line after being output from the inverter voltage controller, the first inversion switching element coupled between the high-level inverter line and a common node;
- a second inversion switching element controlled in accordance with the voltage at the set node, the second inversion switching element coupled between the common node and a low-level inverter line to transmit a low-level inverter voltage to the common node;
- a third inversion switching element controlled in accordance with a voltage at the common node, the third inversion switching element coupled between the high-level inverter line and the reset node; and
- a fourth inversion switching element controlled in accordance with the voltage at the set node, the fourth inversion switching element coupled between the reset node and the low-level inverter line.

9. The shift register according to claim 8, wherein:
the inverter further comprises one of:
- a first structure comprising a fifth inversion switching element controlled in accordance with a scan pulse from a prior stage of the stages, the fifth inversion switching element coupled between the reset node and the low-level inverter line to transmit the low-level inverter voltage,
- a second structure comprising a sixth inversion switching element controlled in accordance with the voltage at the reset node, the sixth inversion switching element coupled between the set node and one of the low-level inverter line and an output terminal of the corresponding stage,
- a third structure comprising a seventh inversion switching element controlled in accordance with the voltage at the reset node, the seventh inversion switching element coupled between the set node and a fourth clock transmission line to transmit a fourth clock pulse to the set node,
- a fourth structure comprising an eighth inversion switching element controlled in accordance with a fifth clock pulse from a fifth clock transmission line, the eighth inversion switching element coupled between an output terminal of the prior stage and the set node,
- a fifth structure comprising a ninth inversion switching element controlled in accordance with a scan pulse from the corresponding stage, the ninth inversion switching element coupled between the reset node in the selected stage and the low-level inverter line, and
- a sixth structure comprising a tenth inversion switching element, an eleventh inversion switching element, and a third capacitor, wherein:
  the tenth inversion switching element is controlled in accordance with the voltage at the set node and is coupled between the reset node in the selected stage and the low-level inverter line,
  the eleventh inversion switching element is controlled in accordance with the voltage at the reset node and is coupled between the set node and the output terminal of the prior stage,
  the third capacitor is coupled between the fifth clock transmission line and the reset node,
  the fifth clock pulse is a clock pulse used as the scan pulse of the prior stage; and
  the fourth clock pulse is used as the scan pulse of the corresponding stage.

10. The shift register according to claim 1, wherein:
the reset node is divided into a first reset node and a second reset node;
the inverter is divided into a first inverter and a second inverter;
the high-level inverter voltage is divided into a first AC inverter voltage and a second AC inverter voltage having a phase inverted from a phase of the first AC inverter voltage;
the monitoring voltage is divided into a first monitoring voltage and a second monitoring voltage; and
the inverter voltage controller comprises
- a first voltage monitor for adjusting a level of the first monitoring voltage in accordance with a level of a voltage applied to the first reset node and outputting the adjusted first monitoring voltage to a first monitoring input line,
- a first voltage adjuster for adjusting a level of the first AC inverter voltage based on the first monitoring voltage applied to the first monitoring input line and a predetermined first reference voltage, and supplying the adjusted first AC inverter voltage to the first inverter,
- a second voltage monitor for adjusting a level of the second monitoring voltage in accordance with a level of a voltage applied to the second reset node and outputting the adjusted second monitoring voltage to a second monitoring input line, and
- a second voltage adjuster for adjusting a level of the second AC inverter voltage based on the second monitoring voltage applied to the second monitoring input line and a predetermined second reference voltage, and supplying the adjusted second AC inverter voltage to the second inverter.

11. The shift register according to claim 10, wherein:
the first voltage monitor comprises
- a first monitoring switching element controlled in accordance with the voltage at the first reset node in the selected stage, the first monitoring switching element coupled between the first monitoring input line and a first base voltage line to transmit a first base voltage to the first monitoring input line, and
- a first resistor coupled between the first monitoring input line and a second base voltage line to transmit a second base voltage to the first monitoring input line; and
the second voltage monitor comprises
- a second monitoring switching element controlled in accordance with the voltage at the second reset node in the selected stage, the second monitoring switching element coupled between the second monitoring input line and a third base voltage line to transmit a third base voltage to the second monitoring input line, and
- a second resistor coupled between the second monitoring input line and a fourth base voltage line to transmit a fourth base voltage to the second monitoring input line.

12. The shift register according to claim 1, wherein:
the reset node is divided into a first reset node and a second reset node;
the inverter is divided into a first inverter and a second inverter;
the high-level inverter voltage is divided into a first AC inverter voltage and a second AC inverter voltage having a phase inverted from a phase of the first AC inverter voltage;
the monitoring voltage is divided into a first monitoring voltage and a second monitoring voltage; and
the inverter voltage controller comprises
a first voltage monitor for adjusting a level of the first monitoring voltage in accordance with a level of a voltage applied to the first reset node and outputting the adjusted first monitoring voltage to a monitoring input line,
a second voltage monitor for adjusting a level of the second monitoring voltage in accordance with a level of a voltage applied to the second reset node and outputting the adjusted second monitoring voltage to the monitoring input line, and
a voltage adjuster for adjusting a level of the first AC inverter voltage based on a predetermined first reference voltage and the first monitoring voltage applied to the monitoring input line, supplying the adjusted first AC inverter voltage to the first inverter, adjusting a level of the second AC inverter voltage based on a predetermined second reference voltage and the second monitoring voltage applied to the monitoring input line, and supplying the adjusted second AC inverter voltage to the second inverter.

13. The shift register according to claim 12, wherein:
the first voltage monitor comprises
a first monitoring switching element controlled in accordance with the voltage at the first reset node in the selected stage, the first monitoring switching element coupled between the monitoring input line and a first base voltage line to transmit a first base voltage to the monitoring input line, and
a first resistor coupled between the monitoring input line and a second base voltage line to transmit a second base voltage to the monitoring input line; and
the second voltage monitor comprises
a second monitoring switching element controlled in accordance with the voltage at the second reset node in the selected stage, the second monitoring switching element coupled between the monitoring input line and a third base voltage line to transmit a third base voltage to the monitoring input line.

14. The shift register according to claim 4, further comprising:
at least one dummy stage comprising a dummy node controller having a dummy inverter to control a voltage at a dummy reset node in accordance with a voltage at a dummy set node,
wherein:
the inverter voltage controller controls a high-level inverter voltage supplied to each inverter of the stages and supplied to the dummy inverter in the at least one dummy stage, the inverter voltage controller controlling the high-level inverter voltage based on the voltage at at least one dummy reset node in the at least one dummy stage, and
the voltage monitor adjusts the monitoring voltage in accordance with a voltage of the dummy reset node in the at least one dummy stage.

15. The shift register according to claim 14, wherein the voltage adjuster further comprises one of:
a first capacitor coupled between an output terminal of the comparator and the monitoring input line, and
a level converter being one of a level shifter, a DC-DC converter, and an amplifier that shifts the level of the high-level inverter voltage output from the comparator,
wherein the inverter voltage controller further comprises a second capacitor coupled between the monitoring input line and a low voltage transmission line to transmit a low voltage to the monitoring input line.

16. The shift register according to claim 14, wherein:
the reset node is divided into a first reset node and a second reset node;
the dummy reset node is divided into a first dummy reset node and a second dummy reset node;
the inverter is divided into a first inverter and a second inverter;
the dummy inverter is divided into a first dummy inverter and a second dummy inverter;
the high-level inverter voltage is divided into a first AC inverter voltage and a second AC inverter voltage having a phase inverted from a phase of the first AC inverter voltage;
the monitoring voltage is divided into a first monitoring voltage and a second monitoring voltage; and
the inverter voltage controller comprises
a first voltage monitor for adjusting a level of the first monitoring voltage in accordance with a level of a voltage applied to the first dummy reset node and outputting the adjusted first monitoring voltage to a first monitoring input line,
a first voltage adjuster for adjusting a level of the first AC inverter voltage based on and a predetermined first reference voltage and the first monitoring voltage applied to the first monitoring input line, and supplying the adjusted first AC inverter voltage to the first inverter and the first dummy inverter,
a second voltage monitor for adjusting a level of the second monitoring voltage in accordance with a level of a voltage applied to the second dummy reset node and outputting the adjusted second monitoring voltage to a second monitoring input line, and
a second voltage adjuster for adjusting a level of the second AC inverter voltage based on a predetermined second reference voltage and the second monitoring voltage applied to the second monitoring input line, and supplying the adjusted second AC inverter voltage to the second inverter and the second dummy inverter.

17. The shift register according to claim 16, wherein:
the first voltage monitor comprises
a first monitoring switching element controlled in accordance with the voltage at the first dummy reset node, the first monitoring switching element coupled between the first monitoring input line and a first base voltage line to transmit a first base voltage to the first monitoring input line, and
a first resistor coupled between the first monitoring input line and a second base voltage line to transmit a second base voltage to the first monitoring input line; and
the second voltage monitor comprises
a second monitoring switching element controlled in accordance with the voltage at the second dummy reset node, the second monitoring switching element coupled between the second monitoring input line and a third base voltage line to transmit a third base voltage to the second monitoring input line, and a second resistor coupled between the second monitoring input line and a fourth base voltage line to transmit a fourth base voltage to the second monitoring input line.

18. The shift register according to claim 14, wherein:

the reset node is divided into a first reset node and a second reset node;

the dummy reset node is divided into a first dummy reset node and a second dummy reset node;

the inverter is divided into a first inverter and a second inverter;

the dummy inverter is divided into a first dummy inverter and a second dummy inverter;

the high-level inverter voltage is divided into a first AC inverter voltage and a second AC inverter voltage having a phase inverted from a phase of the first AC inverter voltage;

the monitoring voltage is divided into a first monitoring voltage and a second monitoring voltage; and the inverter voltage controller comprises a first voltage monitor for adjusting a level of the first monitoring voltage in accordance with a level of a voltage applied to the first dummy reset node, and outputting the adjusted first monitoring voltage to a monitoring input line, a second voltage monitor for adjusting a level of the second monitoring voltage in accordance with a level of a voltage applied to the second dummy reset node, and outputting the adjusted second monitoring voltage to the monitoring input line, and a voltage adjuster for adjusting a level of the first AC inverter voltage based on a predetermined first reference voltage and the first monitoring voltage applied to the monitoring input line, supplying the adjusted first AC inverter voltage to the first inverter, adjusting a level of the second AC inverter voltage based on a predetermined second reference voltage and the second monitoring voltage applied to the monitoring input line, and supplying the adjusted second AC inverter voltage to the second inverter.

19. The shift register according to claim 18, wherein:

the first voltage monitor comprises a first monitoring switching element controlled in accordance with the voltage at the first dummy reset node, and coupled between the monitoring input line and a first base voltage line to transmit a first base voltage, and a first resistor coupled between the monitoring input line and a second base voltage line to transmit a second base voltage to the monitoring input line; and the second voltage monitor comprises a second monitoring switching element controlled in accordance with the voltage at the second dummy reset node, and coupled between the monitoring input line and a third base voltage line to transmit a third base voltage to the monitoring input line, and a second resistor coupled between the monitoring input line and a fourth base voltage line to transmit a fourth base voltage to the monitoring input line.

\* \* \* \* \*